(12) United States Patent
Harada et al.

(10) Patent No.: US 11,616,009 B2
(45) Date of Patent: Mar. 28, 2023

(54) METHOD OF MANUFACTURING SEMICONDUCTOR DEVICE WITH INTERNAL AND EXTERNAL ELECTRODE

(71) Applicant: Rohm Co., Ltd., Kyoto (JP)

(72) Inventors: Yusuke Harada, Kyoto (JP); Mamoru Yamagami, Kyoto (JP)

(73) Assignee: ROHM CO., LTD., Kyoto ( * ) Notice: Subject to any disclaimer, the term of this patent is extended or adjusted under 35 U.S.C. 154(b) by 56 days.

(21) Appl. No.: 17/225,840

(22) Filed: Apr. 8, 2021

(65) Prior Publication Data
US 2021/0225755 A1    Jul. 22, 2021

Related U.S. Application Data

(62) Division of application No. 16/354,540, filed on Mar. 15, 2019, now Pat. No. 11,004,782.

(30) Foreign Application Priority Data

Mar. 16, 2018   (JP) .............................. JP2018-049015

(51) Int. Cl.
*H01L 21/56* (2006.01)
*H01L 21/48* (2006.01)
(Continued)

(52) U.S. Cl.
CPC .... *H01L 23/49861* (2013.01); *H01L 21/4857* (2013.01); *H01L 21/568* (2013.01); *H01L 23/3107* (2013.01)

(58) Field of Classification Search
CPC ........... H01L 23/49861; H01L 21/4857; H01L 21/568; H01L 23/3107; H01L 24/97; H01L 21/561; H01L 23/3121; H01L 23/49816; H01L 23/49838; H01L 24/05; H01L 24/11; H01L 24/13; H01L 24/16; H01L 24/81;
(Continued)

(56) References Cited

U.S. PATENT DOCUMENTS 5,021,296 A    6/1991  Suzuki et al.
2002/0089832 A1  7/2002  Huang
(Continued)

FOREIGN PATENT DOCUMENTS

JP    2016-18846 A    2/2016

*Primary Examiner* — Duy T Nguyen
(74) *Attorney, Agent, or Firm* — Hamre, Schumann, Mueller & Larson, P.C.

(57) ABSTRACT

A semiconductor device includes a semiconductor element, an internal electrode connected to the semiconductor element, a sealing resin covering the semiconductor element and a portion of the internal electrode, and an external electrode exposed from the sealing resin and connected to the internal electrode. The internal electrode includes a wiring layer and a columnar portion, where the wiring layer has a wiring layer front surface facing the back surface of the semiconductor element and a wiring layer back surface facing opposite from the wiring layer front surface in the thickness direction. The columnar portion protrudes in the thickness direction from the wiring layer front surface. The columnar portion has an exposed side surface facing in a direction perpendicular to the thickness direction. The external electrode includes a first cover portion covering the exposed side surface.

3 Claims, 45 Drawing Sheets

(51) Int. Cl.
*H01L 23/498* (2006.01)
*H01L 23/31* (2006.01)

(58) Field of Classification Search
CPC . H01L 2221/68327; H01L 2221/68331; H01L 2221/68345; H01L 2224/0401; H01L 2224/05083; H01L 2224/05124; H01L 2224/05155; H01L 2224/05164; H01L 2224/05553; H01L 2224/05644; H01L 2224/10175; H01L 2224/11462; H01L 2224/1147; H01L 2224/131; H01L 2224/13111; H01L 2224/13155; H01L 2224/16227; H01L 2224/81005; H01L 2224/81024; H01L 2224/81192; H01L 2224/81447; H01L 2224/81815; H01L 2224/81907; H01L 2224/97; H01L 21/4846; H01L 21/6835; H01L 23/49805

USPC .......................................................... 438/125
See application file for complete search history.

(56) References Cited

U.S. PATENT DOCUMENTS

| | | |
|---|---|---|
| 2007/0176267 A1 | 8/2007 | Abbott |
| 2010/0001291 A1 | 1/2010 | Otremba et al. |
| 2011/0115060 A1* | 5/2011 | Chiu ........................ H01L 24/96 |
| | | 257/E23.114 |
| 2013/0069241 A1* | 3/2013 | Lin ........................ H01L 24/97 |
| | | 257/774 |
| 2015/0200181 A1* | 7/2015 | Haga ................ H01L 23/49503 |
| | | 438/127 |
| 2017/0338170 A1 | 11/2017 | Ziglioli |
| 2017/0373031 A1 | 12/2017 | Yajima et al. |

* cited by examiner

FIG.9
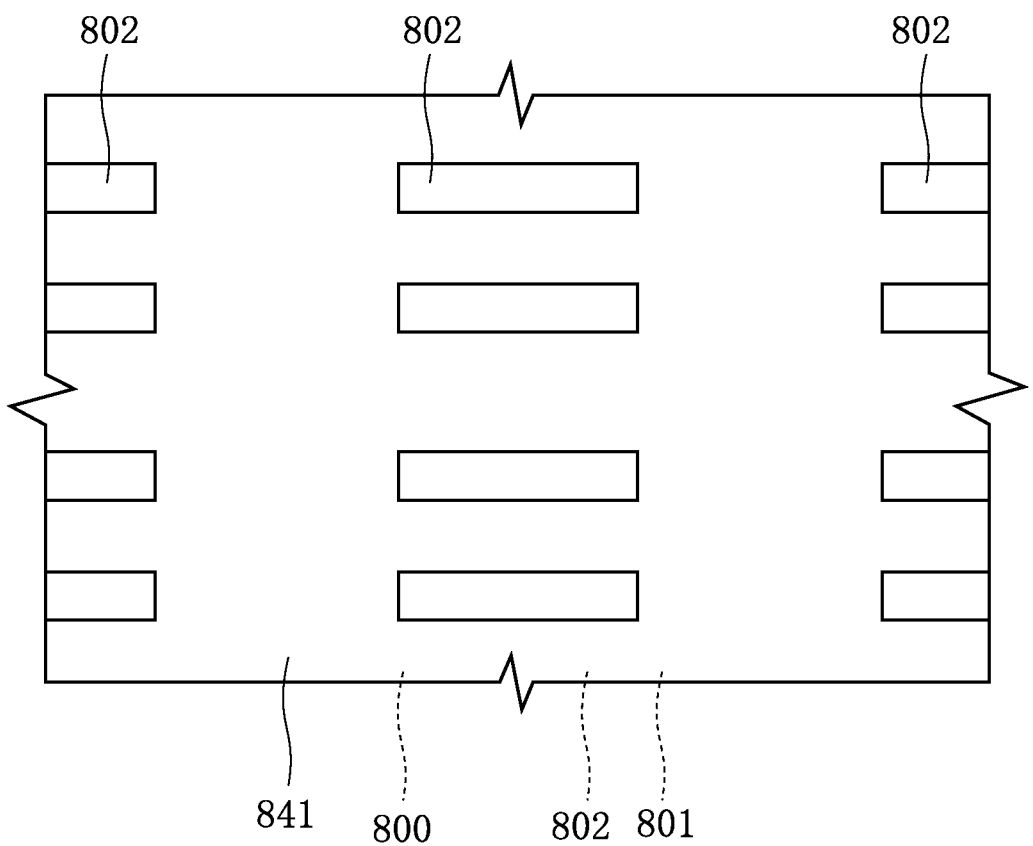
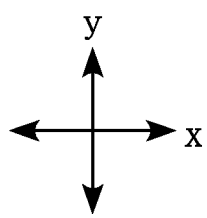

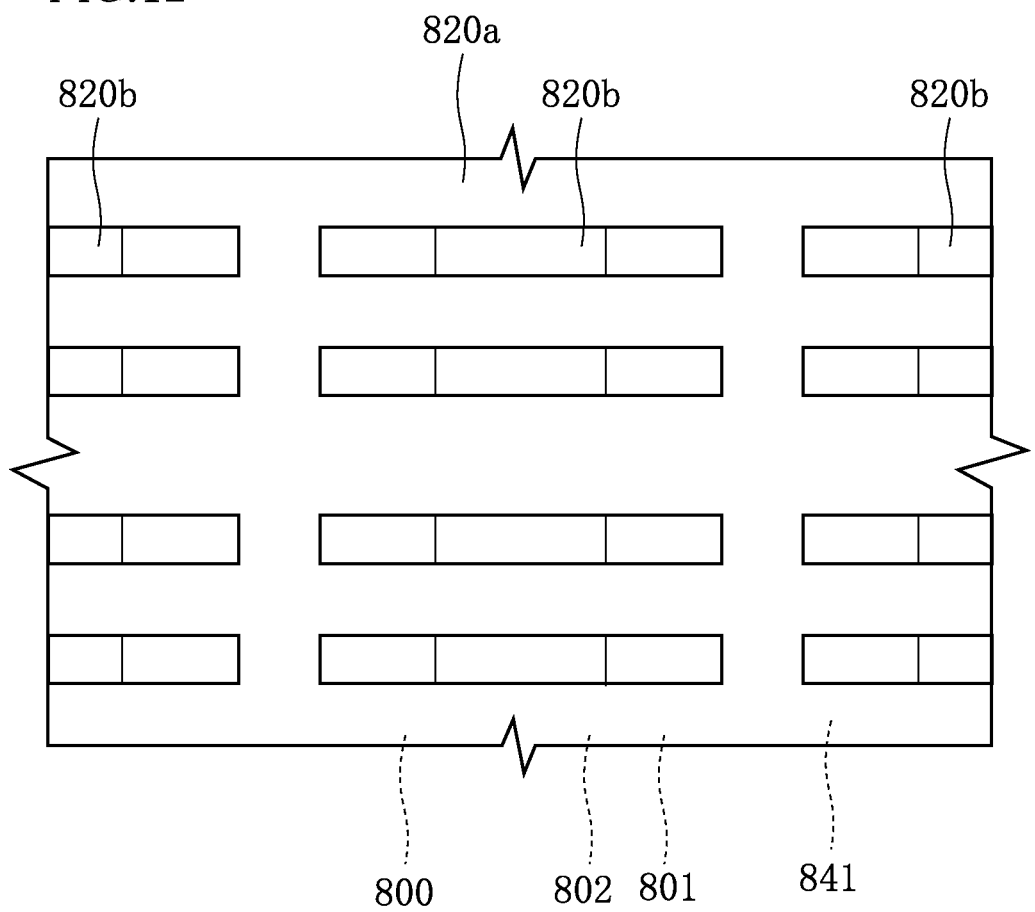
FIG.12
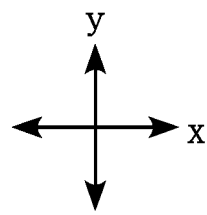

METHOD OF MANUFACTURING SEMICONDUCTOR DEVICE WITH INTERNAL AND EXTERNAL ELECTRODE

This application is a divisional of U.S. patent application Ser. No. 16/354,540, filed Mar. 15, 2019, now U.S. Pat. No. 11,004,782, and claims priority of Japanese application 2018-049015 filed Mar. 16, 2018.

FIELD

The present disclosure relates to a semiconductor device including a semiconductor element, and also to a method for manufacturing the semiconductor device.

BACKGROUND

In recent years, there have been leadless package semiconductor devices such as a small outline non-leaded package (SON package) and a quad flat non-leaded package (QFN package). Leadless package semiconductor devices have terminals for external connection, which do not protrude from the sealing resin that seals semiconductor elements. For this reason, the semiconductor devices of this type are advantageous in reducing the size and thickness of the semiconductor devices. Such a leadless package semiconductor device is disclosed in JP-A-2016-18846, for example.

The semiconductor device disclosed in JP-A-2016-18846 includes a semiconductor element, a lead frame, a plurality of wires, and a sealing resin. The lead frame is made of copper, for example. The lead frame includes a die pad and a plurality of leads. The die pad supports the semiconductor element. The plurality of leads are electrically connected to the semiconductor element via the plurality of wires. The plurality of leads are terminals for external connection when the semiconductor device is mounted on the circuit board of an electronic device or the like. The sealing resin covers the semiconductor element.

SUMMARY

In conventional semiconductor devices, a lead frame is formed by processing a metal plate (e.g., copper plate). A semiconductor device having such a lead frame has room for improvement in thickness reduction.

The present disclosure is conceived in view of the above problem, and an object thereof is to provide a thinner semiconductor device and a method for manufacturing the semiconductor device.

According to an aspect of the present disclosure, there is provided a semiconductor device including: a semiconductor element having an element front surface and an element back surface that face opposite from each other in a thickness direction; an internal electrode electrically connected to the semiconductor element; a sealing resin covering the semiconductor element and a portion of the internal electrode; and an external electrode exposed from the sealing resin and electrically connected to the internal electrode. The internal electrode includes a wiring layer and a columnar portion, where the wiring layer has a wiring layer front surface facing the element back surface and a wiring layer back surface facing opposite from the wiring layer front surface in the thickness direction. The columnar portion protrudes in the thickness direction from the wiring layer front surface. The columnar portion has an exposed side surface that faces in a first direction orthogonal to the thickness direction and that is exposed from the sealing resin. The external electrode includes a first cover portion covering the exposed side surface.

According to another aspect of the present disclosure, there is provided a method for manufacturing a semiconductor device. The method includes: preparing a support substrate; forming an internal electrode including a wiring layer and a columnar portion, where the wiring layer has a wiring layer front surface and a wiring layer back surface that face opposite from each other in a thickness direction, and the wiring layer back surface faces the support substrate, and the columnar portion protrudes from the wiring layer front surface; conductively bonding a semiconductor element to the wiring layer; forming a sealing resin to cover the semiconductor element and the wiring layer front surface; removing the support substrate; forming an exposed side surface of the columnar portion, where the exposed side surface faces in a first direction orthogonal to the thickness direction and is exposed from the sealing resin; and forming an external electrode to cover the exposed side surface.

DRAWINGS

FIG. 9 is a plan view showing a step of the method for manufacturing the semiconductor device in FIG. 1;

FIG. 12 is a plan view showing a step of the method for manufacturing the semiconductor device in FIG. 1;

DETAILED DESCRIPTION

Figure 1:
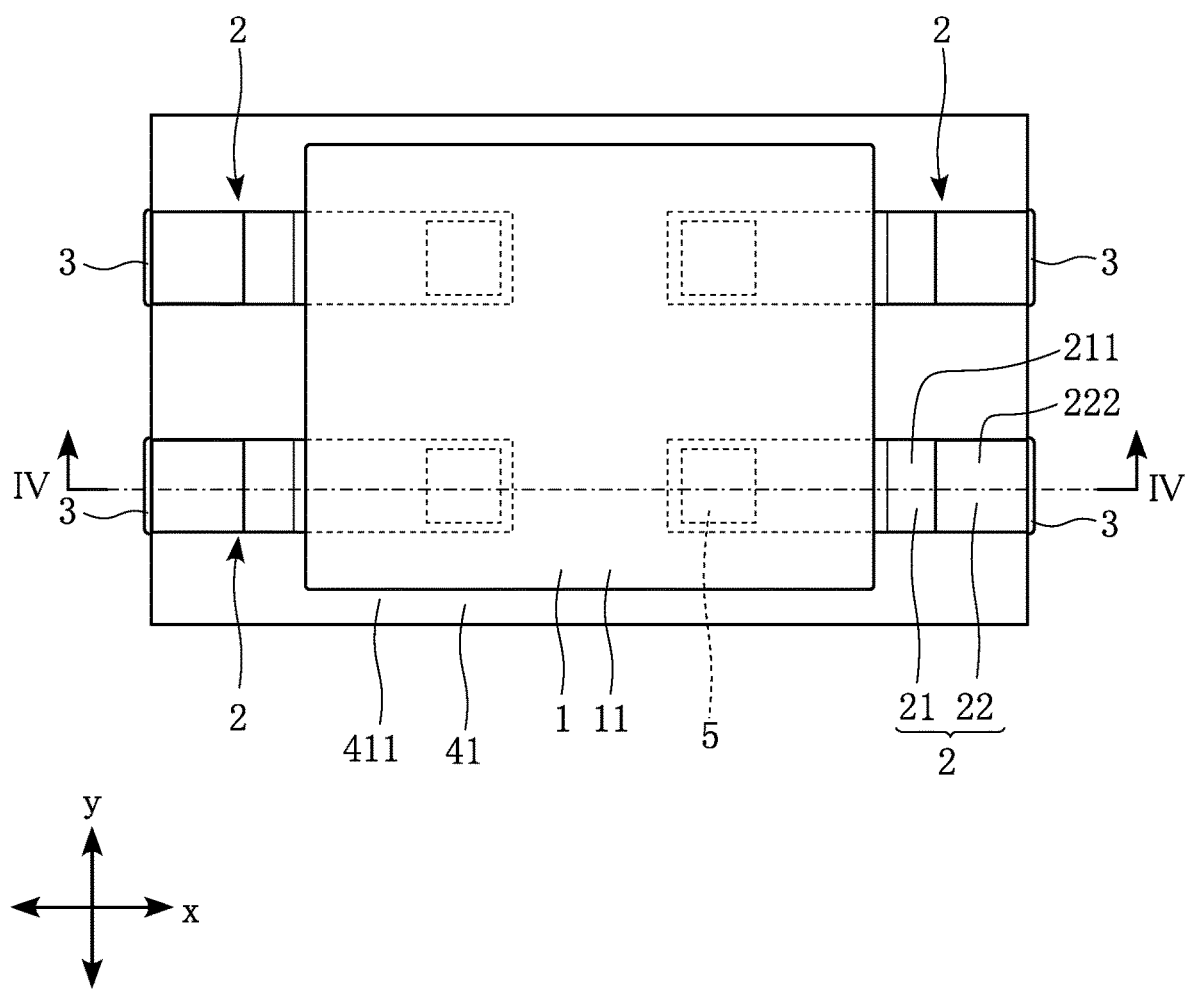
FIG. 1 is a plan view showing a semiconductor device according to a first embodiment.

Preferred embodiments of a semiconductor device according to the present disclosure and a method for manufacturing the semiconductor device are described below with reference to the drawings.

First Embodiment

FIGS. 1 to 6 show a semiconductor device according to a first embodiment of the present disclosure. A semiconductor device A1 according to the present embodiment includes a semiconductor element 1, an internal electrode 2, external electrodes 3, an insulating film 41, conductive bonding members 5, and a sealing resin 6.

Figure 2:
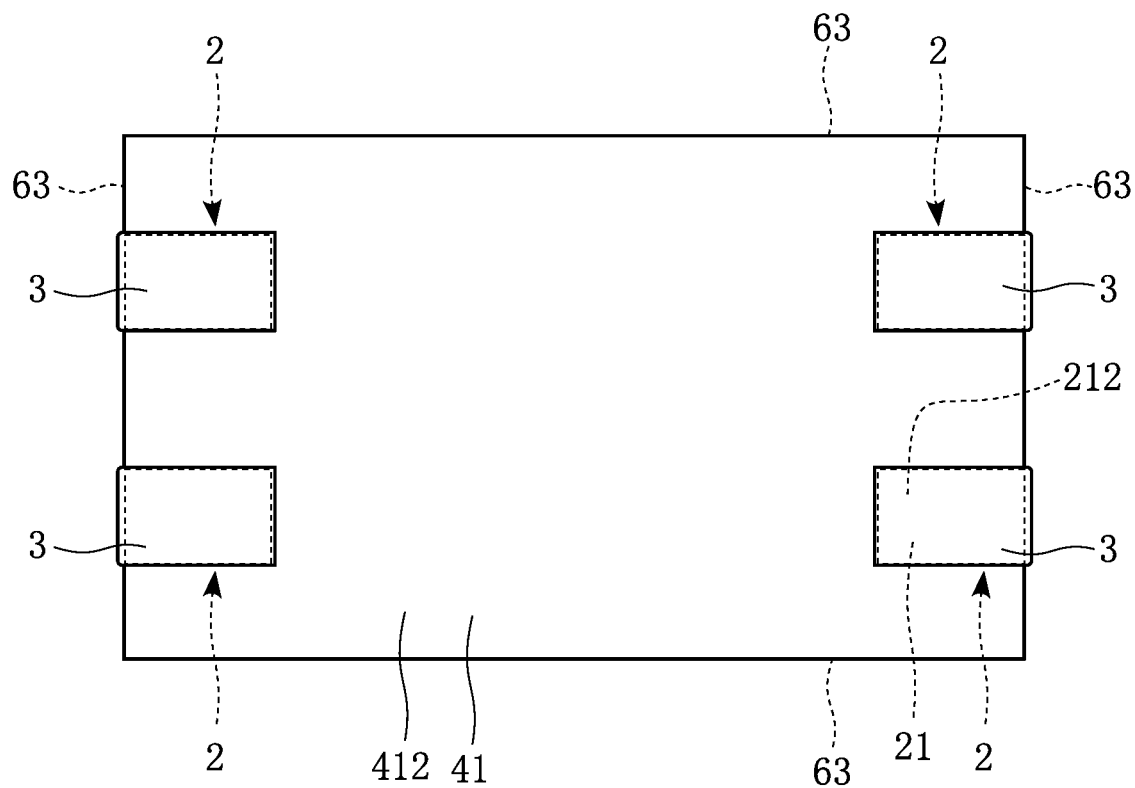
FIG. 2 is a bottom view showing the semiconductor device according to the first embodiment.
Figure 3:
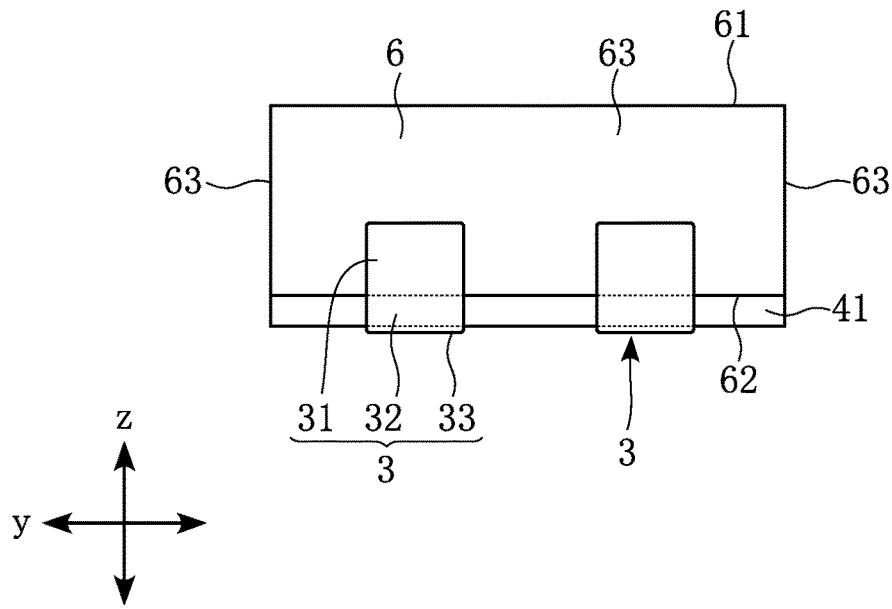
FIG. 3 is a side view showing the semiconductor device according to the first embodiment.
Figure 4:
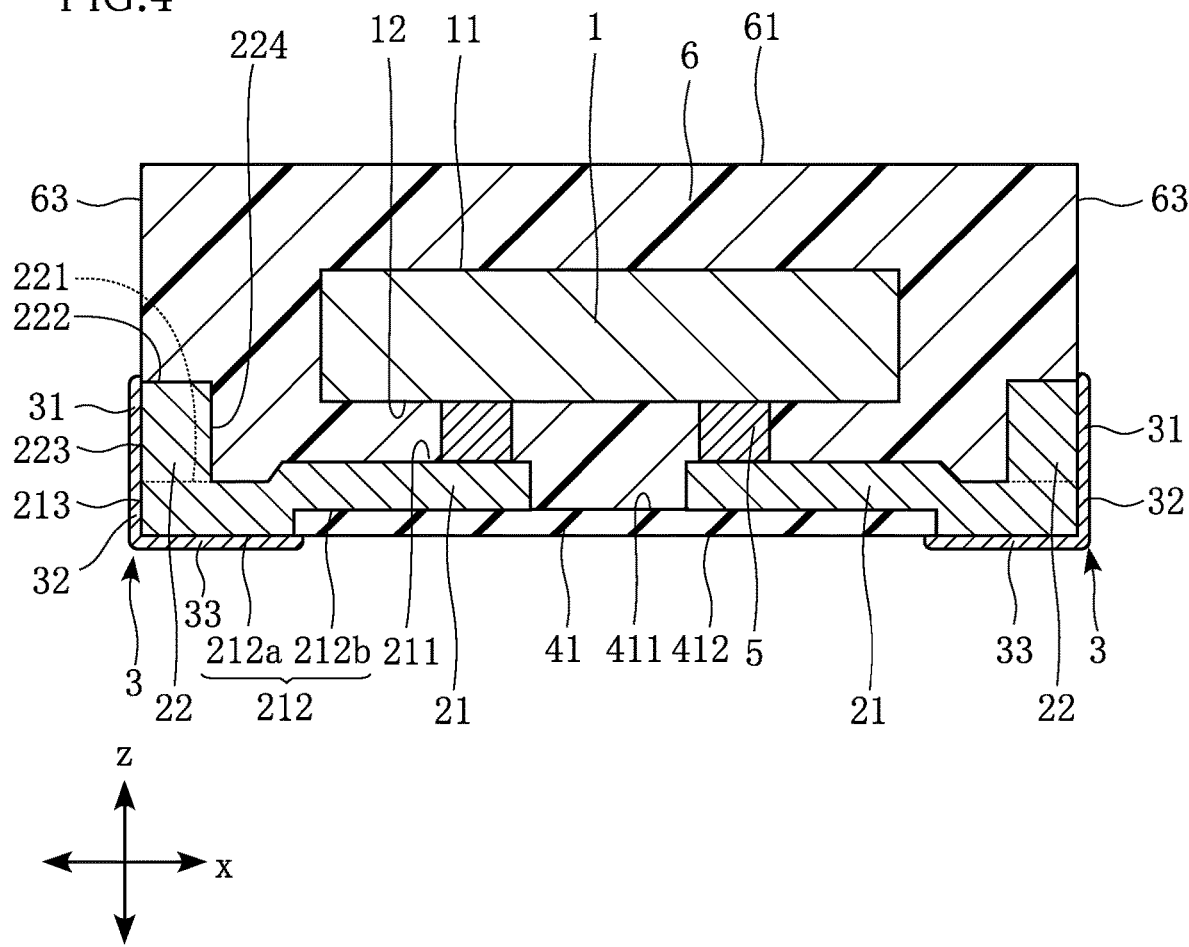
FIG. 4 is a sectional view along line IV-IV in FIG. 1.
Figure 5:
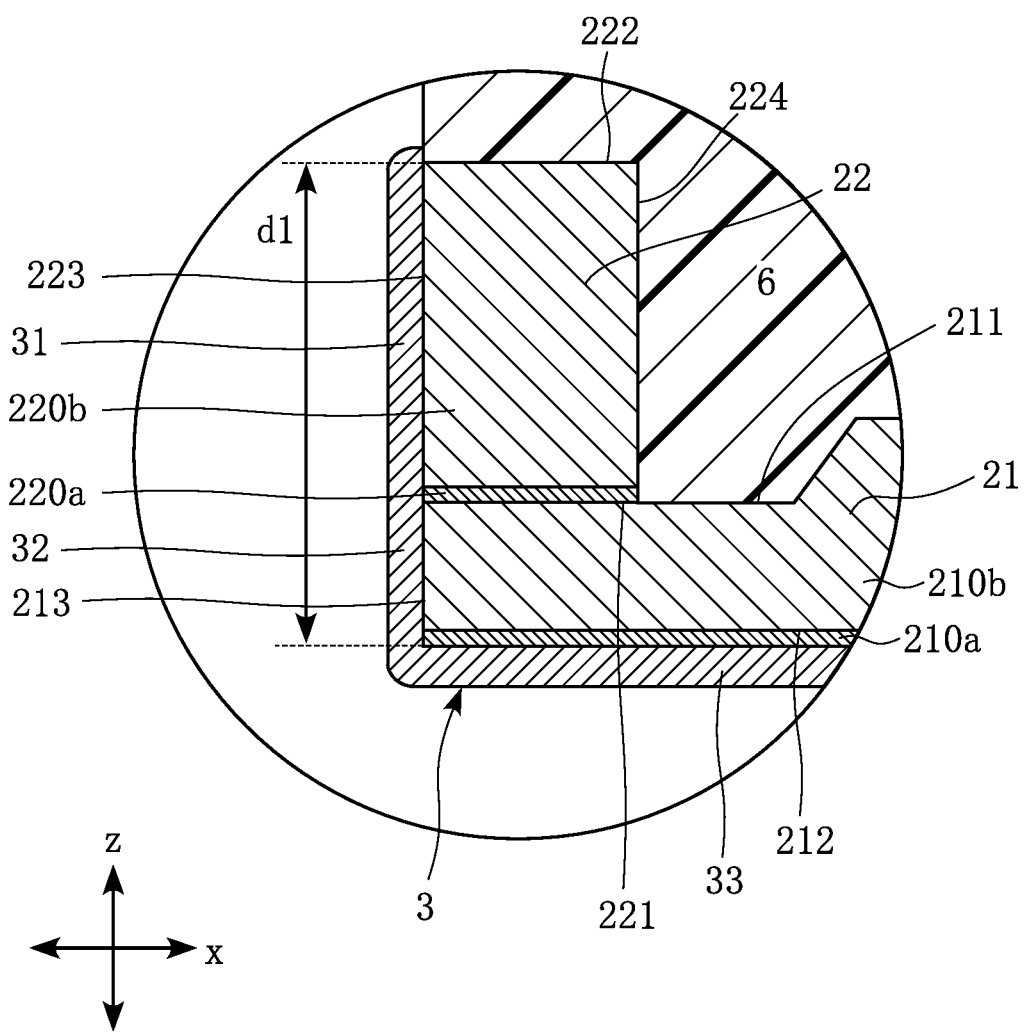
FIG. 5 is a main-part enlarged sectional view showing a part of the cross section in FIG. 4.
Figure 6:
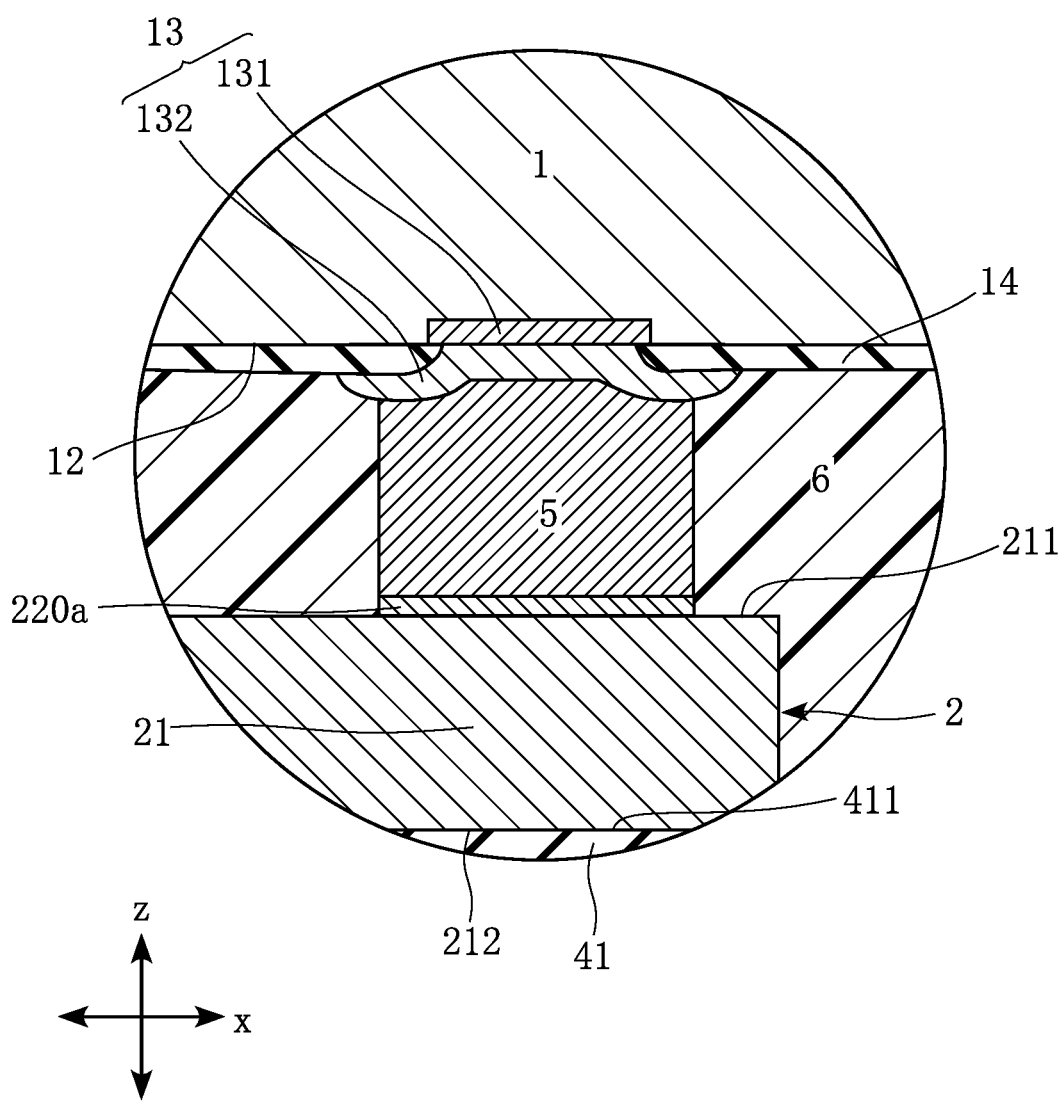
FIG. 6 is a main-part enlarged sectional view showing a part of the cross section in FIG. 4.

FIG. 1 is a plan view showing the semiconductor device A1. FIG. 1 omits the sealing resin 6. FIG. 2 is a bottom view showing the semiconductor device A1. FIG. 3 is a side view showing the semiconductor device A1. FIG. 3 shows a side surface of the semiconductor device A1 as viewed in x direction which is described below. FIG. 4 is a sectional view along line IV-IV in FIG. 1. FIG. 5 is a main-part enlarged sectional view showing a part of the cross section in FIG. 4. FIG. 6 is a main-part enlarged sectional view showing a part of the cross section in FIG. 4. For convenience of explanation, three directions orthogonal to each other are defined as x direction, y direction, and z direction, respectively. The z direction is the thickness direction of the semiconductor device A1. The x direction is the horizontal direction in the plan view of the semiconductor device A1. The y direction is the vertical direction in the plan view of the semiconductor device A1. The x direction and the z direction correspond to the "first direction" and the "thickness direction" in the claims.

The semiconductor device A1 is a resin package mounted on a surface of a circuit board in any of various electronic devices. As shown in FIGS. 1 and 2, the semiconductor device A1 has a rectangular shape as viewed in the z direction (hereinafter, also referred to as "plan view"). The semiconductor device A1 in the present embodiment is of a SON package type.

The semiconductor element 1 is the functional center of the semiconductor device A1. The semiconductor element 1 is an integrated circuit (IC) such as a large scale integration circuit (LSI). Alternatively, the semiconductor element 1 may be a voltage control element such as a low drop out regulator (LDO), an amplifier element such as an operational amplifier, or a discrete semiconductor element such as a diode. The semiconductor element 1 is rectangular in plan view. The semiconductor element 1 is mounted on the internal electrode 2. The semiconductor element 1 overlaps with the insulating film 41 in plan view. The semiconductor element 1 is mounted by flip-chip bonding.

The semiconductor element 1 has an element front surface 11 and an element back surface 12. The element front surface 11 and the element back surface 12 are spaced apart and face opposite from each other in the z direction. The element front surface 11 and the element back surface 12 are both flat.

The element back surface 12 is formed with electrode pads 13 and a passivation film 14. Each of the electrode pads 13 is rectangular in plan view. As shown in FIG. 6, the electrode pads 13 are bonded to the respective conductive bonding members 5. Each of the electrode pads 13 includes a first conductive portion 131 and a second conductive portion 132.

The first conductive portion 131 is made of aluminum (Al), for example. The second conductive portion 132 is composed of a nickel (Ni) layer, a palladium (Pd) layer, and a gold (Au) layer that are mutually laminated. The Ni layer of the second conductive portion 132 is in contact with the first conductive portion 131. Since the electrode pads 13 include the second conductive portions 132, the first conductive portions 131 which are made of Al are prevented from permeating into the conductive bonding members 5.

The passivation film 14 covers the element back surface 12 to protect the semiconductor element 1. The passivation film 14 is formed by mutually laminating a $Si_3N_4$ layer formed by a plasma CVD method, for example, and a polyimide resin layer formed by coating. The passivation film 14 is open in multiple locations (four locations in the present embodiment), and the electrode pads 13 are exposed from the respective openings.

The internal electrode 2 is a conductor disposed inside the semiconductor device A1. The internal electrode 2 is electrically connected to the semiconductor element 1. The internal electrode 2 includes wiring layers 21 and columnar portions 22.

Each of the wiring layers 21 is composed of a seed layer 210a and a plating layer 210b that are mutually laminated. For example, the seed layer 210a is composed of a first layer that contains titanium (Ti) as a main component, and a second layer that contains copper (Cu) as a main component. The seed layer 210a has a thickness of approximately 200 to 800 nm. The plating layer 210b contains Cu as a main component. The plating layer 210b has a dimension of approximately 20 to 50 μm in the z direction (hereinafter, the dimension being also referred to as "thickness"). Note that the seed layer 210a and the plating layer 210b are not limited to those described above in terms of material and thickness. The seed layer 210a and the plating layer 210b correspond to the "second seed layer" and the "second plating layer" in the claims, respectively. Each of the wiring layers 21 includes a wiring-layer front surface 211, a wiring-layer back surface 212, and an end surface 213.

The wiring-layer front surface 211 faces the element back surface 12 of the semiconductor element 1 in the z direction. The semiconductor element 1 is mounted on the wiring-layer front surface 211 via the conductive bonding member 5. The wiring-layer front surface 211 is partially covered with the sealing resin 6. The wiring-layer back surface 212 faces opposite from the wiring-layer front surface 211 in the z direction. The wiring-layer back surface 212 has an electrode cover region 212a and an insulating-film cover region 212b. The electrode cover region 212a is a region of the wiring-layer back surface 212, and is covered with the external electrode 3. The insulating-film cover region 212b is a region of the wiring-layer back surface 212, and is covered with the insulating film 41. The electrode cover region 212a is a region of the wiring-layer back surface 212 other than the insulating-film cover region 212. Furthermore, the electrode cover region 212a is located more outward in the z direction than the insulating-film cover region 212b. Accordingly, the wiring-layer back surface 212 has a step.

The end surface 213 intersects with the wiring-layer back surface 212 and faces outward in the x direction. In the illustrated example, the end surface 213 also intersects with the wiring-layer front surface 211. The end surface 213 is covered with the external electrode 3. Accordingly, the end surface 213 is not visible from outside the semiconductor device A1.

The columnar portions 22 protrude from the wiring layers 21 (wiring-layer front surfaces 211) in the z direction. The internal electrode 2 has four columnar portions 22. Each of the columnar portions 22 has a rectangular columnar shape having a rectangular cross section along the x-y plane. Note that each of the columnar portions 22 may have another shape such as a cylindrical shape or a polygonal columnar shape. The columnar portions 22 are larger in dimension than the wiring layers 21 in z direction. Each of the columnar portions 22 is composed of a seed layer 220a and a plating layer 220b that are mutually laminated. For example, the seed layer 220a is composed of a first layer that contains Ti as a main component, and a second layer that contains Cu as a main component. This means that the seed layer 210a and the seed layer 220a are made of the same material. The seed layer 220a has a thickness of approximately 200 to 800 nm.

The plating layer 220b contains Cu as a main component. Accordingly, the plating layer 210b and the plating layer 220b are made of the same material. The plating layer 220b has a thickness of approximately 50 to 100 μm. Note that the seed layer 220a and the plating layer 220b are not limited to those described above in terms of material and thickness. The seed layer 220a and the plating layer 220b correspond to the "first seed layer" and the "first plating layer" in the claims, respectively.

As shown in FIG. 4, each of the columnar portions 22 has a base end surface 221, a top surface 222, an exposed side surface 223, and a resin abutment side surface 224. The base end surface 221 is in contact with the wiring layer 21. The base end surface 221 is flat. The top surface 222 faces opposite from the base end surface 221 in the z direction. The top surface 222 is flat. The top surface 222 is covered with the sealing resin 6. The top surface 222 overlaps with the semiconductor element 1 as viewed in the x direction. In other words, the top surface 222 is arranged between the element front surface 11 and the element back surface 12 in the z direction. The exposed side surface 223 and resin abutment side surface 224 of each columnar portion 22 face in either one of the x direction and the y direction that are orthogonal to the z direction. In the present embodiment, the exposed side surface 223 faces outward in the x direction. The exposed side surface 223 is exposed from the sealing resin 6. The exposed side surface 223 is flush with the end surface 213. The resin abutment side surface 224 abuts on and is covered with the sealing resin 6.

The internal electrode 2 has a dimension dl in the z direction as shown in FIG. 5, and the dimension dl may be set to 100 μm or greater. Alternatively, the dimension dl in the z direction may be approximately 100 to 150 μm. Regarding the internal electrode 2, surfaces that abut on the sealing resin 6 (i.e., the wiring-layer front surfaces 211, the top surfaces 222, and the resin abutment side surfaces 224) are roughened to have a roughness of 2 to 3 μm through a roughening process in the manufacturing method described below. In the present embodiment, the surfaces that abut on the sealing resin 6 are rougher than the wiring-layer back surfaces 212, but smoother than the exposed side surfaces 223. In other words, the exposed side surfaces 223 are rougher than the surfaces that abut on the sealing resin 6.

The external electrodes 3 are conductors electrically connected to the internal electrode 2, and are exposed to the outside of the semiconductor device A1. The external electrodes 3 are terminals used when the semiconductor device A1 is mounted on a circuit board. The external electrodes 3 are formed by electroless plating. Each of the external electrodes 3 is composed of a Ni layer, a Pd layer, and a Au layer that are mutually laminated. The Ni layer is in contact with the internal electrode 2, and has a thickness of approximately 5 μm. The Au layer is exposed to the outside, and has a thickness of approximately 0.01 to 0.02 μm. The pd layer is interposed between the Ni layer and the Au layer, and has a thickness of approximately 0.01 to 0.02 μm. Note that the external electrodes 3 are not limited in terms of quantity, thickness, material, and forming method.

As shown in FIGS. 3 and 4, each of the external electrodes 3 includes a first cover portion 31, a second cover portion 32, and a third cover portion 33. The first cover portion 31 covers the exposed side surface 223 of the columnar portion 22. The second covering portion 32 covers the end surface 213 of the wiring layer 21. The third cover portion 33 covers a portion (electrode cover region 212a) of the wiring-layer back surface 212 of the wiring layer 21. In the present embodiment, two external electrodes 3 are seen on each of the two side surfaces of the semiconductor device A1 that face in the x direction, and four external electrodes 3 are seen from the bottom surface of the semiconductor device A1. The first cover portion 31, the second cover portion 32, and the third cover portion 33 are formed integrally. The external electrodes 3 are insulated from each other by the insulating film 41.

The insulating film 41 is made of an insulating material, such as a polyimide resin or a phenol resin. The insulating film 41 is provided at the bottom surface of the semiconductor device A1. The insulating film 41 is arranged lower than the sealing resin 6 in the z direction. As shown in FIG. 1, the insulating film 41 is rectangular in plan view. Note that the insulating film 41 may have a shape other than a rectangle in plan view. The insulating film 41 corresponds to the "first insulating film" in the claims. The insulating film 41 has an insulating film front surface 411 and an insulating film back surface 412 that face opposite from each other in the z direction.

The insulating film front surface 411 faces in the same direction as the element front surface 11 of the semiconductor element 1, and faces the element back surface 12 of the semiconductor element 1. The insulating film back surface 412 faces in the same direction as the element back surface 12. The insulating film front surface 411 is in contact with portions (insulating-film cover regions 212b) of the wiring-layer back surfaces 212 of the wiring layers 21. The insulating film back surface 412 is flush with portions (electrode cover regions 212a) of the wiring-layer back surfaces 212 of the wiring layers 21.

As shown in FIGS. 4 and 6, the conductive bonding members 5 are conductive members interposed between the wiring layers 21 of the internal electrode 2 and the electrode pads 13 of the semiconductor element 1. Each of the conductive bonding members 5 is made of a Ni layer in contact with the wiring layer 21, and a solder layer in contact with the Ni layer. The solder layer is made of an alloy containing tin (Sn). Examples of such an alloy include lead-free solder such as a Sn—Sb-based alloy or a Sn—Ag-based alloy, and solder containing lead (Pb). The semiconductor element 1 is fixed to the wiring layers 21 (internal electrode 2) by the conductive bonding members 5.

The sealing resin 6 may be a synthetic resin containing black epoxy resin as a main component. As shown in FIG. 4, the sealing resin 6 covers the semiconductor element 1, a portion of the internal electrode 2, and the conductive bonding members 5. The sealing resin 6 has a resin front surface 61, a resin back surface 62, and a plurality of resin side surfaces 63.

The resin front surface 61 faces in the same direction as the element front surface 11. As shown in FIG. 3, the resin back surface 62 faces in the same direction as the element back surface 12. The resin back surface 62 is in contact with the internal electrode 2 and the insulating film 41. The resin side surfaces 63 are orthogonal to the resin front surface 61 and the resin back surface 62. The sealing resin 6 has two resin side surfaces 63 facing opposite from each other in the x direction, and another two resin side surfaces 63 facing opposite from each other in the y direction. In the present embodiment, two external electrodes 3 are exposed from each of the two resin side surfaces 63 facing in the x direction, as shown in FIG. 3. In plan view, the external electrodes 3 are located more outward of the semiconductor device A1 than the two resin side surfaces 63 facing in the x direction.

Next, an example of a method for manufacturing the semiconductor device A1 will be described with reference to FIGS. 7 to 32. Among FIGS. 7 to 32, FIGS. 9, 12, 14, 17, 19, 21, and 23 are plan views showing steps of the method for manufacturing the semiconductor device A1, and FIGS. 28, 30, and 32 are bottom views showing steps of the method for manufacturing the semiconductor device A1. The rest of the figures are sectional views showing steps of the method for manufacturing the semiconductor device A1. The cross-sections shown in these figures correspond to the cross-section shown in FIG. 4. For convenience, the cross-sections in FIGS. 25-27, FIG. 29, and FIG. 31 are shown upside down in the z direction with respect to the other sectional views.

Figure 7:
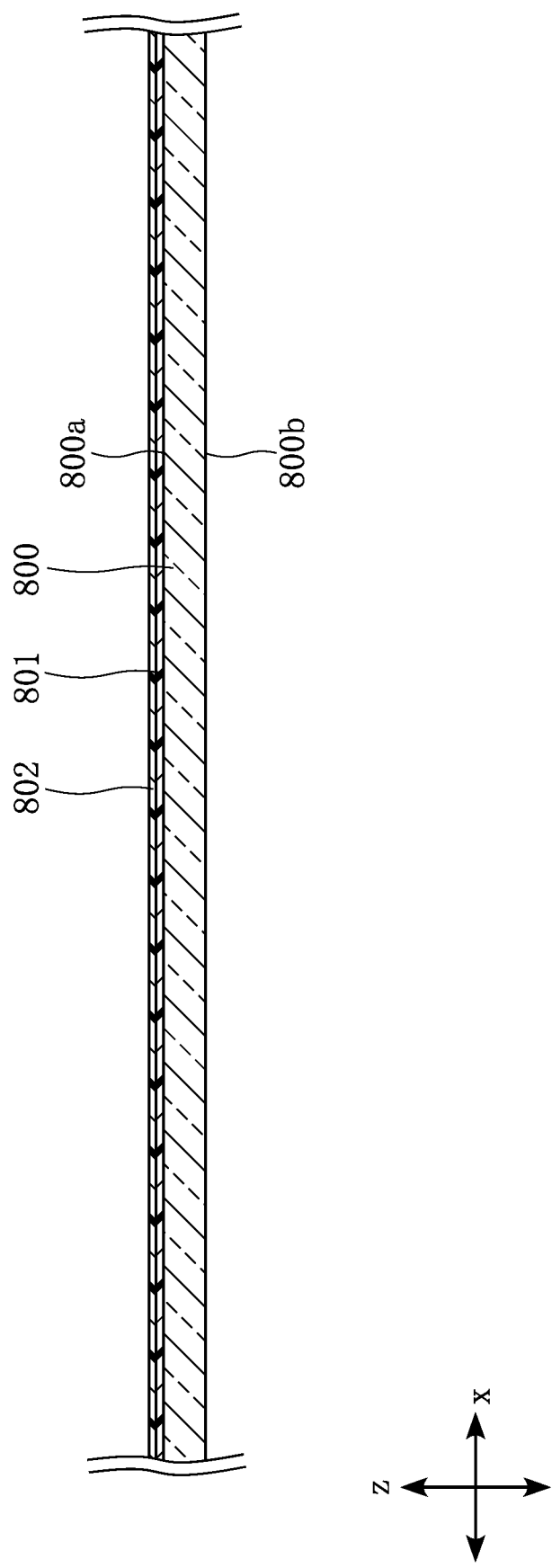
FIG. 7 is a sectional view showing a step of a method for manufacturing the semiconductor device in FIG. 1.

First, as shown in FIG. 7, a support substrate 800 is prepared (support substrate preparation step). The support substrate 800 has a front surface 800a and a back surface 800b facing in the z direction. The support substrate 800 may be a glass substrate or a silicon (Si) substrate. In the present embodiment, the support substrate 800 is a glass substrate having a light-transmissive property. The support substrate 800 has a thickness of approximately 0.5 μm. Next, as shown in FIG. 7, a temporary fixing member 801 is formed on the support substrate 800 (temporary fixing member forming step). In this step, the temporary fixing member 801 is formed to cover the entirety of the front surface 800a. Then, as shown in FIG. 7, a sputter film 802 is formed on the temporary fixing member 801 (sputter film formation step). In this step, the sputter film 802 is formed to cover the entirety of the temporary fixing member 801. The sputter film 802 is a metal film containing Ti as a main component.

Figure 8:
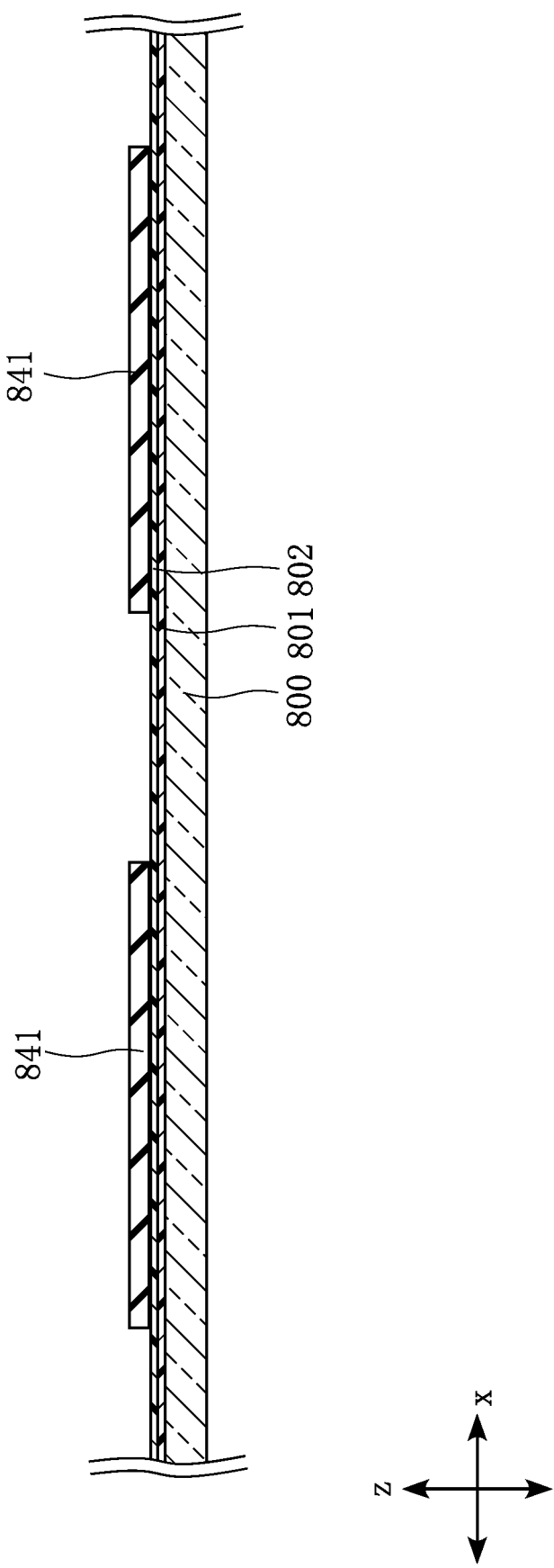
FIG. 8 is a sectional view showing a step of the method for manufacturing the semiconductor device in FIG. 1.

Next, insulating films 841 are formed, as shown in FIGS. 8 and 9 (insulating film formation step). One of the insulating films 841 correspond to the insulating film 41 of the semiconductor device A1. Each of the insulating films 841 is made of a photosensitive resin material such as a polyimide resin or a phenol resin. In the insulating film formation step, the insulating films 841 are formed on the sputter film 802 with use of a spin coater (rotary coating device), for example, as shown in FIG. 8. Alternatively, a film-like photosensitive resin material may be attached. Then, patterning may be performed by exposing and developing the photosensitive resin material. As a result, the insulating films 841 are formed as shown in FIGS. 8 and 9. With the insulating films 841 so formed, the sputter film 802 has portions covered with the insulating films 841 and portions exposed from the insulating films 841. The portions where the sputter film 802 is exposed from the insulating films 841 will ultimately become portions corresponding to the electrode cover regions 212a of the wiring layers 21 in the semiconductor device A1.

Figure 10:
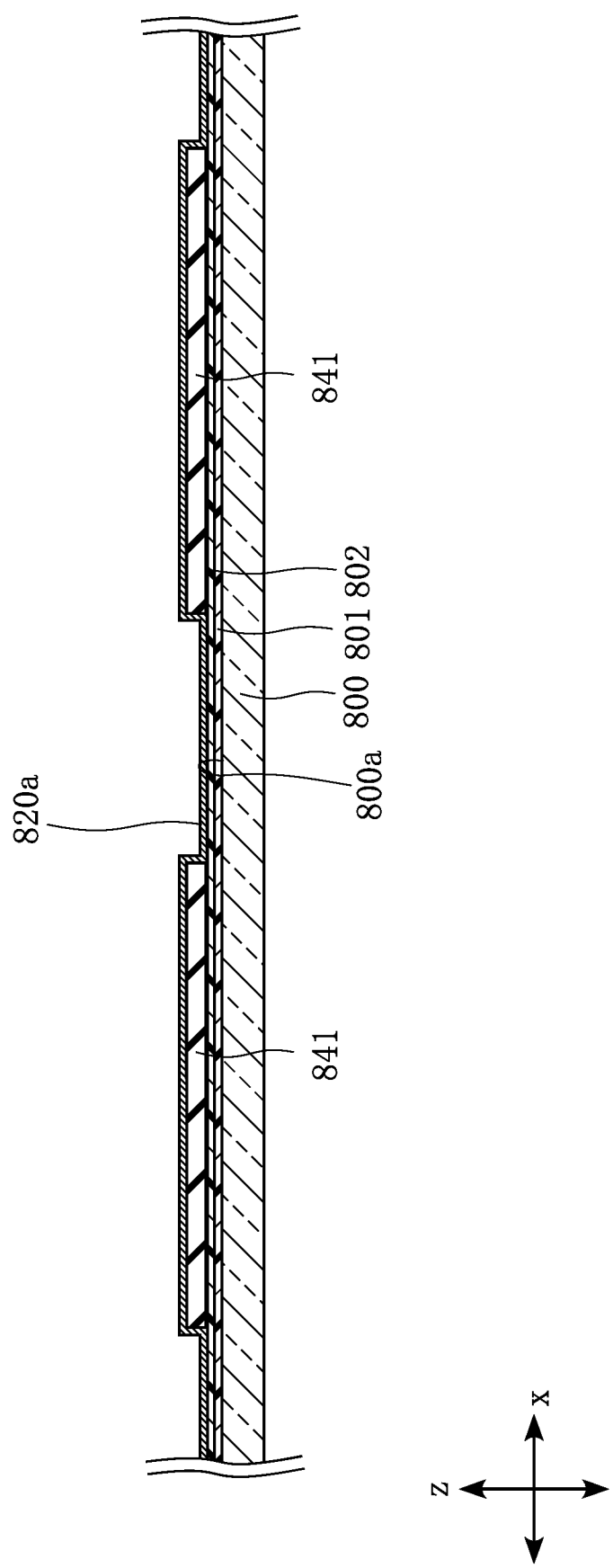
FIG. 10 is a sectional view showing a step of the method for manufacturing the semiconductor device in FIG. 1.

Next, a seed layer 820a is formed as shown in FIG. 10 (preceding seed layer formation step). Portions of the seed layer 820a will ultimately correspond to portions of the internal electrode 2 (specifically, the seed layers 210a of the wiring layers 21) in the semiconductor device A1. The seed layer 820a is formed by sputtering. The seed layer 820a is formed across all surfaces on the front surface 800a side of the support substrate 800. The seed layer 820a is composed of a Ti layer and a Cu layer that are mutually laminated. In the preceding seed layer formation step, the Ti layer is first formed to be in contact with the insulating films 841 and the sputter film 802, and the Cu layer is then formed on the Ti layer.

Figure 11:
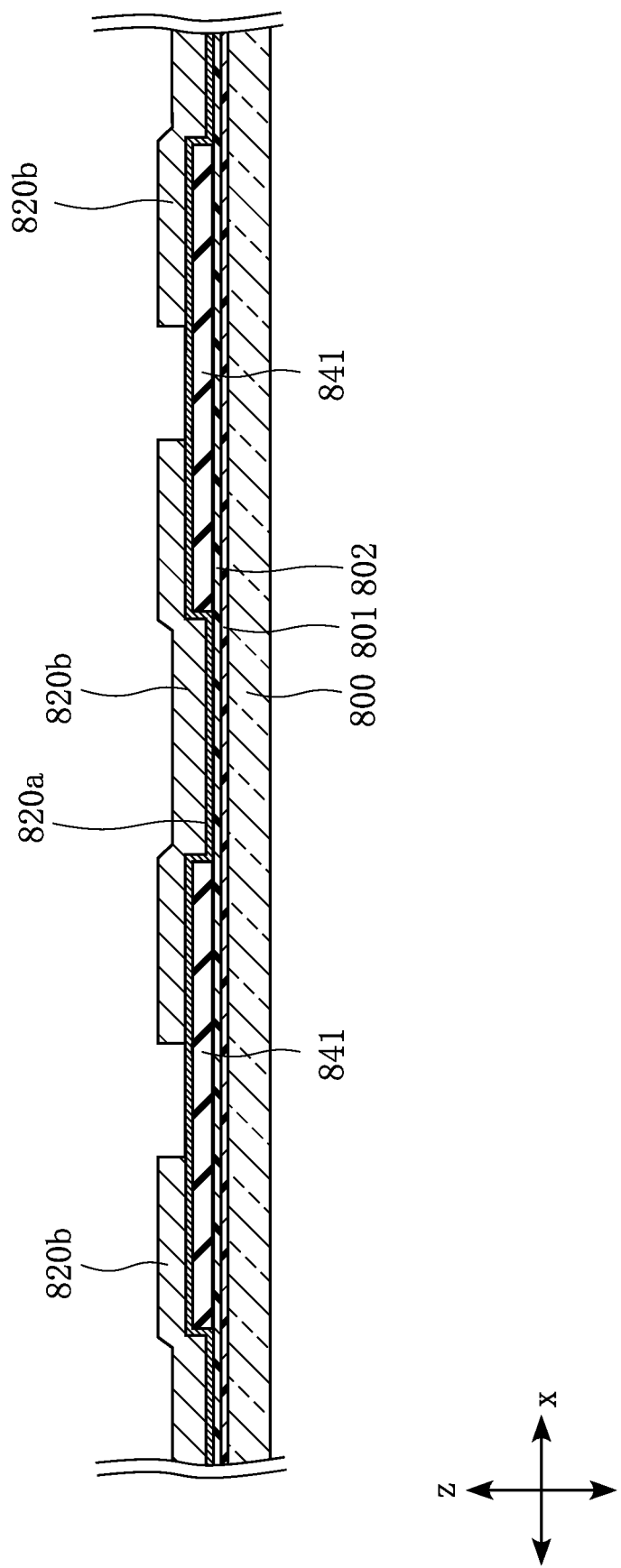
FIG. 11 is a sectional view showing a step of the method for manufacturing the semiconductor device in FIG. 1.

Next, as shown in FIGS. 11 and 12, plating layers 820b are formed (preceding plating layer formation step). The plating layers 820b correspond to portions of the internal electrode 2 (specifically, the plating layers 210b of the wiring layers 21) of the semiconductor device A1. The plating layers 820b are formed by pattern formation through photolithography and electrolytic plating. In the preceding plating layer formation step, a resist layer (not shown) for forming the plating layers 820b is first formed through photolithography. In forming the resist layer, a photosensitive resist is applied to cover the entire surface of the seed layer 820a, and the photosensitive resist is patterned by exposure and development. The patterning exposes portions of the seed layer 820a (portions for forming the plating layers 820b). Then, the plating layers 820b are formed on the exposed portions of the seed layer 820a through electrolytic plating using the seed layer 820a as a conductive path. Subsequently, the resist layer is removed to thereby form the plating layers 820b as shown in FIGS. 11 and 12.

Figure 13:
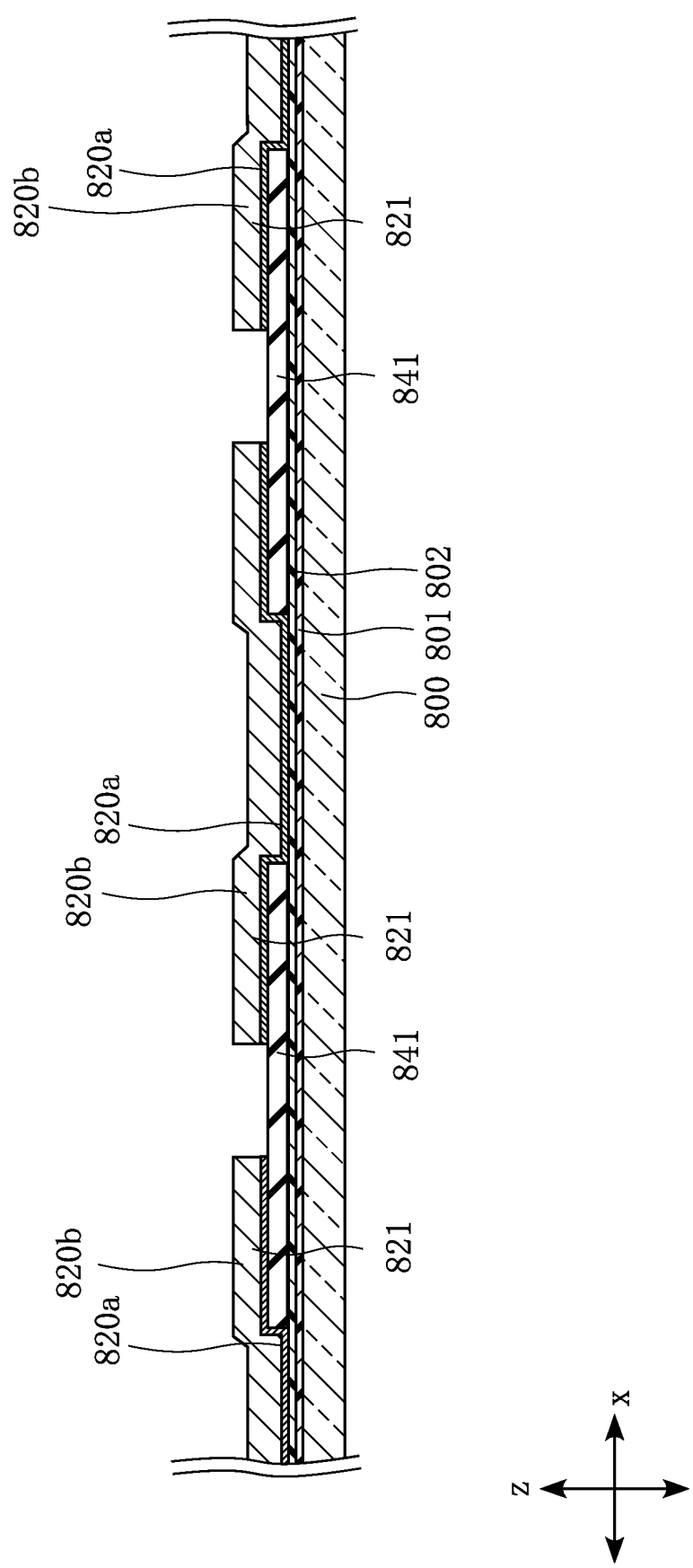
FIG. 13 is a sectional view showing a step of the method for manufacturing the semiconductor device in FIG. 1.
Figure 14:
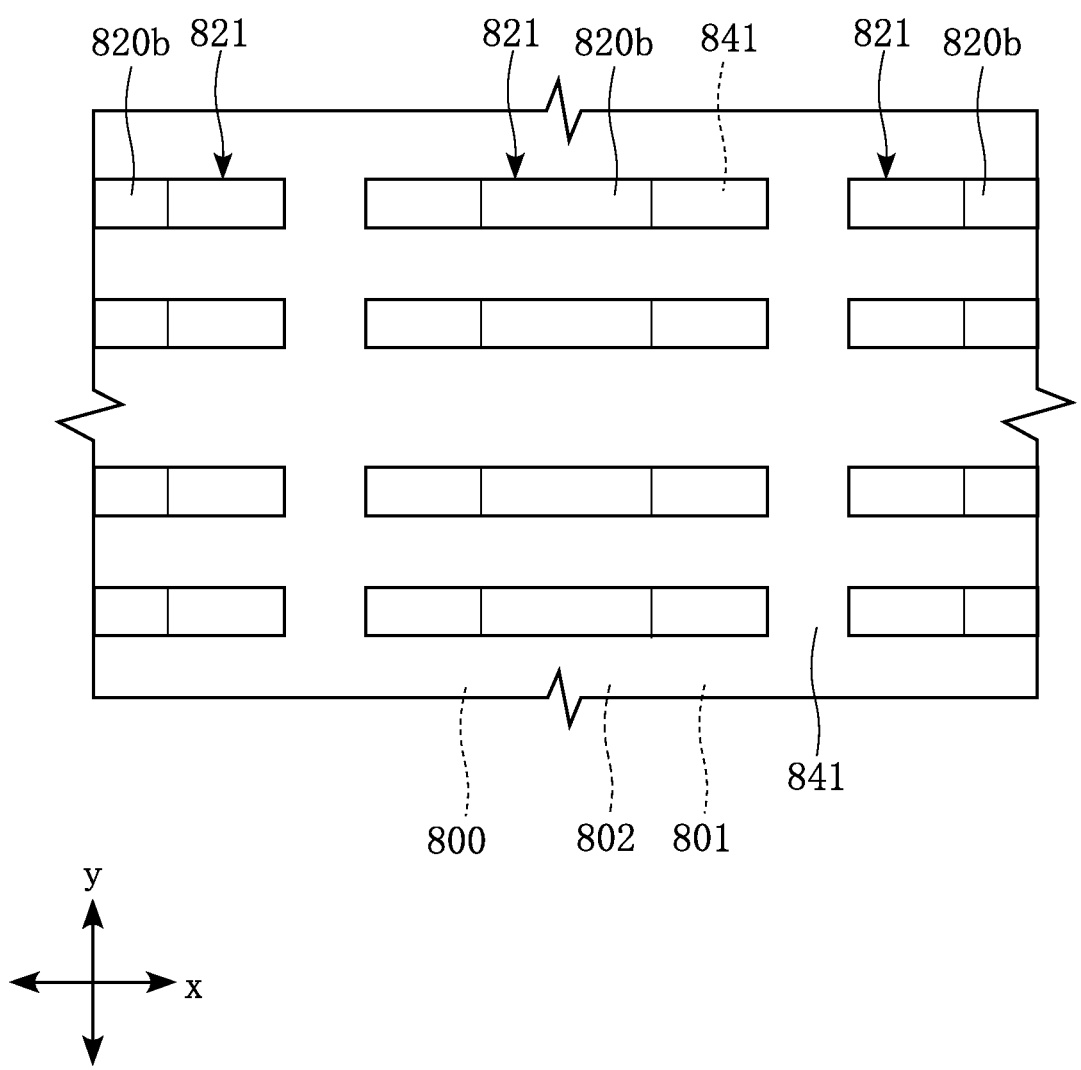
FIG. 14 is a plan view showing a step of the method for manufacturing the semiconductor device in FIG. 1.

Next, as shown in FIGS. 13 and 14, unnecessary portions of the seed layer 820a that are not covered with the plating layers 820b are all removed (preceding seed layer removal step). The unnecessary portions of the seed layer 820a are removed by wet etching. The wet etching is performed with use of a mixed solution of sulfuric acid ($H_2SO_4$) and hydrogen peroxide ($H_2O_2$). As a result of the preceding seed layer removal step, the insulating films 841 are exposed from where portions of the seed layer 820a are removed, as shown in FIGS. 13 and 14. Also, as a result of the removal of the unnecessary portions of the seed layer 820a, wiring layers 821, which are composed of seed layers 820a and the plating layers 820b, are formed. The wiring layers 821 correspond to the wiring layers 21 of the internal electrode 2 of the semiconductor device A1. Accordingly, the wiring layers 821 are formed through a wiring layer formation step that includes the preceding seed layer formation step, the preceding plating layer formation step, and the preceding seed layer removal step.

Figure 15:
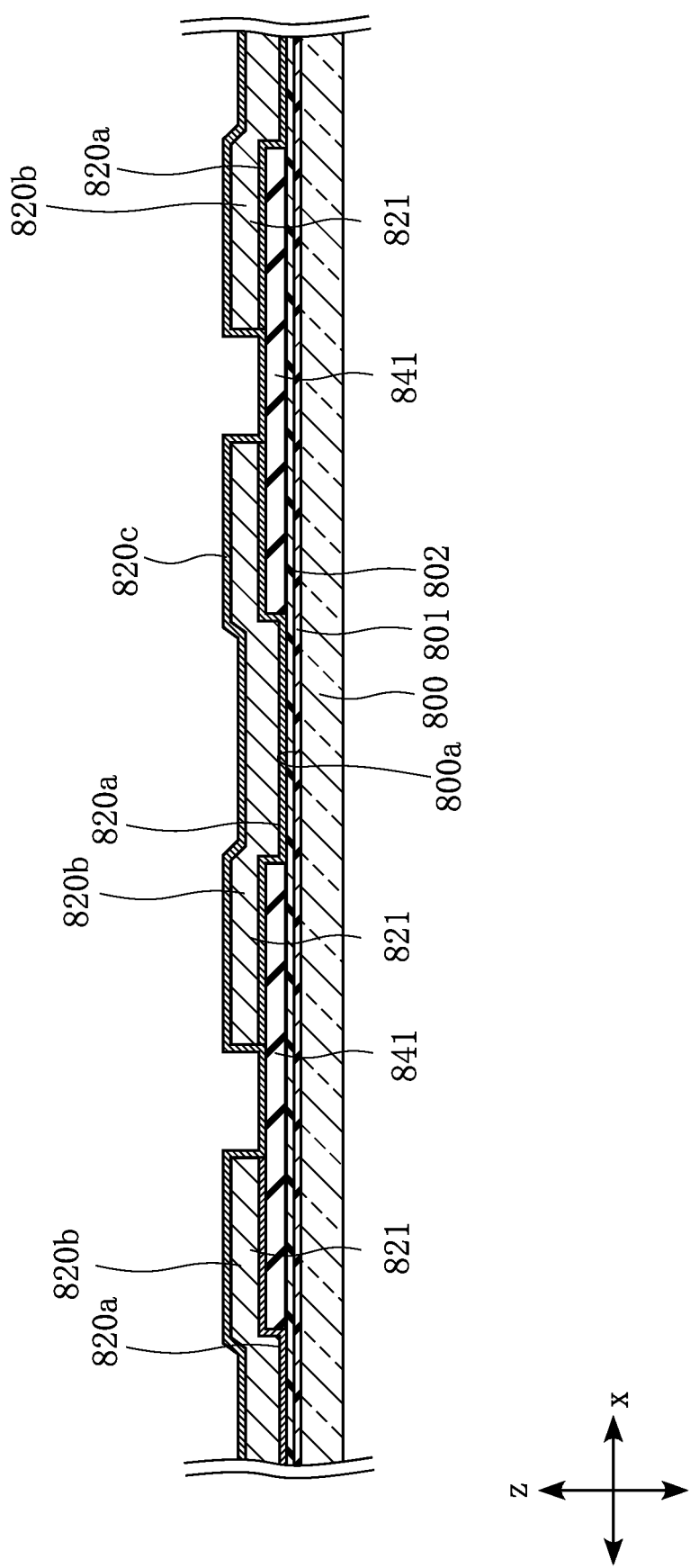
FIG. 15 is a sectional view showing a step of the method for manufacturing the semiconductor device in FIG. 1.
Figure 16:
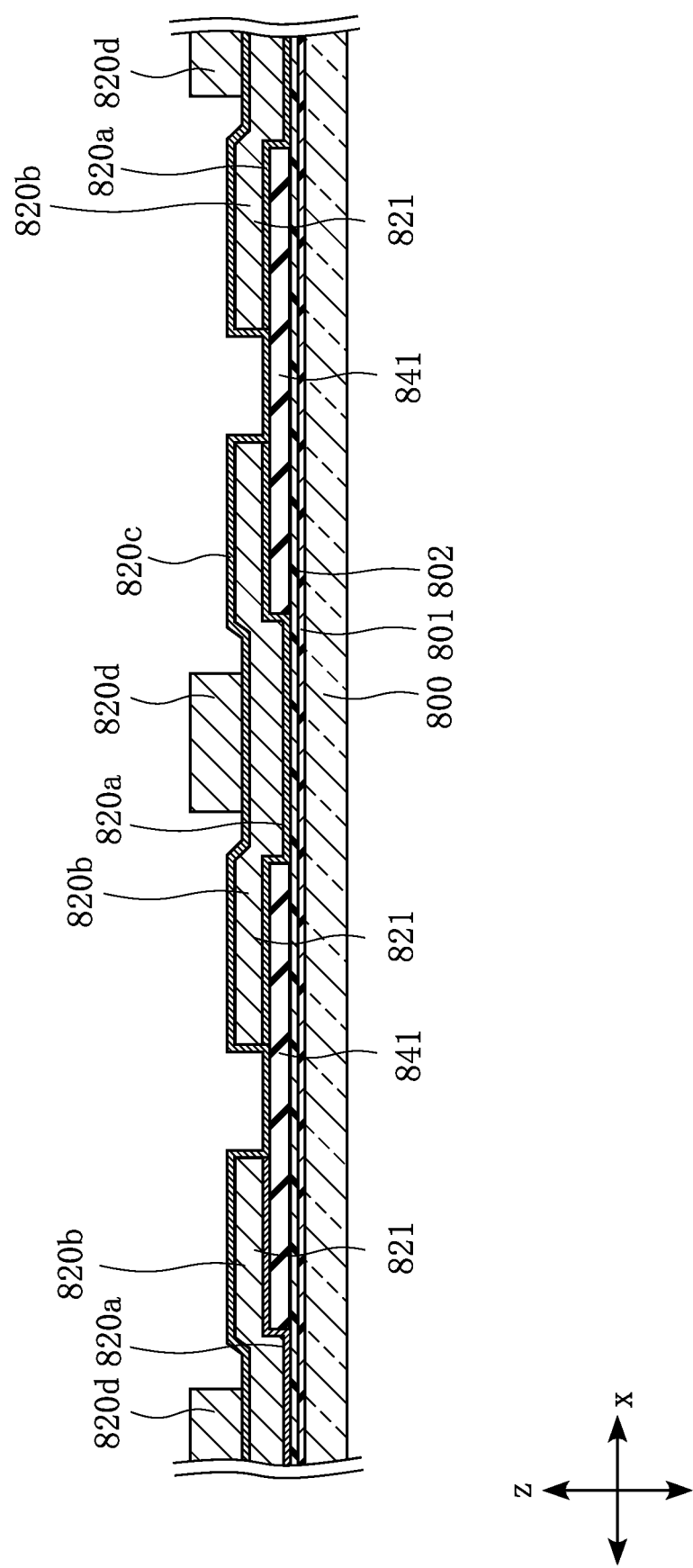
FIG. 16 is a sectional view showing a step of the method for manufacturing the semiconductor device in FIG. 1.
Figure 17:
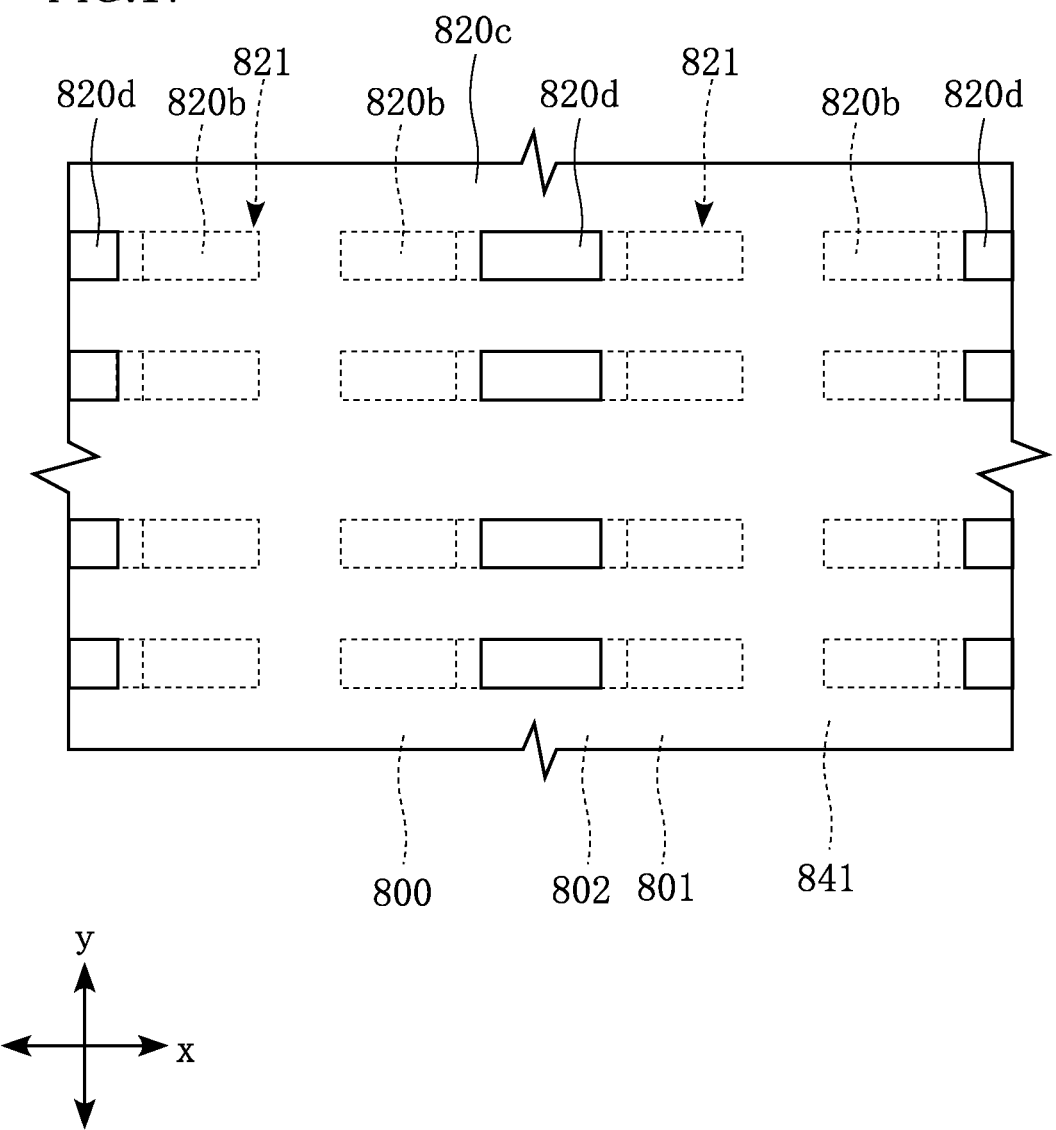
FIG. 17 is a plan view showing a step of the method for manufacturing the semiconductor device in FIG. 1.

Next, a seed layer 820c is formed as shown in FIG. 15 (succeeding seed layer formation step). Portions of the seed layer 820c will ultimately correspond to portions of the internal electrode 2 (specifically, the seed layers 220a of the columnar portions 22) in the semiconductor device A1. The seed layer 820c is formed by sputtering. The seed layer 820c is formed across all surfaces on the front surface 800a side of the support substrate 800. The seed layer 820c is composed of a Ti layer and a Cu layer that are mutually laminated. In the succeeding seed layer formation step, the Ti layer is formed to be in contact with either the insulating films 841 or the plating layers 820b, and the Cu layer is then formed to be in contact with the Ti layer.

Next, as shown in FIGS. 0.16 and 17, plating layers 820d are formed (succeeding plating layer formation step). The plating layers 820d correspond to portions of the internal electrode 2 (specifically, the plating layers 220b of the columnar portions 22) of the semiconductor device A1. The plating layers 820d are formed by pattern formation through photolithography and electrolytic plating. In the succeeding plating layer formation step, a resist layer (not shown) for forming the plating layers 820d is first formed through photolithography. In forming the resist layer, a photosensitive resist is applied to cover the entire surface of the seed layer 820c, and the photosensitive resist is patterned by exposure and development. The patterning exposes portions of the seed layer 820c (portions for forming the plating layers 820d). Then, the plating layers 820d are formed on the exposed portions of the seed layer 820c through electrolytic plating using the seed layer 820c as a conductive path. Subsequently, the resist layer is removed to thereby form the plating layers 820d as shown in FIGS. 0.16 and 17.

Figure 18:
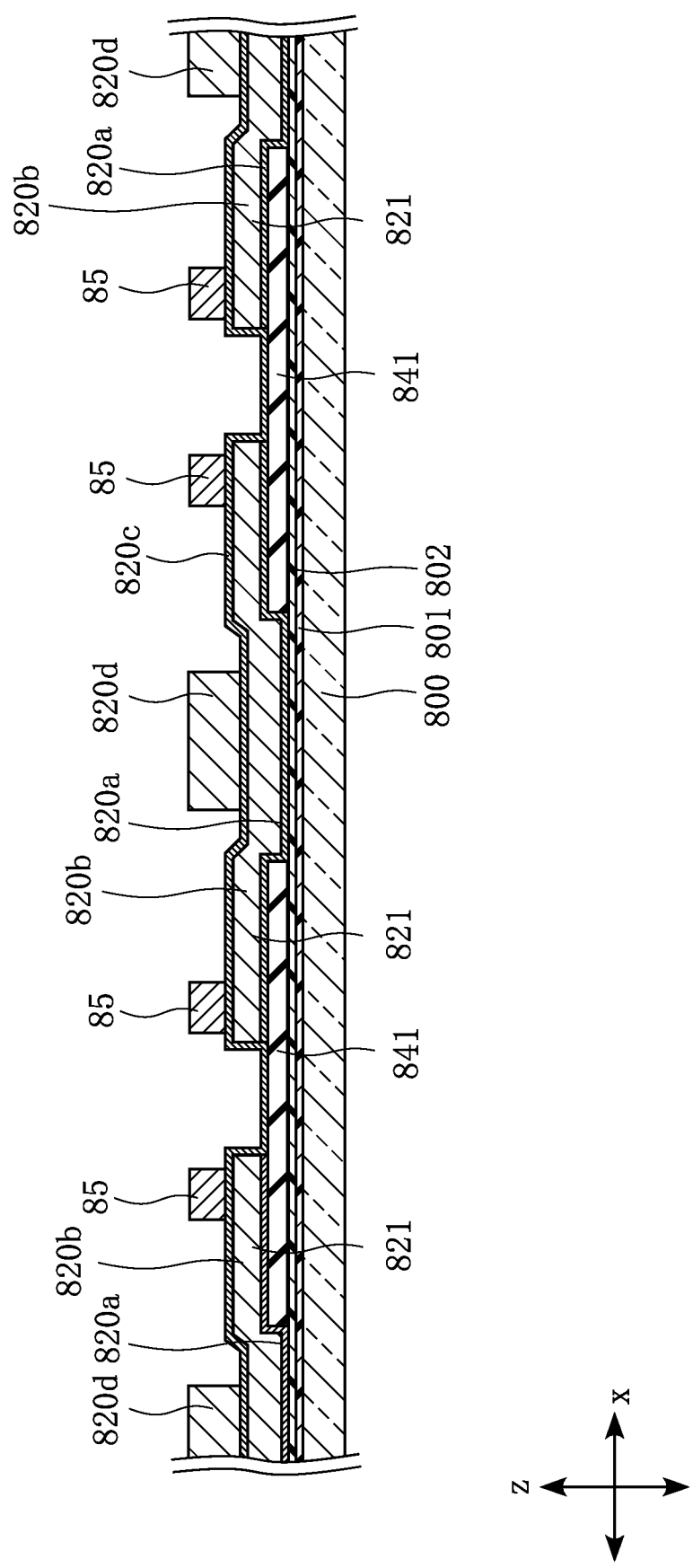
FIG. 18 is a sectional view showing a step of the method for manufacturing the semiconductor device in FIG. 1.
Figure 19:
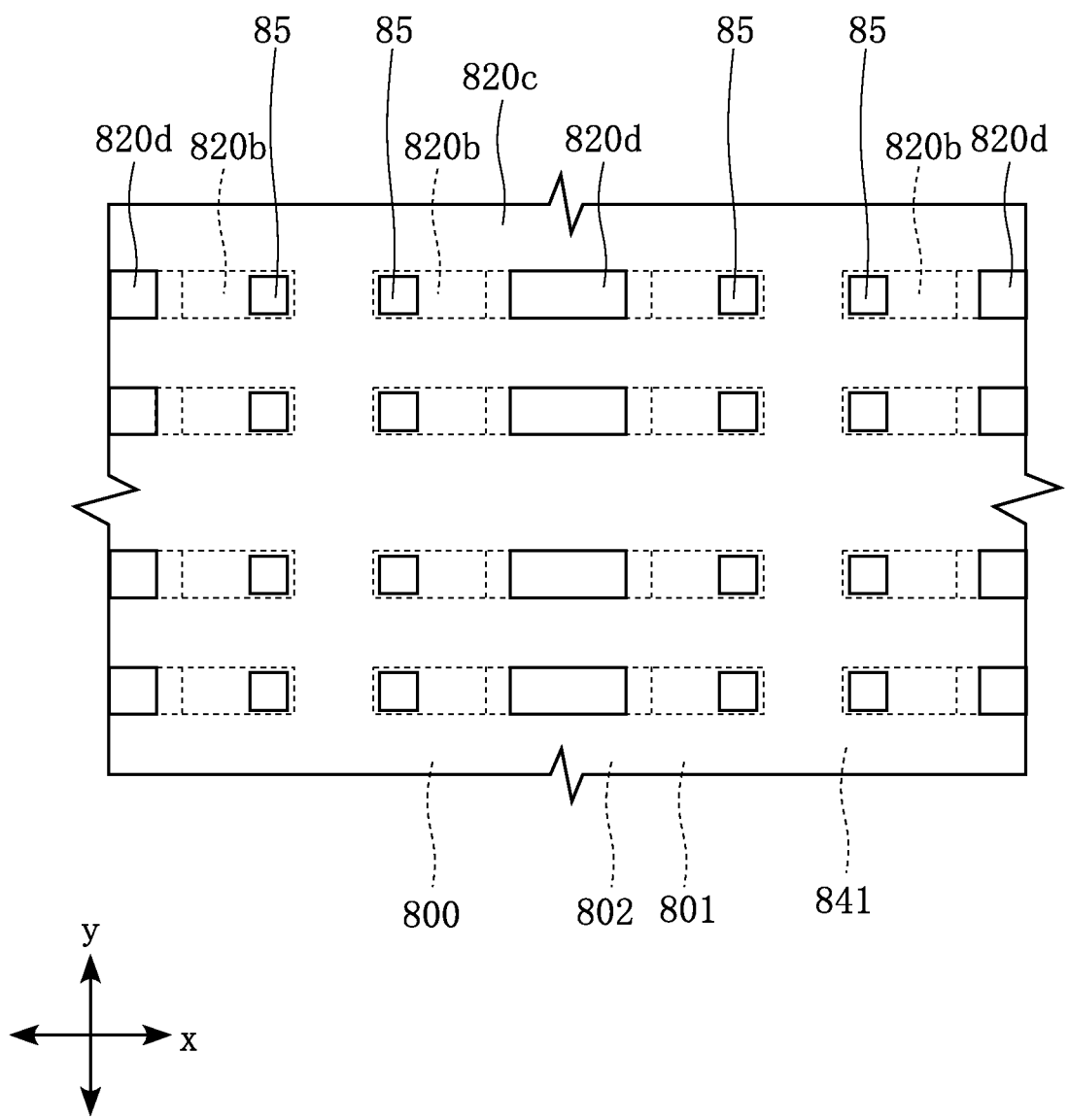
FIG. 19 is a plan view showing a step of the method for manufacturing the semiconductor device in FIG. 1.

Next, as shown in FIGS. 18 and 19, conductive bonding members 85 are formed (conductive bonding members formation step). The conductive bonding members 85 correspond to the conductive bonding members 5 of the semiconductor device A1. The conductive bonding members 85 are formed by pattern formation through photolithography and electrolytic plating. In the conductive bonding members formation step, a resist layer (not shown) for forming the conductive bonding members 85 is first formed on the seed layer 820c, and the resist layer is patterned. The patterning exposes portions of the seed layer 820c (portions for forming the conductive bonding members 85). Then, the conductive bonding members 85 are formed on the exposed portions through electrolytic plating using the seed layer 820c as a conductive path. In the formation, first conductive layers are formed to be in contact with the seed layer 820c, and second conductive layers are then formed to be in contact with the first conductive layers. In the present embodiment, each of the first conductive layers contains Ni as a main component, and each of the second conductive layers contains lead-free solder such as a Sn—Ag-based alloy or a Sn—Sb-based alloy. Subsequently, the resist layer is removed.

Figure 20:
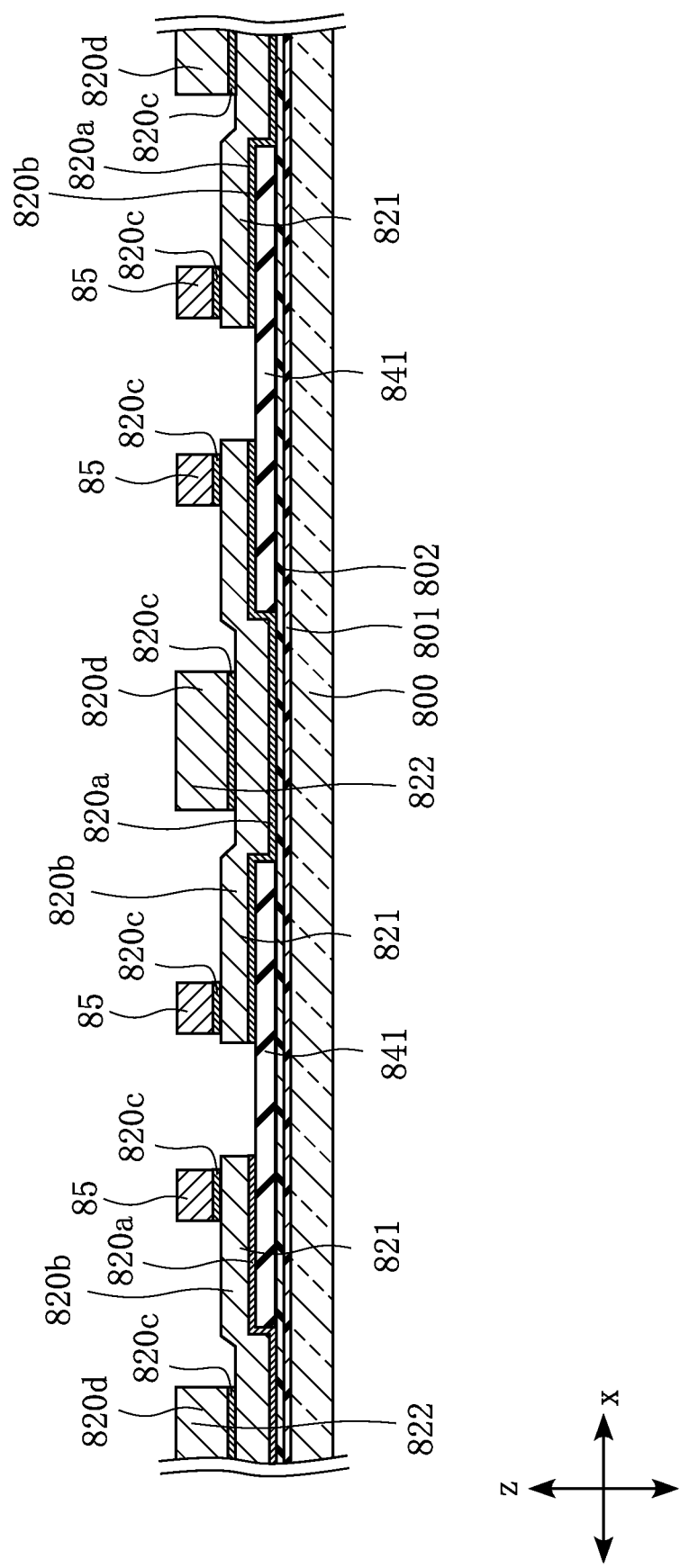
FIG. 20 is a sectional view showing a step of the method for manufacturing the semiconductor device in FIG. 1.
Figure 21:
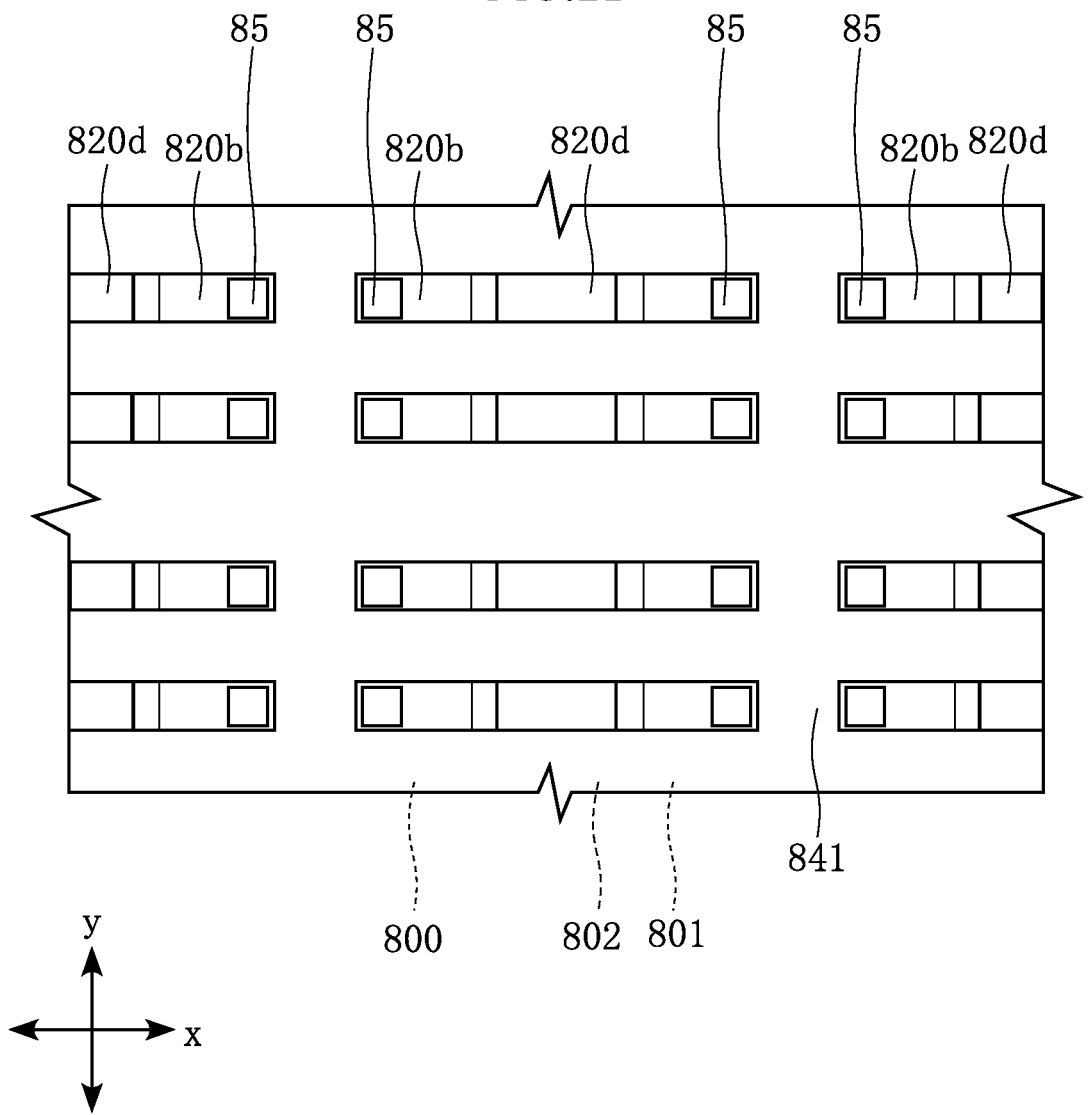
FIG. 21 is a plan view showing a step of the method for manufacturing the semiconductor device in FIG. 1.

Next, as shown in FIGS. 20 and 21, unnecessary portions of the seed layer 820c that are not covered with either the plating layers 820d or the conductive bonding members 85 are all removed (succeeding seed layer removal step). The removal of the unnecessary portions of the seed layer 820c is performed in the same manner as the preceding seed layer removal step. That is, the removal is performed by wet etching using a mixed solution of sulfuric acid ($H_2SO_4$) and hydrogen peroxide ($H_2O_2$). As a result of the succeeding seed layer removal step, the wiring layers 821 and the insulating films 841 are exposed from where portions of the seed layer 820c are removed, as shown in FIGS. 20 and 21. Also, as a result of the removal of the unnecessary portions of the seed layer 820c, columnar portions 822 that are composed of seed layers 820c and the plating layers 820d, are formed. The columnar portions 822 correspond to the columnar portions 22 of the internal electrode 2 in the semiconductor device A1. Accordingly, the columnar portions 822 are formed through a columnar portion formation step that includes the succeeding seed layer formation step, the succeeding plating layer formation step, and the succeeding seed layer removal step. Since the wiring layers 821 and the columnar portions 822 are included in an internal electrode 82, a step of forming the internal electrode 82 (internal electrode formation step) includes the wiring layer formation step and the columnar portion formation step.

Next, a roughening process is performed. A chemical solution used for the roughening process is not particularly limited as long as the solution reacts with the material (Cu) of the internal electrode 82 (the wiring layers 821 and the columnar portions 822). As a result of the roughening process, the surfaces of the wiring layers 821 and the columnar portions 822 are roughened. The roughness of the surfaces is approximately 2 to 3 μm, for example.

Figure 22:
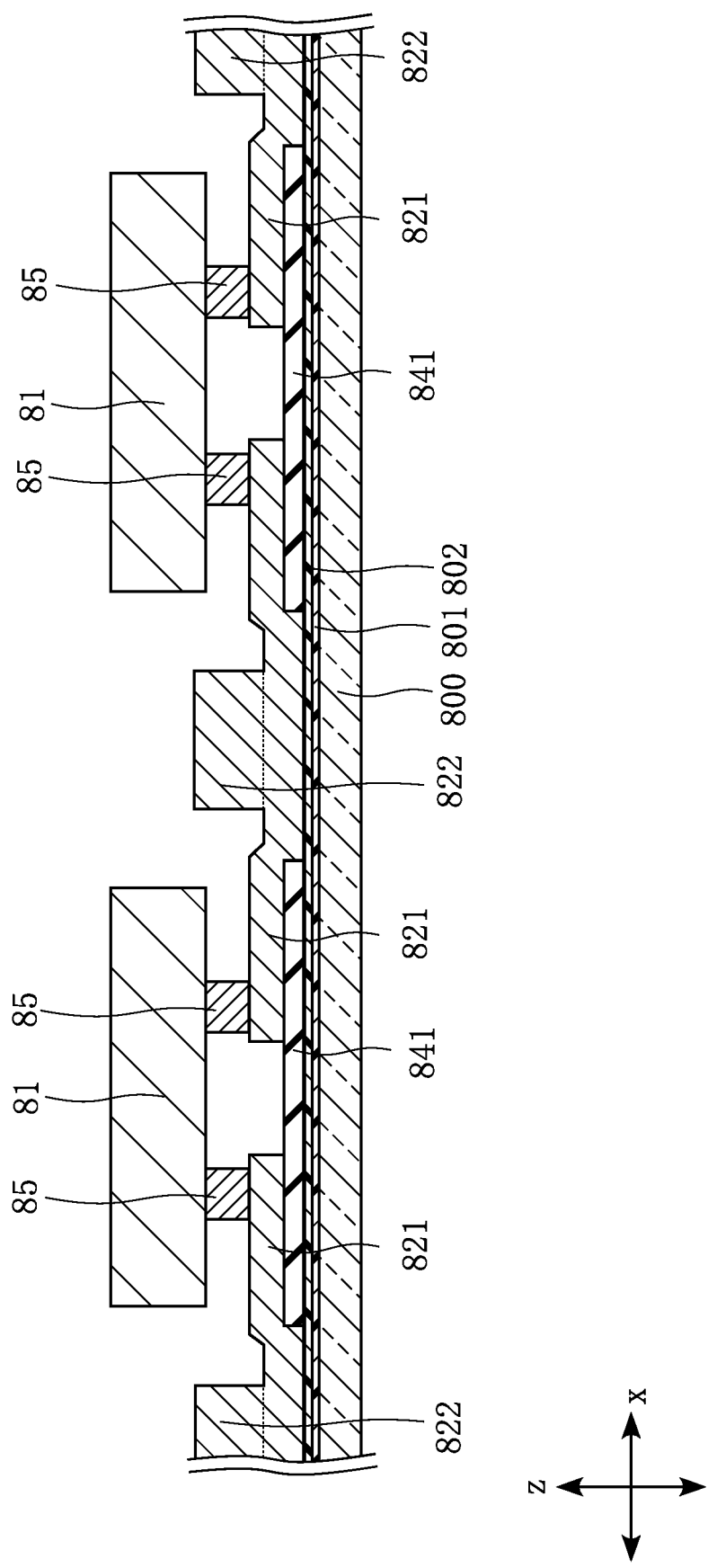
FIG. 22 is a sectional view showing a step of the method for manufacturing the semiconductor device in FIG. 1.
Figure 23:
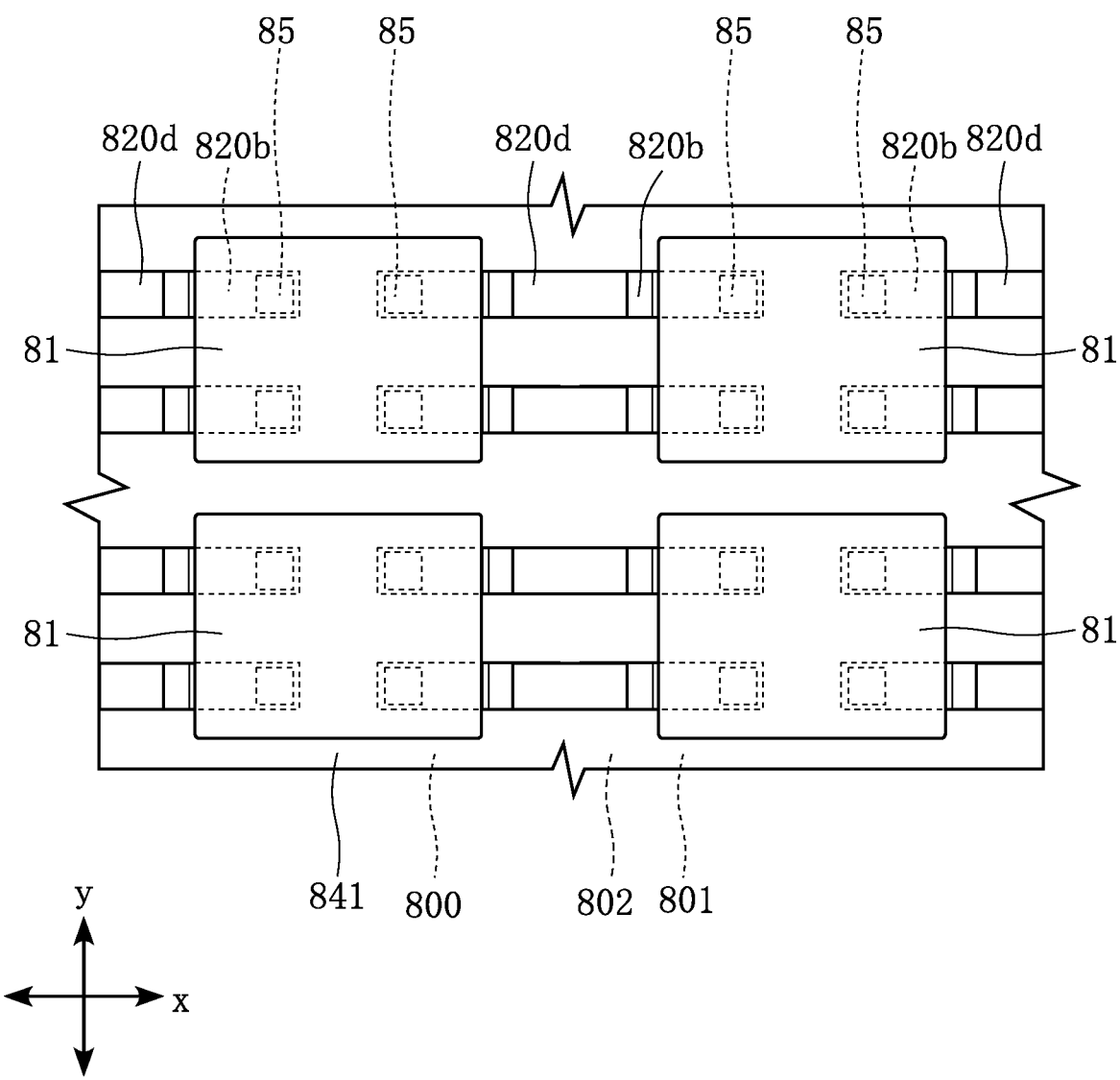
FIG. 23 is a plan view showing a step of the method for manufacturing the semiconductor device in FIG. 1.

Next, as shown in FIGS. 22 and 23, semiconductor elements 81 are mounted (semiconductor element mounting step). Note that in FIG. 22 and the subsequent figures, the seed layers 820a and the plating layers 820b are collectively shown as the wiring layers 821 with no distinction therebetween. Similarly, the seed layers 820c and the plating layers 820d are collectively shown as the columnar portions 822 with no distinction therebetween. One of the semiconductor elements 81 corresponds to the semiconductor element 1 in the semiconductor device A1. The semiconductor element mounting step is performed through flip chip bonding (FCB). First, flux is applied to electrode pads (not shown) of the semiconductor elements 81. Then, with the semiconductor elements 81 positioned opposite from the wiring layers 821, the semiconductor elements 81 are temporarily attached to the conductive bonding members 85 via a flip chip bonder. At this point, the conductive bonding members 85 are sandwiched between the wiring layers 821 and the semiconductor elements 81. Next, the conductive bonding members 85 are melted by reflow. Then, the conductive bonding members 85 are cooled and solidified, after which mounting of the semiconductor elements 81 is completed.

Figure 24:
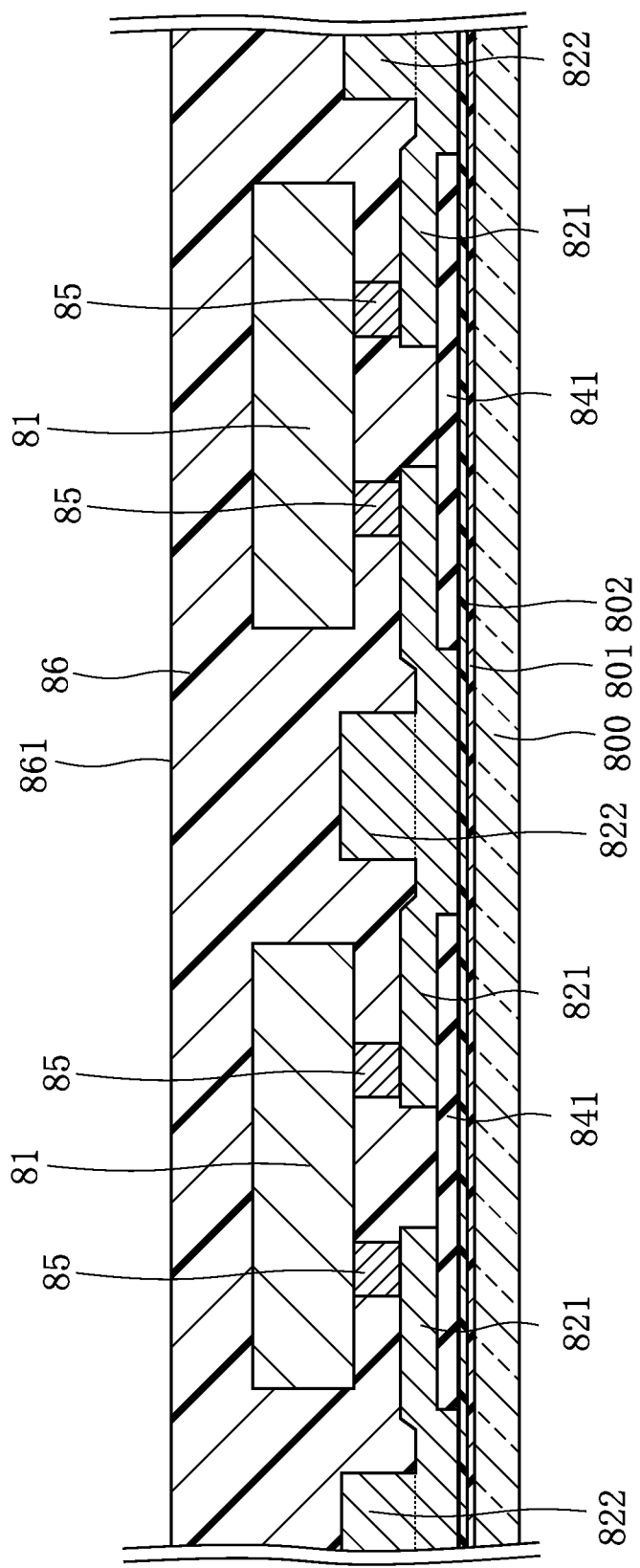
FIG. 24 is a sectional view showing a step of the method for manufacturing the semiconductor device in FIG. 1.

Next, a sealing resin 86 is formed to cover the semiconductor elements 81 (sealing resin formation step), as shown in FIG. 24. The sealing resin 86 corresponds to the sealing resin 6 of the semiconductor device A1. The sealing resin 86 is a synthetic resin having an electrically insulating property, such as a synthetic resin containing a black epoxy resin as a main component. In the sealing resin formation step, the sealing resin 86 is formed over the support substrate 800 such that the semiconductor elements 81 are completely covered without exposure. The sealing resin 86 formed in this step has a resin front surface 861. As shown in FIG. 24, the wiring layers 821 and the columnar portions 822 are also covered with the sealing resin 86. After the sealing resin formation step, the sealing resin 86 may be ground from the resin front surface 861 to reduce the thickness of the sealing resin 86. During this process, the sealing resin 86 may be ground until the upper surfaces of the semiconductor elements 81 are exposed from the sealing resin 86.

Figure 25:
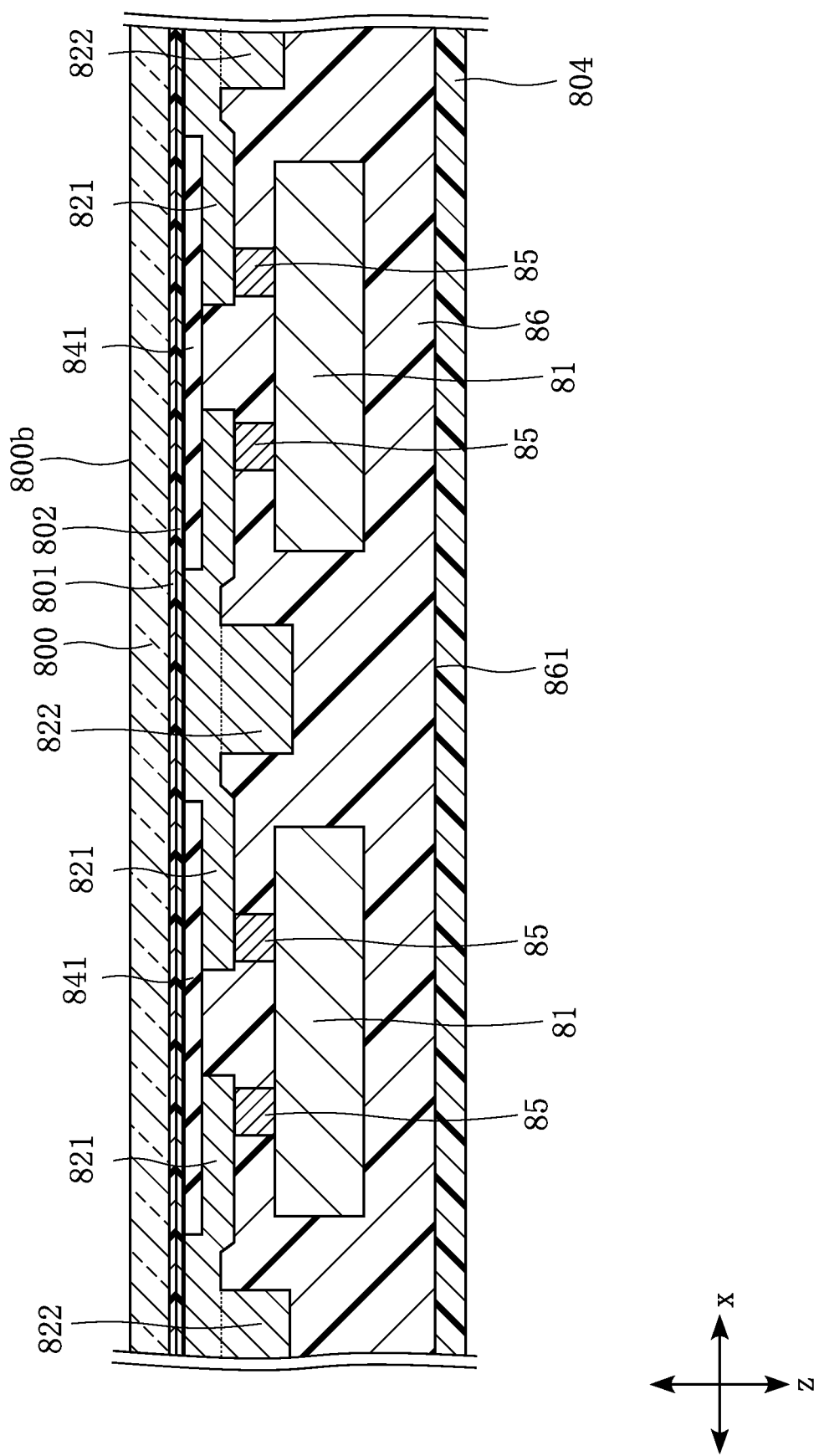
FIG. 25 is a sectional view showing a step of the method for manufacturing the semiconductor device in FIG. 1.
Figure 26:
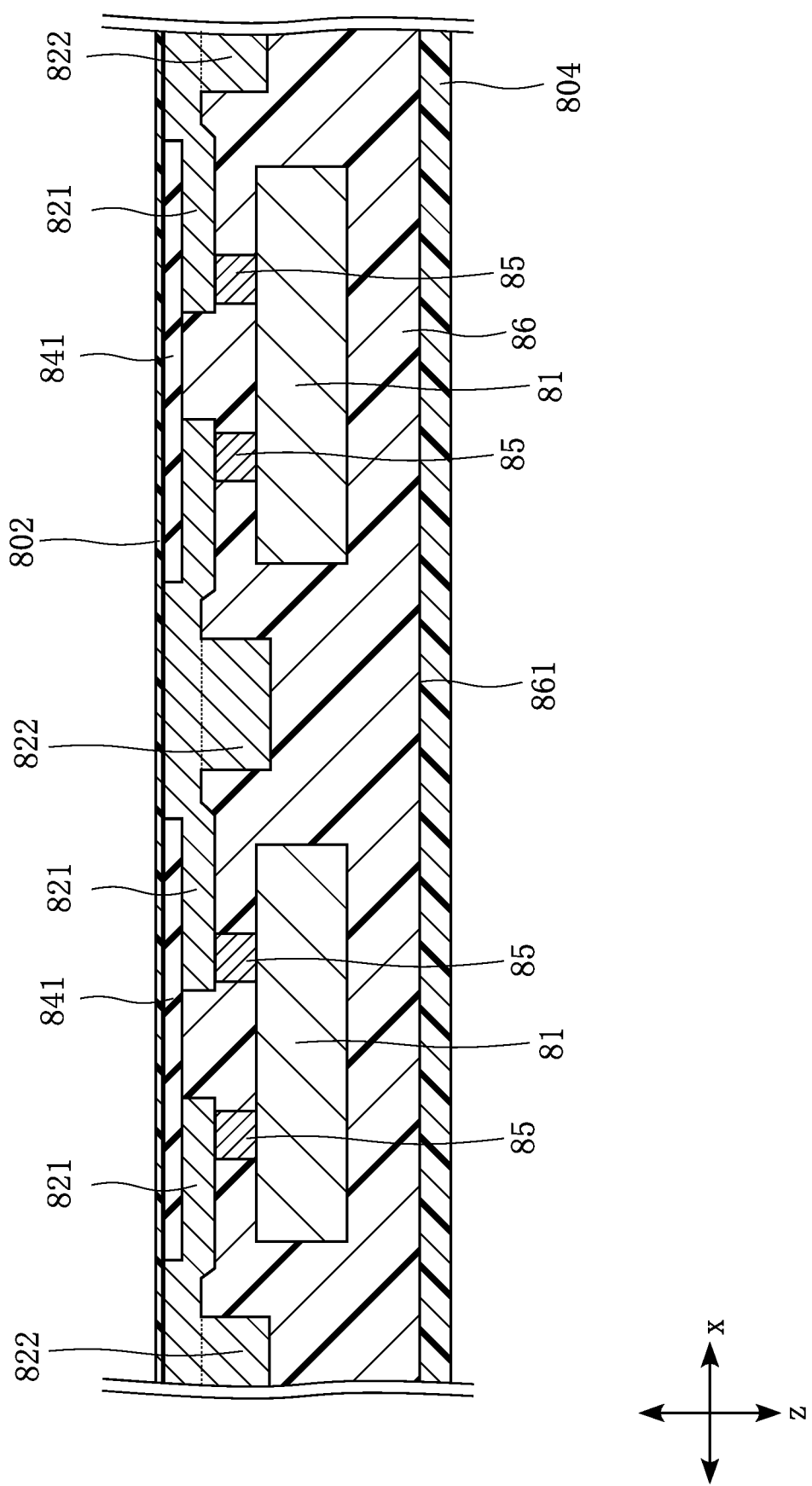
FIG. 26 is a sectional view showing a step of the method for manufacturing the semiconductor device in FIG. 1.

Next, as shown in FIGS. 0.25 and 26, the support substrate 800 is peeled off (support substrate peeling step). In the support substrate peeling step, a dicing tape 804 is attached to the resin front surface 861, as shown in FIG. 25. Then, laser irradiation is performed from the back surface 800b of the support substrate 800, for example. In this way, the laser beam passes through the support substrate 800 to irradiate the temporary fixing member 801. This weakens the adhesive strength of the temporary fixing member 801, allowing the support substrate 800 to be peeled off. If the temporary fixing member 801 partially remains (e.g., as soot) after the support substrate 800 is peeled off, the remaining bits of the temporary fixing member 801 may be removed by plasma. As a result of the above process, the support substrate 800 and the temporary fixing member 801 are removed as shown in FIG. 26. Note that the support substrate peeling step may be performed through a method other than laser irradiation. For example, an element such as the support substrate 800 may be peeled off by blowing air in the x direction (horizontal direction in FIG. 25). Alternatively, an element such as the support substrate 800 can be peeled off by heating and softening the temporary fixing member 801. When the peeling is performed by laser irradiation, it is necessary that the support substrate 800 be made of a material having an appropriate light-transmissive property, so that the laser beam can pass through the support substrate 800. When the peeling is performed by blowing air or heating, the support substrate 800 may be a Si substrate instead of a glass substrate.

Figure 27:
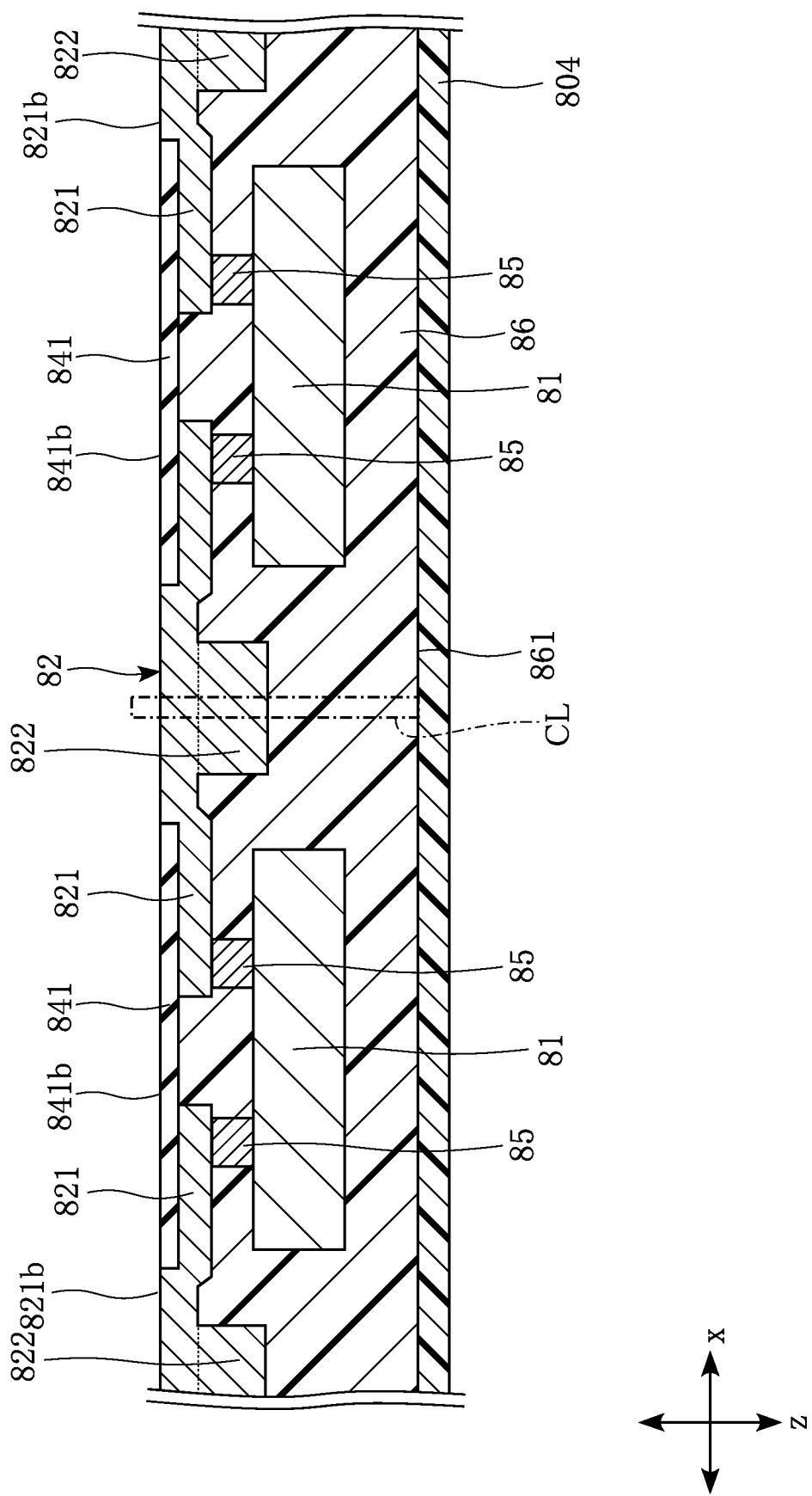
FIG. 27 is a sectional view showing a step of the method for manufacturing the semiconductor device in FIG. 1.
Figure 28:
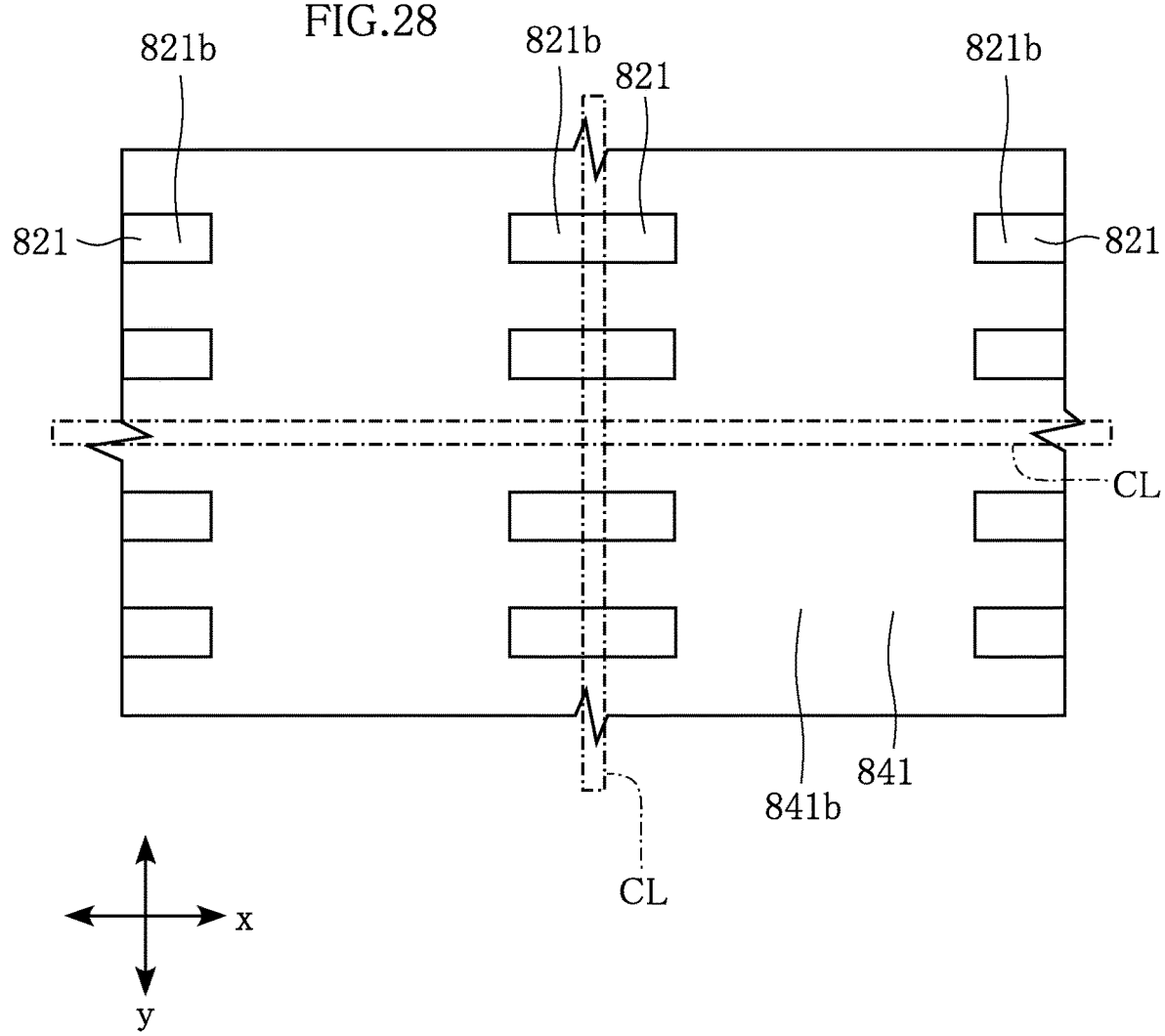
FIG. 28 is a bottom view showing a step of the method for manufacturing the semiconductor device in FIG. 1.

Next, the sputter film 802 is removed (sputter film removal step), as shown in FIGS. 27 and 28. As a result of the sputter film removal step, insulating film back surfaces 841b of the insulating films 841 and wiring layer back surfaces 821b of the wiring layers 821 are exposed.

Figure 29:
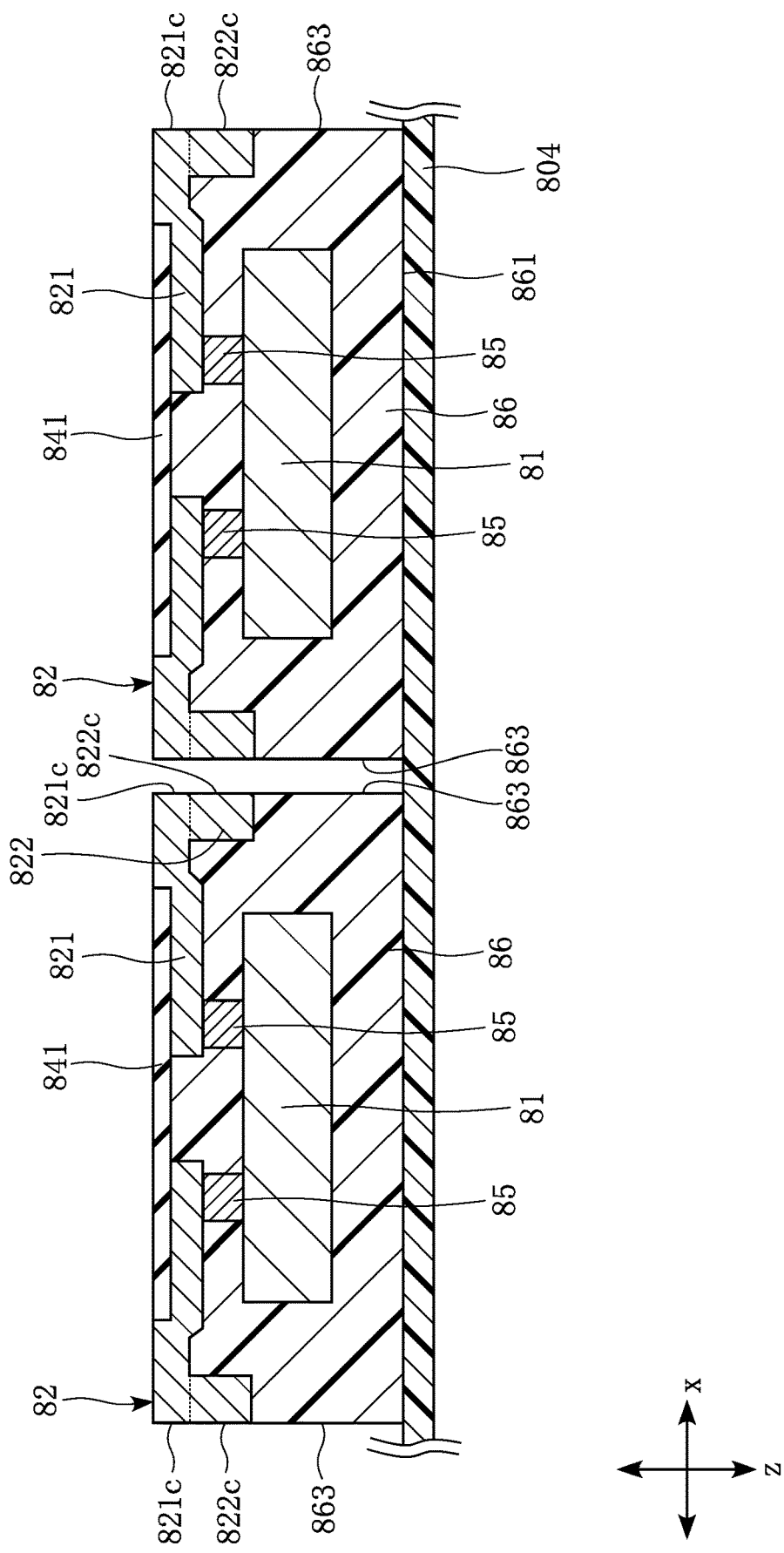
FIG. 29 is a sectional view showing a step of the method for manufacturing the semiconductor device in FIG. 1.
Figure 30:
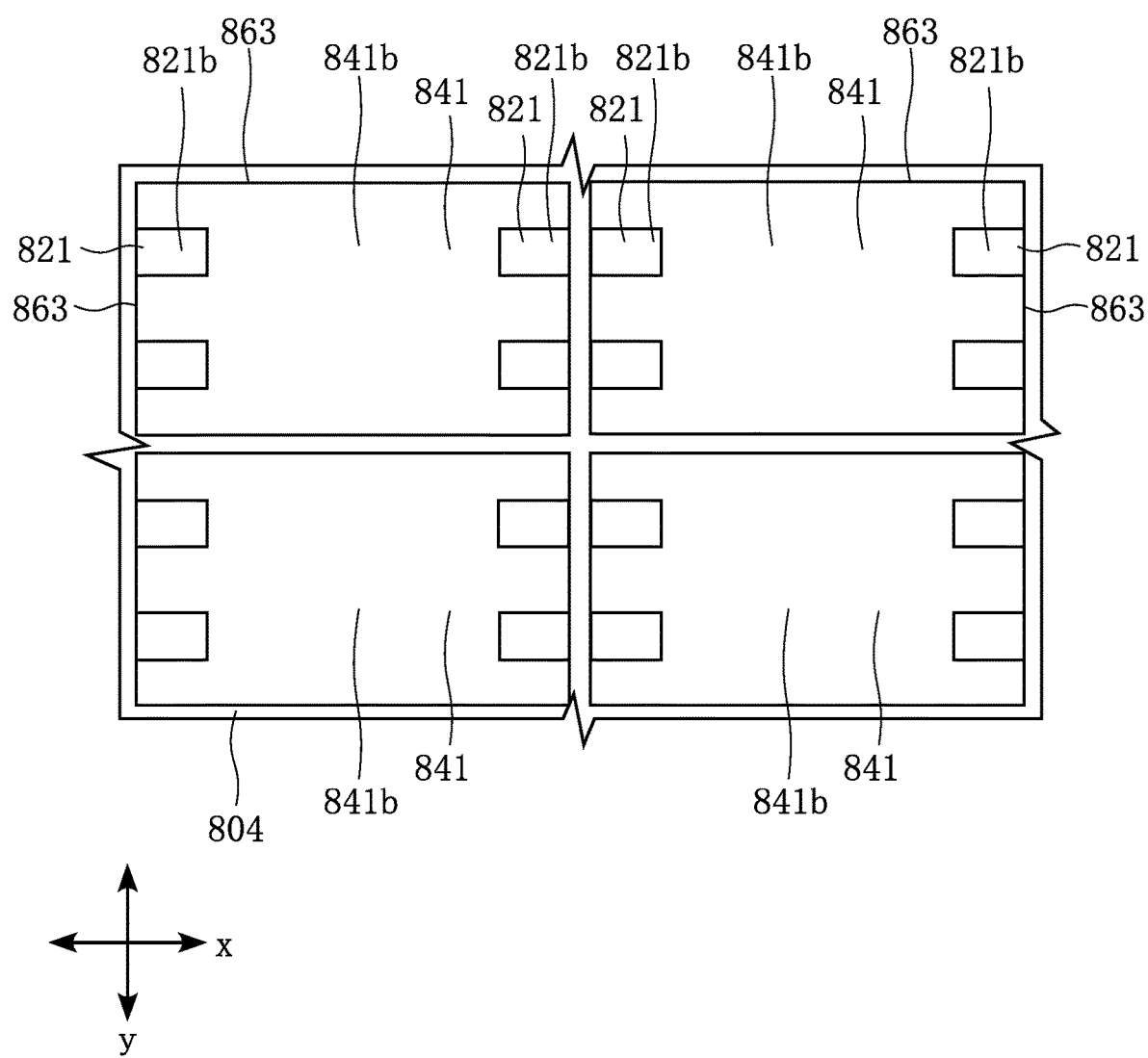
FIG. 30 is a bottom view showing a step of the method for manufacturing the semiconductor device in FIG. 1.

Next, as shown in FIGS. 29 and 30, the sealing resin 86 is cut along the x and y directions so as to be divided into a plurality of pieces that respectively include the semiconductor elements 81. The step of cutting the sealing resin 86 (cutting step) is performed by blade dicing. In the present embodiment, the cutting is performed along the cut line CL shown in FIGS. 27 and 28 to obtain the plurality of pieces respectively including the semiconductor elements 81. Regarding the cut line CL shown in FIGS. 27 and 28, the width in the lateral direction is the thickness of the dicing blade. In the cutting step described above, the dicing tape 804 is not completely cut in the z direction (although it is cut slightly), as shown in FIG. 27. In this way, after the sealing resin 86 is cut into pieces respectively including the semiconductor elements 81, these pieces are connected via the dicing tape 804 and thus do not fall apart. As a result of the cutting step, resin side surfaces 863 of the sealing resin 86, end surfaces 821c of the wiring layers 821, and exposed side surfaces 822c of the columnar portions 822 are formed, as shown in FIG. 29. These surface are exposed to the outside.

Figure 31:
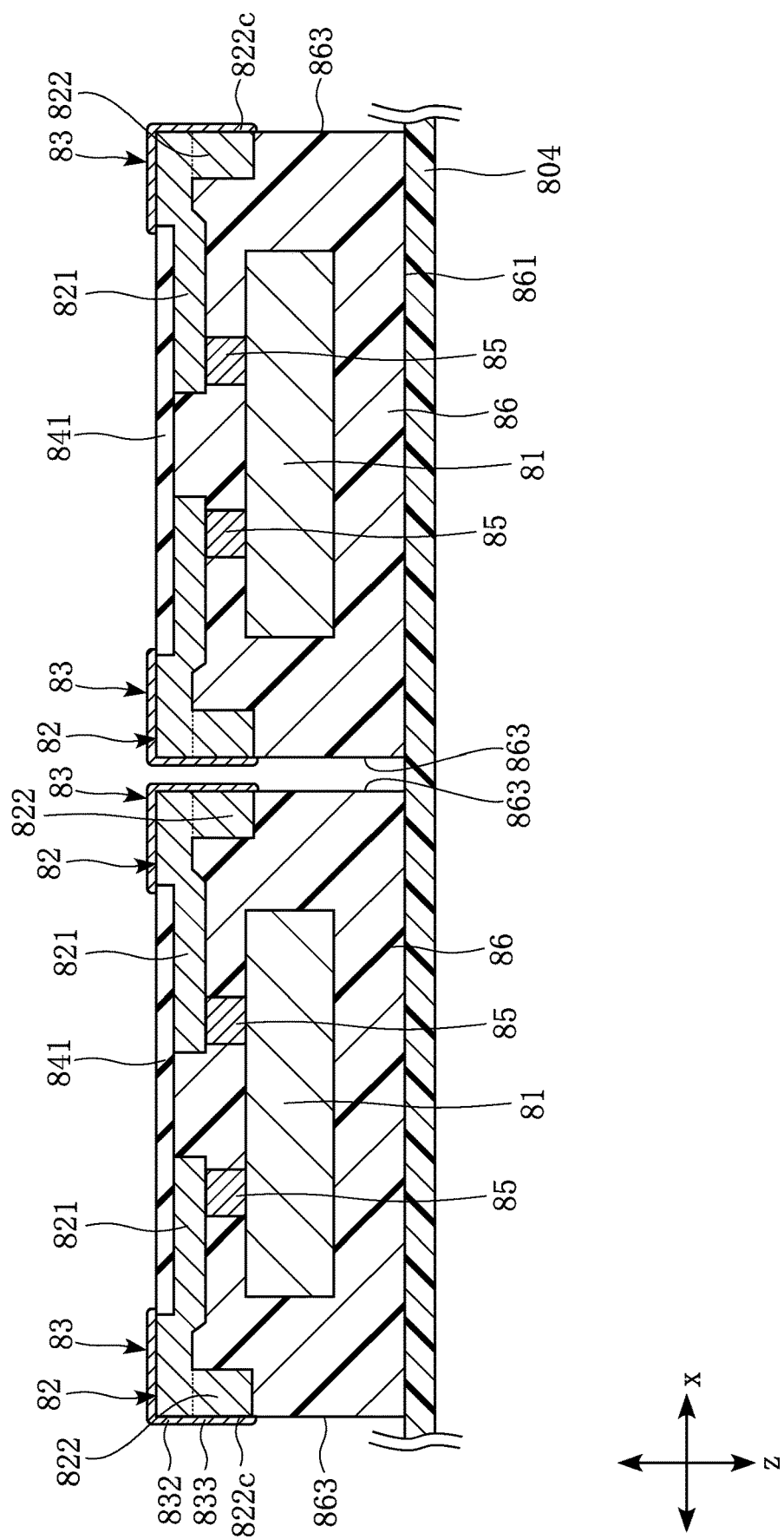
FIG. 31 is a sectional view showing a step of the method for manufacturing the semiconductor device in FIG. 1.
Figure 32:
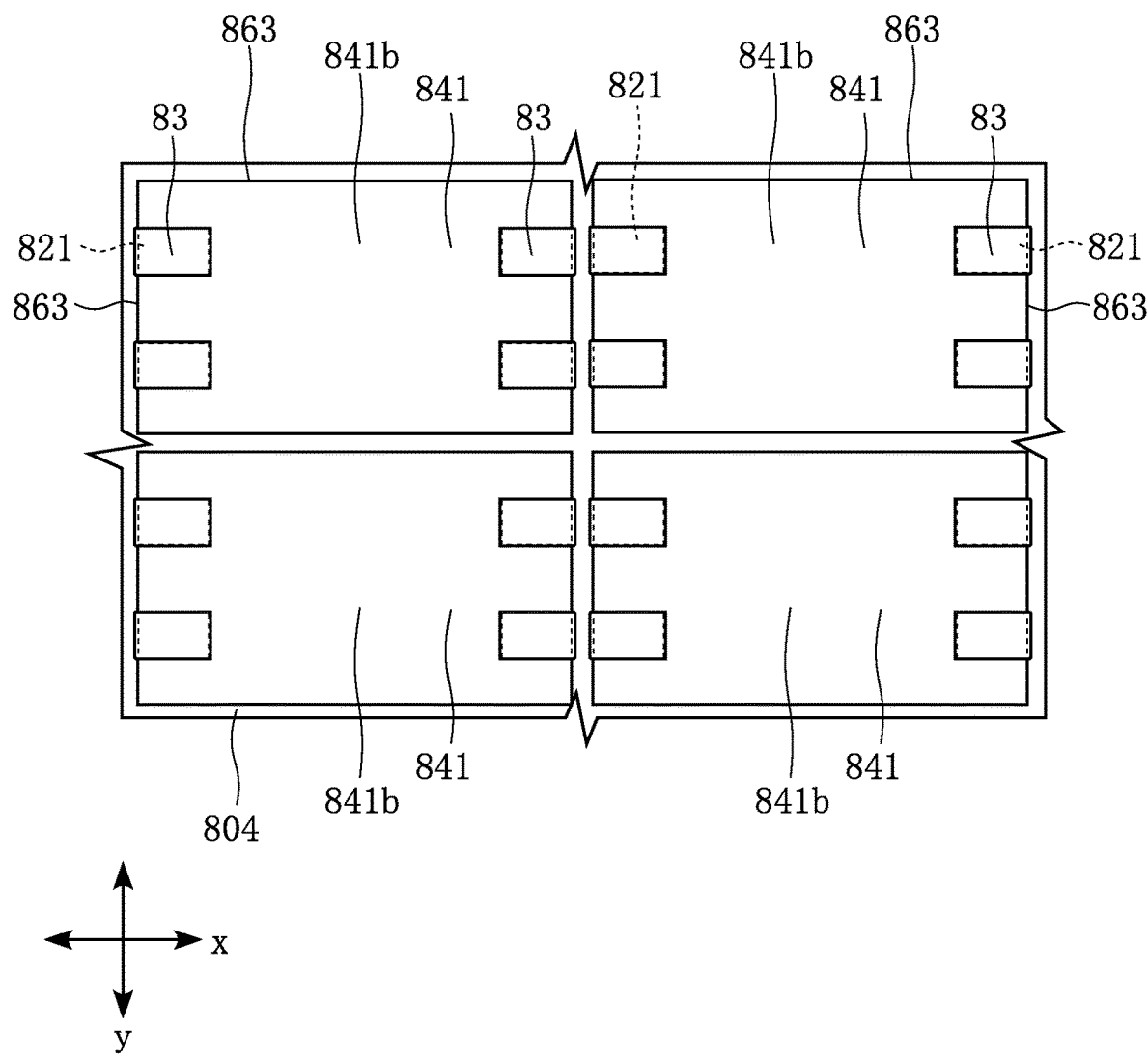
FIG. 32 is a bottom view showing a step of the method for manufacturing the semiconductor device in FIG. 1.

Next, as shown in FIGS. 31 and 32, external electrodes 83 are formed (external electrode formation step). The external electrodes 83 correspond to the external electrodes 3 of the semiconductor device A1. The external electrode formation step is performed through electroless plating. In the present embodiment, a Ni layer, a Pd layer, and a Au layer are deposited in the stated order by electroless plating. In this deposition process, the Ni layer is formed to be in contact with and cover the surfaces of the wiring layers 821 and the surfaces of the columnar portions 822 that are respectively exposed from the insulating films 841 and the sealing resin 86. Next, the Pd layer is formed on the Ni layer, and then the Au layer is formed on the Pd layer. Note that the external electrodes 83 are not deposited on the insulating films 841. As a result, the external electrodes 83 are formed as shown in FIGS. 31 and 32.

Next, the dicing tape 804 is peeled off. The semiconductor device A1 as shown in FIGS. 1 to 6 is manufactured through the above-described steps.

The following describes the advantages of the semiconductor device A1 and the method for manufacturing the semiconductor device A1 according to the first embodiment.

According to the present embodiment, the semiconductor device A1 includes the internal electrode 2 formed by electrolytic plating, and the external electrodes 3 formed by electroless plating. As can be understood, the semiconductor device A1 uses wires formed by plating, and do not use any lead frame formed with a metal plate. The wires formed by plating can be reduced in thickness as compared to the lead frame structure. This allows for thinning of the semiconductor device A1. Furthermore, along with high integration of ICs and LSIs, the number of terminals has increased, and this necessitates miniaturization of internal electrodes and the like. In such a case, using a lead frame limits miniaturization because such a frame is created by processing a metal plate. In the case of the semiconductor device A1, however, the internal electrode 2 is formed by plating to allow miniaturization. This makes it possible to manufacture a semiconductor device having a larger number of terminals.

According to the present embodiment, the internal electrode 2 includes the wiring layers 21 that each have the end surface 213 exposed from the resin side surface 63, and the columnar portion 22 that each have the exposed side surface 223 exposed from the resin side surface 63. The external electrodes 3 each include the first cover portion 31 that covers the exposed side surface 223, and the second cover portion 32 that covers the end surface 213. With such a structure, portions of the external electrodes 3 formed on the side surfaces (side surfaces facing in the x direction in the present embodiment) of the semiconductor device A1 can have a larger dimension in the z direction than in the case where the columnar portions 22 are not provided. The semiconductor device A1 is mounted on a circuit board or the like by using solder. If the internal electrode 2 has no columnar portions 22 and is made up of only the wiring layers 21, portions of the external electrodes 3 formed on the side surfaces of the semiconductor device A1 will simply be the second cover portions 32. In this case, the dimension of the second cover portions 32 alone in the z direction is not large enough to easily form soldering fillets when the semiconductor device A1 is mounted on a circuit board. However, the present embodiment makes it possible to increase the dimension of the external electrodes 3 in the z direction which are formed on the side surfaces of the semiconductor device A1. In this way, solder fillets can be formed when the semiconductor device A1 is mounted on a circuit board or the like. As a result, the mounting strength of the semiconductor device A1 with respect to the circuit board can be enhanced. Furthermore, the connection state of solder can be visually checked from the side surfaces of the semiconductor device A1.

According to the present embodiment, a roughening process is performed during the manufacturing process of the semiconductor device A1. The roughening process causes the wiring-layer front surfaces 211, the top surfaces 222, and the resin abutment side surfaces 224 to be roughened. This structure can enhance the adhesion between the internal electrode 2 and the sealing resin 6.

Figure 33:
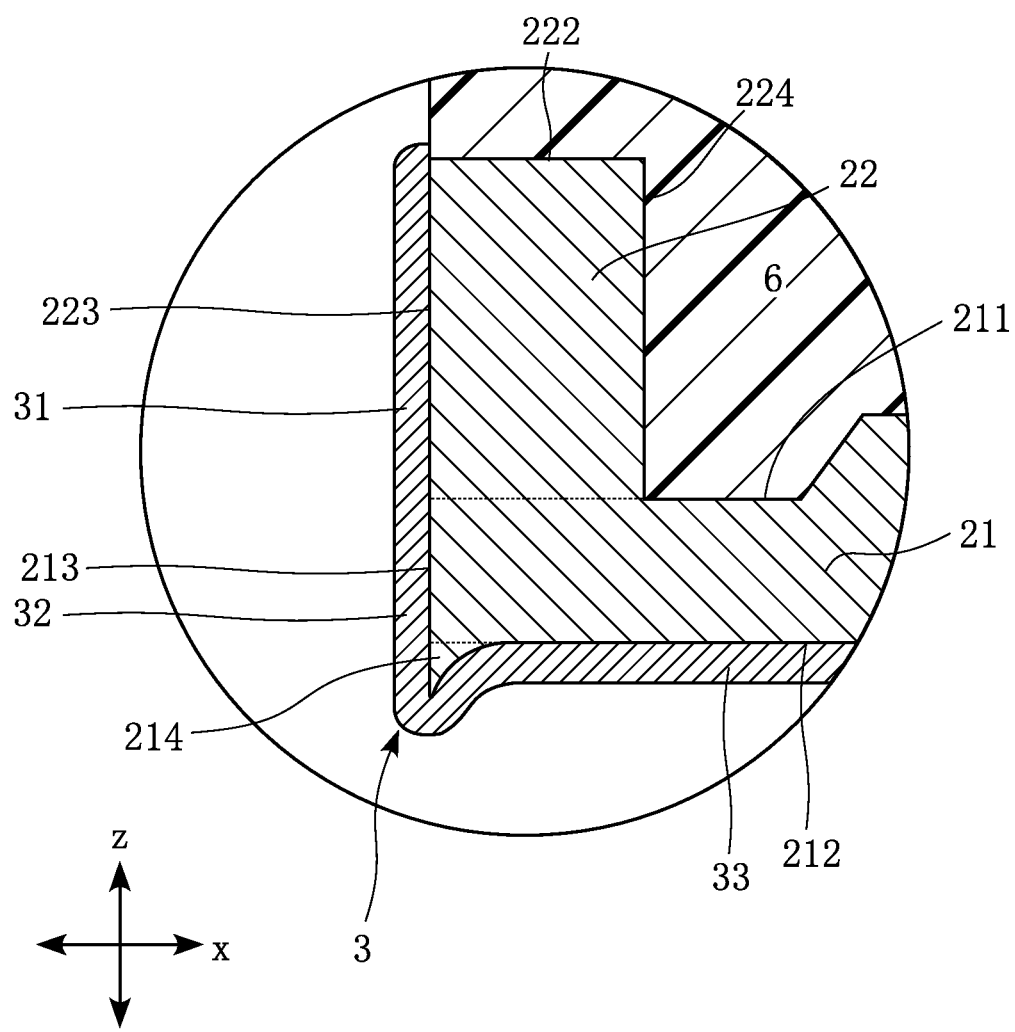
FIG. 33 is a main-part enlarged sectional view showing a semiconductor device according to a variation of the first embodiment.

In the first embodiment, the angle formed between each pair of the wiring-layer back surfaces 212 and the end surfaces 213 is approximately orthogonal. In this case, during the cutting step, a protrusion may be formed at a junction between any pair of the wiring-layer back surfaces 212 and the end surfaces 213. FIG. 33 shows a main-part enlarged sectional view when such a protrusion is created. FIG. 33 corresponds to the main-part enlarged sectional view in FIG. 5. In FIG. 33, a protrusion 214 protrudes from the wiring-layer back surface 212 of the wiring layer 21 in the z direction. In this case, the external electrode 3 is formed to cover the protrusion 214. The protrusion 214 may have a shape other than the one shown in FIG. 33. For example, the protrusion 214 may protrude in a direction other than the z direction, such as the x direction or the y direction.

In the first embodiment, only the external electrodes 3 are exposed from the insulating film 41 when the semiconductor device A1 is viewed from the bottom surface (see FIG. 2). However, other elements, such as a portion of the resin back surface 62, may be exposed from the insulating film 41.

The following describes other embodiments relating to the semiconductor device of the present disclosure and the method for manufacturing the semiconductor device. Note that in the following embodiments, elements that are the same as or similar to the elements in the first embodiment are provided with the same reference signs, and the descriptions thereof are omitted.

Second Embodiment

Figure 34:
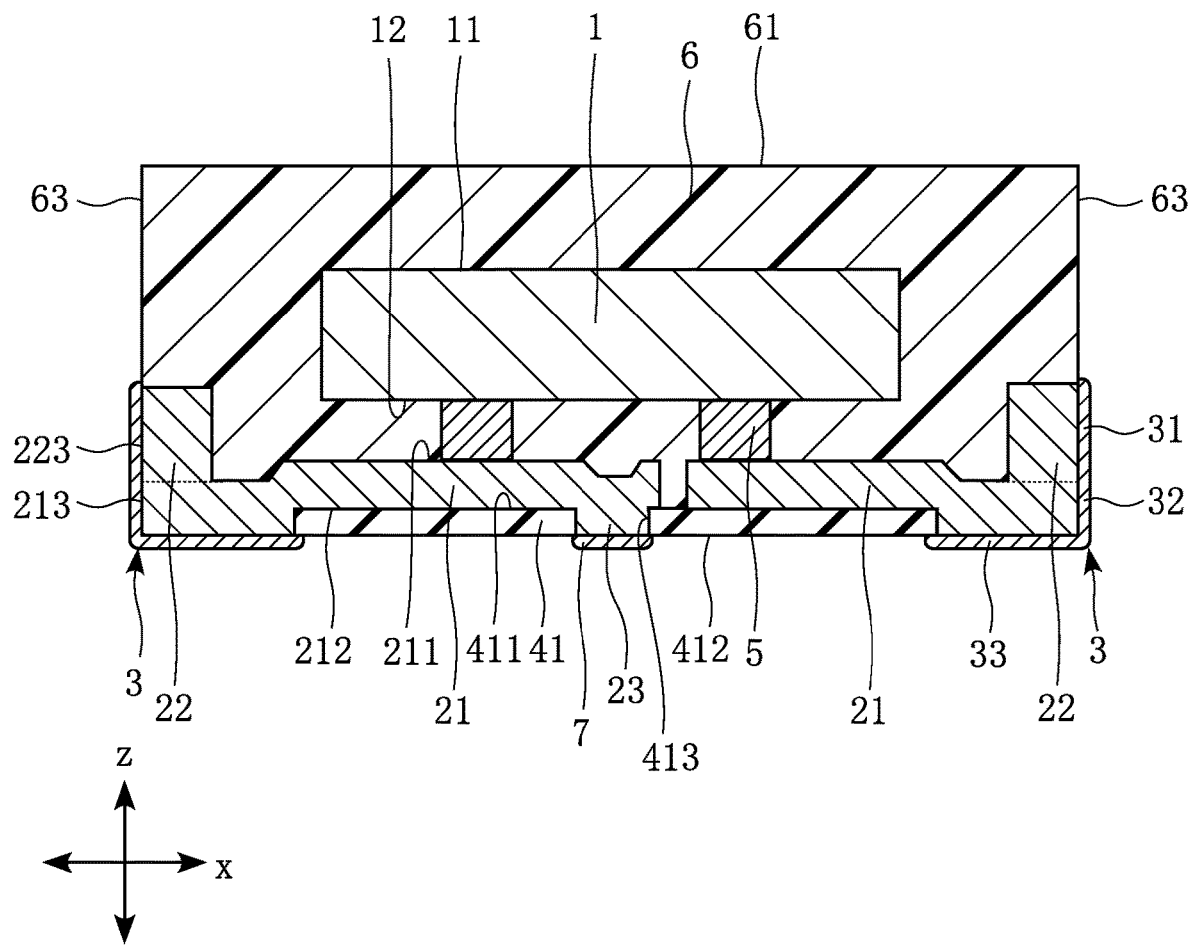
FIG. 34 is a sectional view showing a semiconductor device according to a second embodiment.

FIG. 34 shows a semiconductor device according to a second embodiment. A semiconductor device A2 according to the present embodiment differs from the semiconductor device A1 (first embodiment) in further including a metal layer 7.

FIG. 34 is a sectional view showing the semiconductor device A2. The cross-section shown in FIG. 34 corresponds to the cross-section shown in FIG. 4 for the first embodiment.

In the present embodiment the insulating film 41 has an opening 413. The opening 413 continues from the insulating film front surface 411 to the insulating film back surface 412 in the z direction. The opening 413 is rectangular in plan view, but may have any other shape in other embodiments. The opening 413 is formed by patterning in the insulating film formation step described above.

In the present embodiment, the internal electrode 2 further includes a filler portion 23. The filler portion 23 is a portion of the internal electrode 2 that fills the opening 413 of the insulating film 41. The filler portion 23 is formed in the wiring layer formation step described above.

The metal layer 7 is made of a conductive metal material. In the present embodiment, the metal layer 7 is formed by electroless plating as in the external electrodes 3. Accordingly, the metal layer 7 is composed of a Ni layer, a Pd layer, and a Au layer that are mutually laminated. Note that the material and forming method of the metal layer 7 are not limited to those described above. The metal layer 7 is in contact with the filler portion 23 and exposed to the outside of the semiconductor device A2.

The semiconductor device A2 also uses wires formed by plating, and can therefore achieve the same effect as in the first embodiment. That is, the semiconductor device A2 can be made thinner.

According to the present embodiment, the semiconductor device A2 includes the metal layer 7. When the semiconductor device A2 is energized, the semiconductor element 1 generates heat. The heat generated from the semiconductor element 1 is transferred to the metal layer 7 and released to the outside. Accordingly, the metal layer 7 functions as a heat dissipator in the semiconductor device A2. Such a structure can improve the heat dissipation of the semiconductor device A2. The metal layer 7 is made of metal and has conductivity. Accordingly, the metal layer 7 can also be used as a terminal for external connection.

According to the present embodiment, the metal layer 7 is formed by electroless plating as in the external electrodes 3. Accordingly, the external electrodes 3 and the metal layer 7 can be formed at the same time.

Third Embodiment

Figure 35:
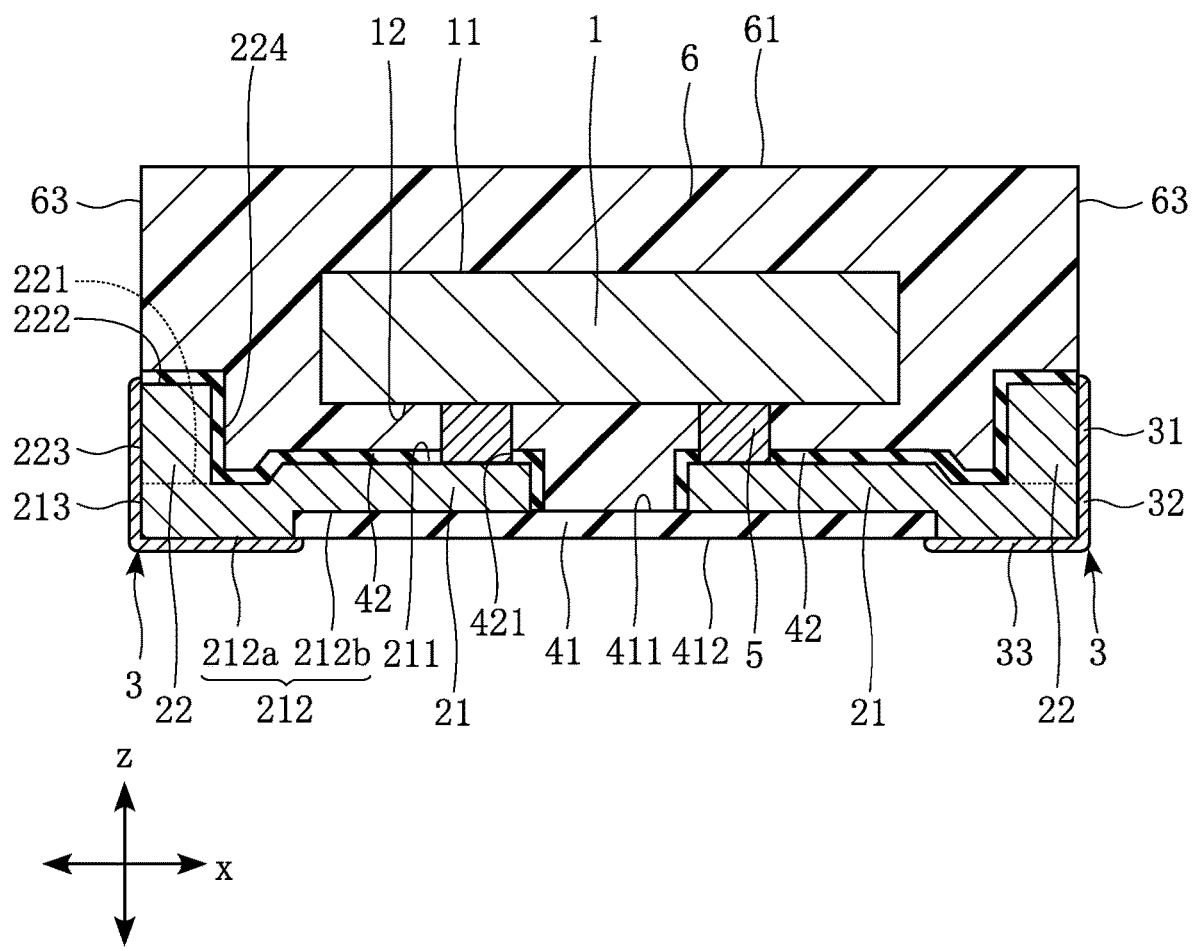
FIG. 35 is a sectional view showing a semiconductor device according to a third embodiment.

FIG. 35 shows a semiconductor device according to a third embodiment. A semiconductor device A3 according to the present embodiment differs from the semiconductor device A1 (first embodiment) in further including an insulating film 42.

FIG. 35 is a sectional view showing the semiconductor device A3. The cross-section shown in FIG. 35 corresponds to the cross-section shown in FIG. 4 for the first embodiment.

The insulating film 42 is made of an insulating material, such as a polyimide resin. The insulating film 42 is sandwiched between the internal electrode 2 and the sealing resin 6. The insulating film 42 may be formed by photolithography. The insulating film 42 is formed after the roughening process and before the semiconductor element mounting step. This means that the insulating film 42 is formed after the conductive bonding members 5 (85) are formed. Accordingly, the insulating film 42 has through-holes 421 filled with the conductive bonding members 5. The insulating film 42 corresponds to the "second insulating film" in the claims.

The semiconductor device A3 also uses wires formed by plating, and can therefore achieve the same effect as in the first embodiment. That is, the semiconductor device A3 can be made thinner.

In the present embodiment, the insulating film 42 has the through-holes 421, and portions of the conductive bonding members 5 fill the through-holes 421. The conductive bonding members 85 are softened by reflow in the semiconductor element mounting step. In this process, the softened conductive bonding members 85 may spread along the wiring-layer front surfaces 211. However, in the present embodiment, the wiring-layer front surfaces 211 are covered with the insulating film 42. This prevents the conductive bonding members 5 (85) from spreading along the wiring-layer front surfaces 211.

Fourth Embodiment

Figure 36:
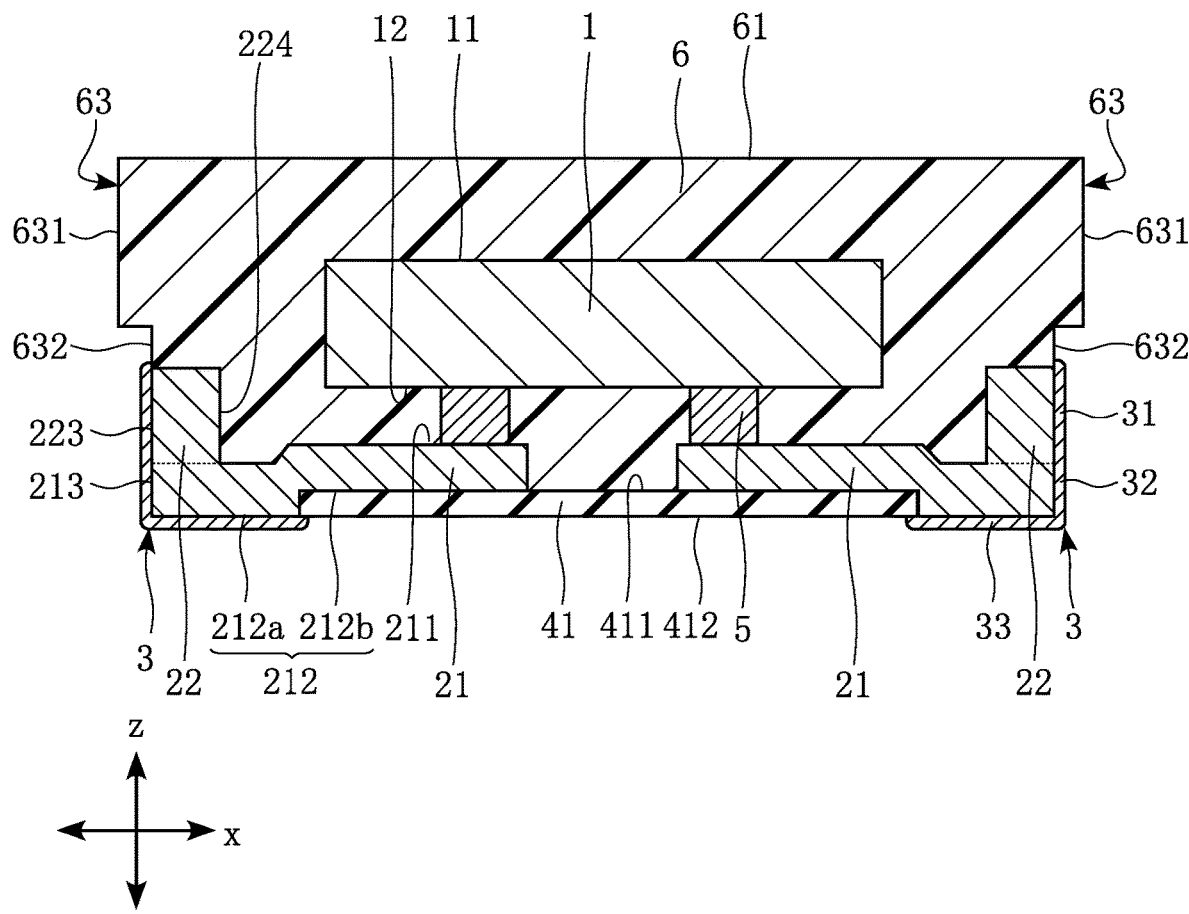
FIG. 36 is a sectional view showing a semiconductor device according to a fourth embodiment.

FIG. 36 shows a semiconductor device according to a fourth embodiment. A semiconductor device A4 according to the present embodiment differs from the semiconductor device A1 (first embodiment) in that the resin side surfaces 63 of the sealing resin 6 have dents.

FIG. 36 is a sectional view showing the semiconductor device A4. The cross-section shown in FIG. 36 corresponds to the cross-section shown in FIG. 4 for the first embodiment.

In the present embodiment, each of the resin side surfaces 63 includes a resin side surface first portion 631 and a resin side surface second portion 632, as shown in FIG. 36. The resin side surface first portion 631 and the resin side surface second portion 632 are both flat. The resin side surface first portion 631 is arranged more outward than the resin side surface second portion 632 in plan view. The resin side surface second portion 632 is flush with the exposed side surface 223 of the columnar portion 22 and the end surface 213 of the wiring layer 21.

Figure 37:
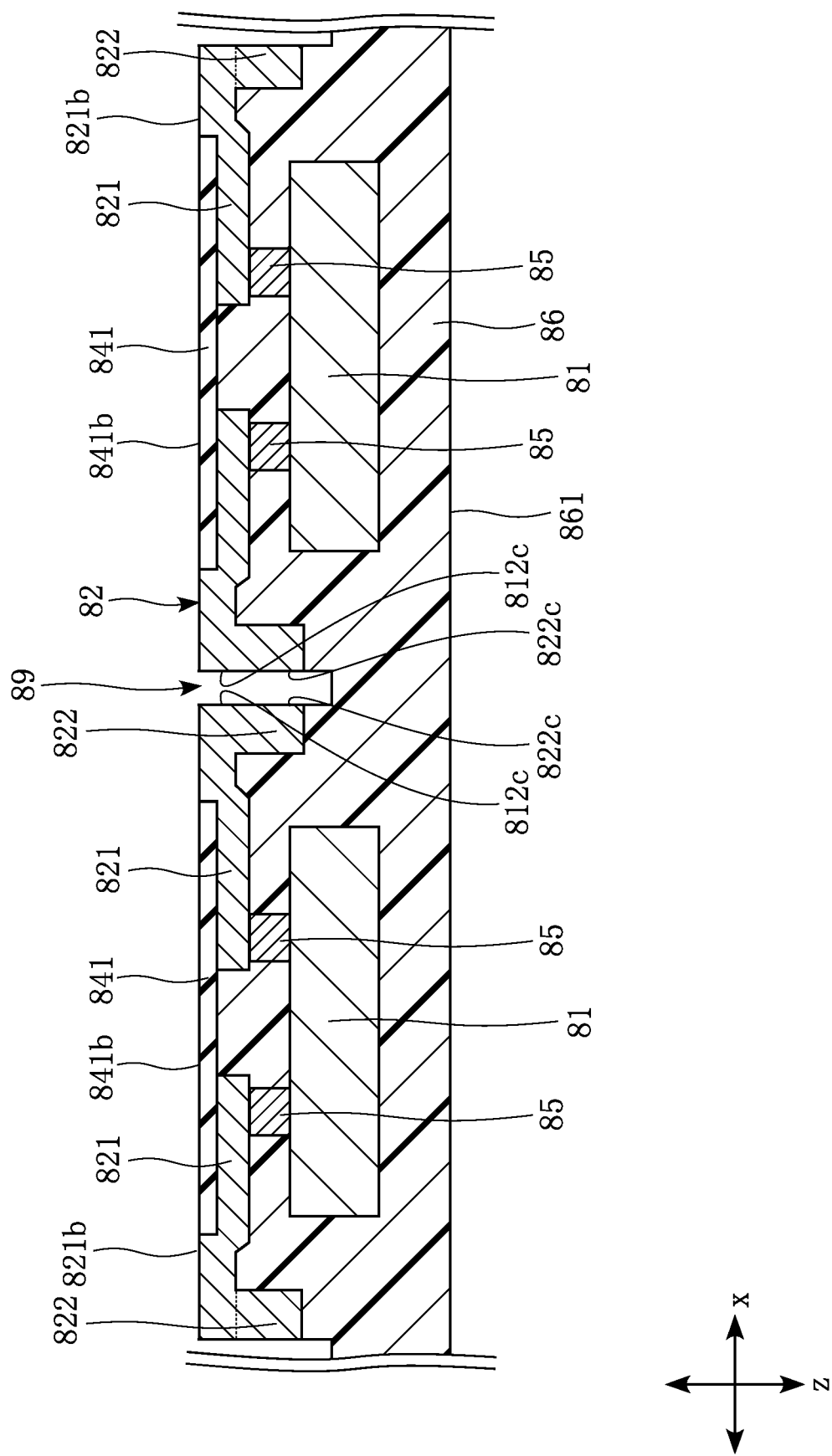
FIG. 37 is a sectional view showing a step of a method for manufacturing the semiconductor device in FIG. 36.
Figure 38:
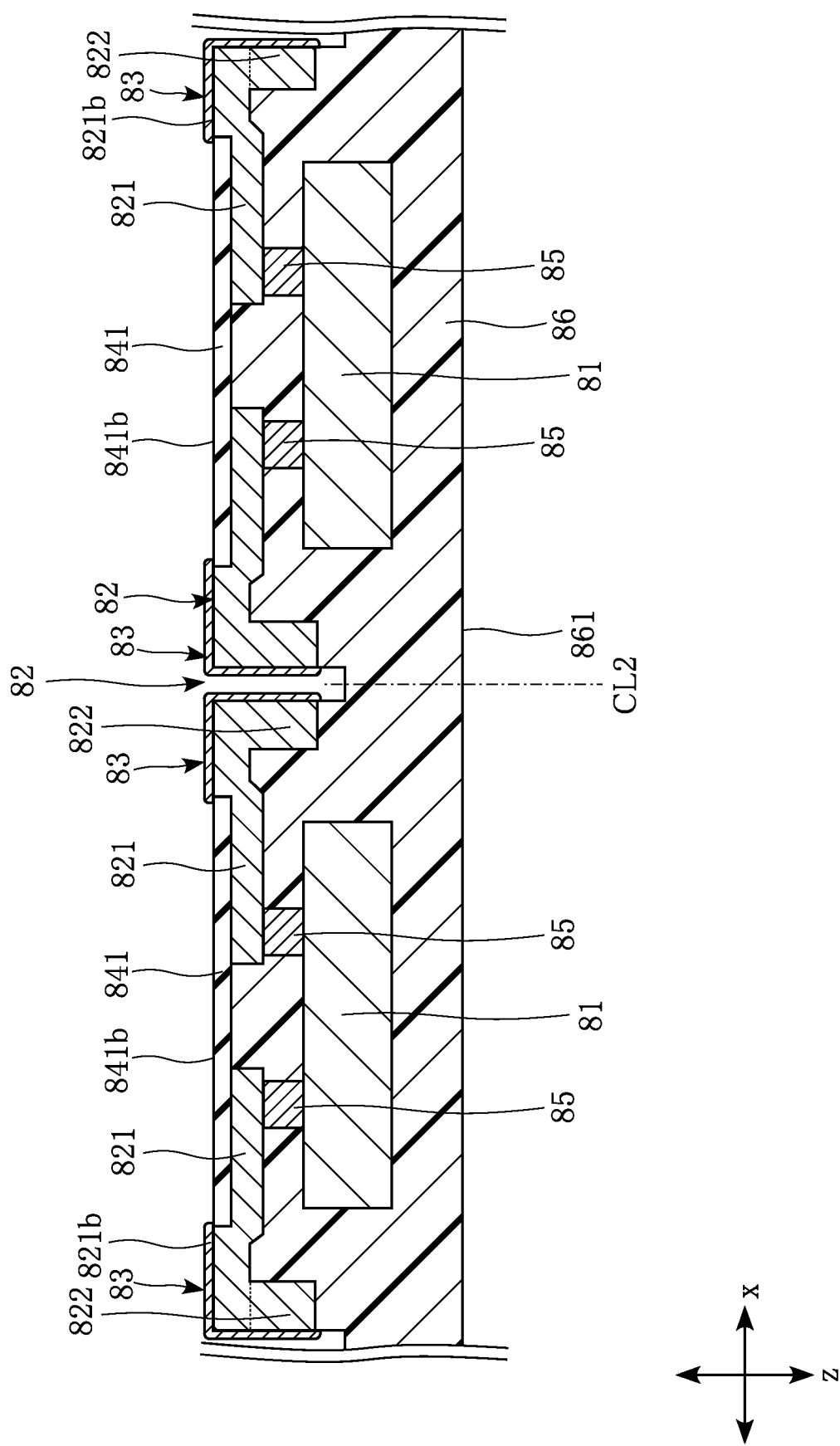
FIG. 38 is a sectional view showing a step of the method for manufacturing the semiconductor device in FIG. 36.

The following describes an example of a method for manufacturing the semiconductor device A4, with reference to FIGS. 37 and 38. Note that descriptions of steps that are the same as those in the manufacturing method of the semiconductor device A1 according to the first embodiment are omitted. FIGS. 37 and 38 are sectional views showing steps of manufacturing the semiconductor device A4.

In the method for manufacturing the semiconductor device A4, steps from the support substrate preparation step (see FIG. 7) through the sputter film removal step (see FIGS. 27 and 28) are performed in the same manner as in the first embodiment. Note that in the present embodiment, it is not necessary to attach the dicing tape 804 in the support substrate peeling step. Subsequently, grooves 89 are formed as shown in FIG. 37. The step of forming the grooves 89 may be performed through half-cut dicing using a dicing blade. In the half-cut dicing, the sealing resin 86 is not completely cut in the z direction so as to form the grooves 89. The depth of the grooves 89 is determined by the cut amount during the half-cut dicing, and the width of the grooves 89 is determined by the thickness of the dicing blade. As shown in FIG. 37, the end surfaces 821c of the wiring layers 821 and the exposed side surfaces 822c of the columnar portions 822, which are exposed from the sealing resin 86, are formed by half-cut dicing.

Next, as shown in FIG. 38, the external electrodes 83 are formed. The external electrode formation step is performed through electroless plating in the same manner as in the first embodiment. As a result, the external electrodes 83 are formed to cover the respective surfaces of the wiring layers 821 and the columnar portions 822 that are exposed from the sealing resin 86. Thereafter, the sealing resin 86 is cut along the cut line CL2 shown in FIG. 38 so as to be divided into a plurality of pieces that respectively include the semiconductor elements 81. The dicing blade used when cutting along the cut line CL2 is thinner than the dicing blade used during the half-cut dicing described above. The semiconductor device A4 as shown in FIG. 36 is manufactured through the above-described steps. That is, the semiconductor device A4 is manufactured to include the resin side surfaces 63 of the sealing resin 6 that have dents.

The semiconductor device A4 also uses wires formed by plating, and can therefore achieve the same effect as in the first embodiment. That is, the semiconductor device A4 can be made thinner.

According to the present embodiment, the dicing tape 804 is not attached in the support substrate peeling step. In the cutting step according to the first embodiment, the sealing resin 86 is completely cut along the z direction. Accordingly, it is necessary to use the dicing tape 804 to hold the individual pieces together for the external electrode formation step (electroless plating). In the present embodiment, on the other hand, the pieces of the sealing resin 86 are continuous and do not fall apart even without the dicing tape 804 during the external electrode formation step. Accordingly, the dicing tape 804 is not necessary in the method for manufacturing the semiconductor device A4.

Figure 39:
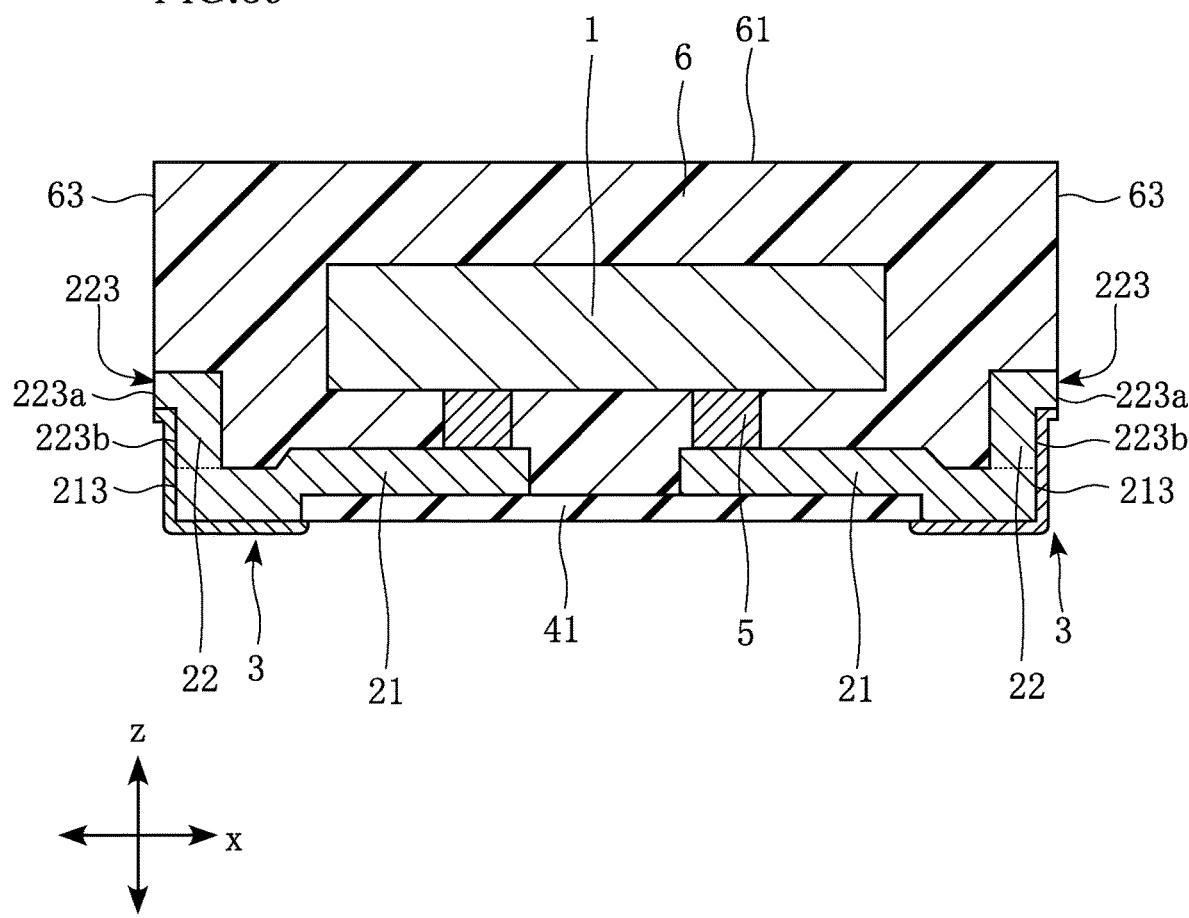
FIG. 39 is a sectional view showing a semiconductor device according to a variation of the fourth embodiment.

In the fourth embodiment, the resin side surfaces 63 have dents. Alternatively, the exposed side surfaces 223 of the columnar portions 22 may have dents. FIG. 39 shows the case where the exposed side surfaces 223 have dents. FIG. 39 is a sectional view showing a semiconductor device according to such a variation as described above, and corresponds to FIG. 36.

In the variation, each of the exposed side surfaces 223 includes an exposed side surface first portion 223a and an exposed side surface second portion 223b. The exposed side surface first portion 223a and the exposed side surface second portion 223b are both flat. The exposed side surface first portion 223a is arranged more outward than the exposed side surface second portion 223b in plan view. The exposed side surface first portion 223a is flush with the resin side surface 63. The exposed side surface second portion 223b is flush with the end surface 213 of the wiring layer 21. As shown in FIG. 39, the exposed side surface first portion 223a is not covered with the external electrode 3, whereas the exposed side surface second portion 223b is covered with the external electrode 3.

According to the present variation, the exposed side surface 223 is created by forming a shallower groove 89 (see FIG. 37) during the half-cut dicing. In other words, the amount of cut during the half-cut dicing is reduced so as not to completely cut the columnar portion 822 in the z direction. In this way, after the sealing resin 6 (86) is cut into pieces respectively including the semiconductor elements 1 (81), the exposed side surfaces 223 that each include the exposed side surface first portion 223a and the exposed side surface second portion 223b are formed.

Fifth Embodiment

Figure 40:
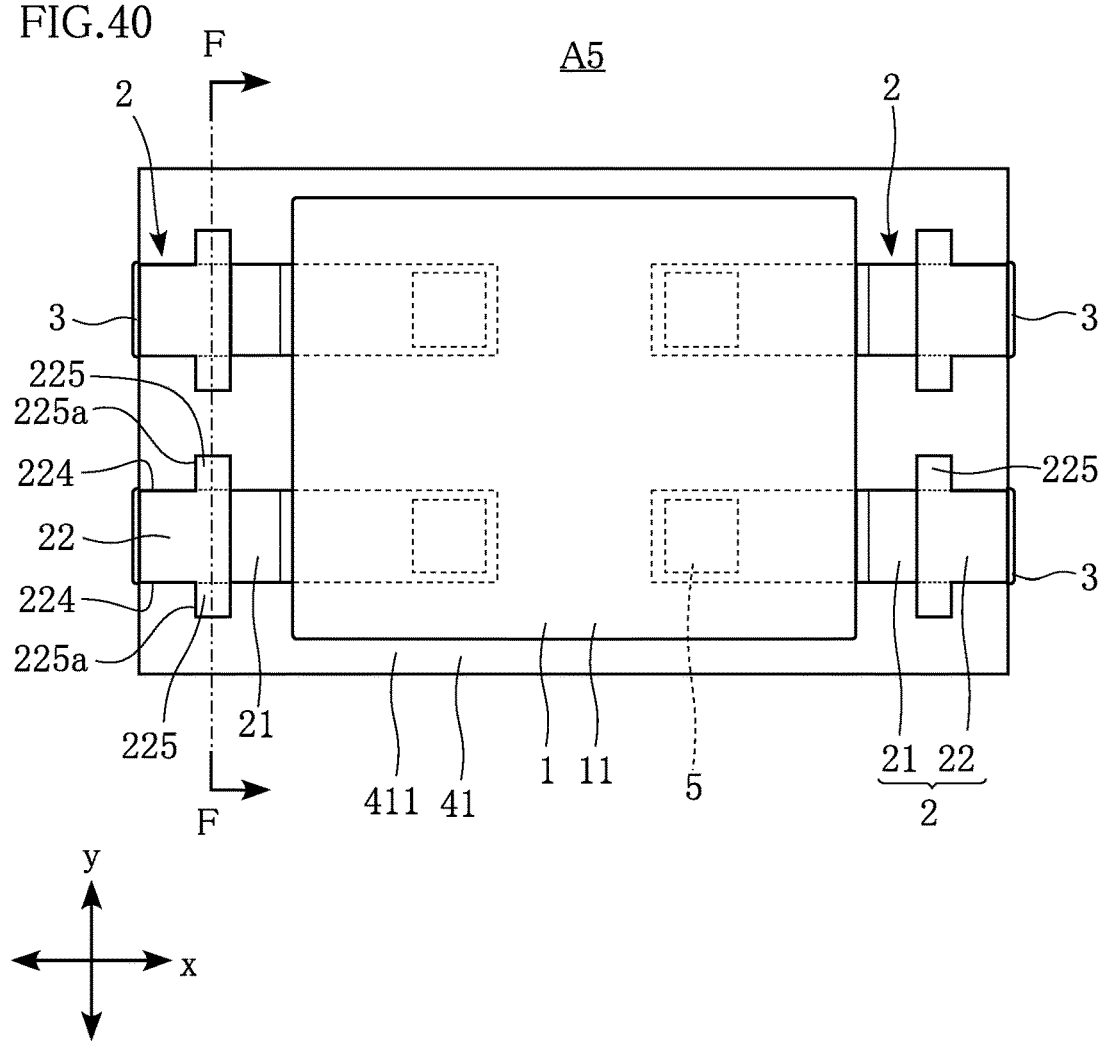
FIG. 40 is a plan view showing a semiconductor device according to a fifth embodiment.
Figure 41:
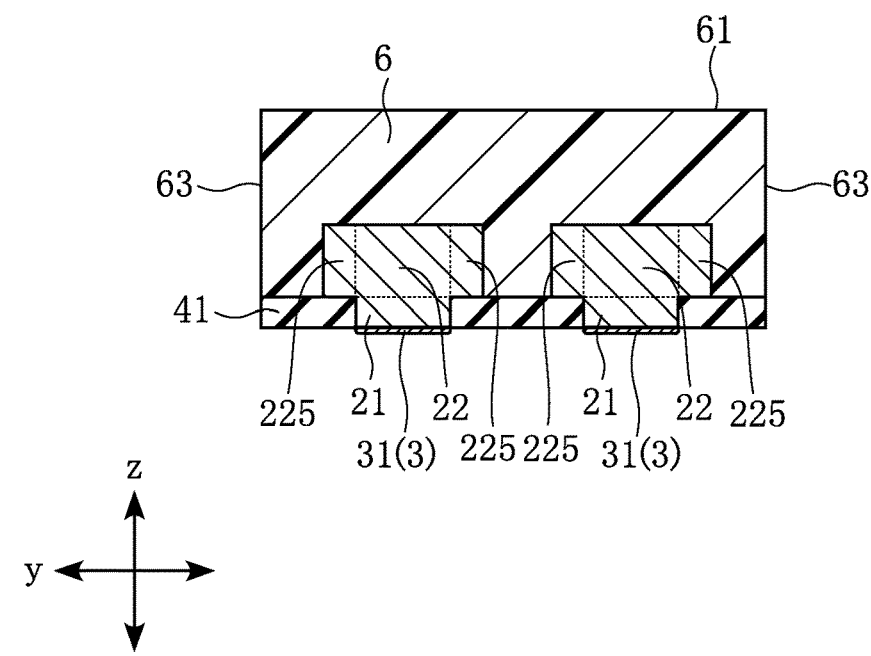
FIG. 41 is a sectional view along line F-F in FIG. 40.

FIGS. 40 and 41 show a semiconductor device according to a fifth embodiment. A semiconductor device A5 according to the present embodiment differs from the semiconductor device A1 (first embodiment) in that the columnar portions 22 include protrusions 225.

FIG. 40 is a plan view showing the semiconductor device A5. FIG. 40 omits the sealing resin 6. FIG. 41 is a sectional view along line F-F in FIG. 40.

As shown in FIG. 40, the columnar portions 22 include the protrusions 225. The protrusions 225 protrude from the respective resin abutment side surfaces 224 facing in the y direction in plan view. As shown in FIG. 40, two protrusions 225 protrude from two respective resin abutment side surfaces 224 facing in the y direction. Each of the protrusions 225 has an engagement surface 225a.

The engagement surface 225a protrudes from the resin abutment side surface 224. The engagement surface 225a and the resin abutment side surface 224 form a right angle. In other words, the engagement surface 225a is orthogonal to the resin abutment side surface 224. Note that the engagement surface 225a may be inclined to the resin abutment side surface 224. The engagement surface 225a faces outward in the x direction in plan view. Accordingly, the engagement surface 225a is parallel to a y-z plane. The engagement surface 225a is in contact with the sealing resin 6. In the x direction, the sealing resin 6 is interposed between the engagement surface 225a and the resin side surface 63.

The semiconductor device A5 also uses wires formed by plating, and can therefore achieve the same effect as in the first embodiment. That is, the semiconductor device A5 can be made thinner.

According to the present embodiment, the columnar portions 22 include the protrusions 225. The protrusions 225 have the engagement surfaces 225a. Each of the engagement surfaces 225a protrudes from the resin abutment side surface 224 and is in contact with the sealing resin 6. With such a structure, even if a stress is applied to the internal electrode 2 outward in the x direction, the engagement surface 225a is caught by the sealing resin 6. Accordingly, the semiconductor device A5 prevents the internal electrode 2 from slipping out in the x direction.

Sixth Embodiment

Figure 42:
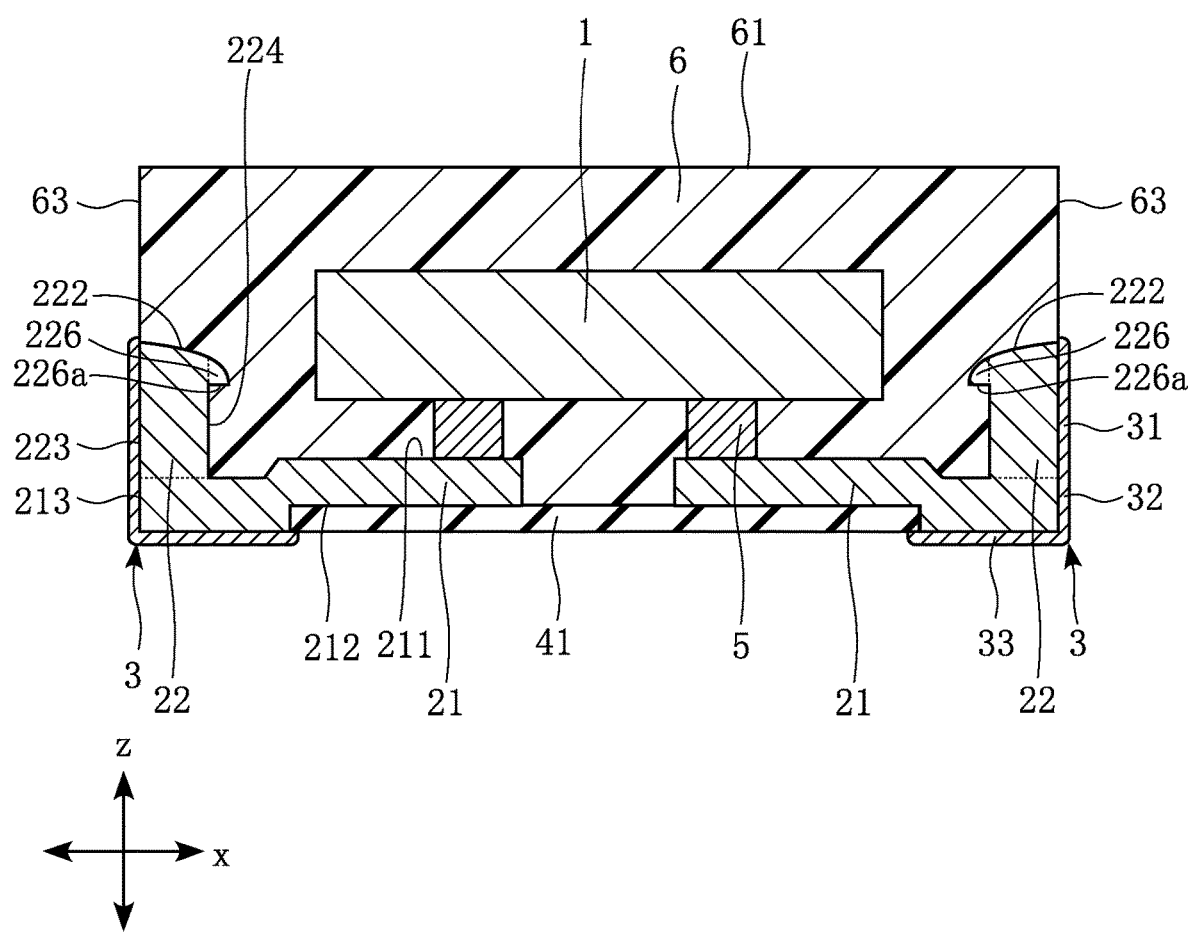
FIG. 42 is a sectional view showing a semiconductor device according to a sixth embodiment.

FIG. 42 shows a semiconductor device according to a sixth embodiment. A semiconductor device A6 according to the present embodiment differs from the semiconductor device A1 (first embodiment) in that the columnar portions 22 include protrusions 226.

FIG. 42 is a sectional view showing a semiconductor device A6. The cross-section shown in FIG. 42 corresponds to the cross-section shown in FIG. 4 for the first embodiment.

In the present embodiment, the top surfaces 222 of the columnar portions 22 are curved as shown in FIG. 42. The columnar portions 22 include protrusions 226 as shown in FIG. 42. The protrusions 226 protrude from the respective resin abutment side surfaces 224 in plan view. Each of the protrusions 226 has an engagement surface 226a.

The engagement surface 226a protrudes from the resin abutment side surface 224. The engagement surface 226a and the resin abutment side surface 224 form a right angle. In other words, the engagement surface 226a is orthogonal to the resin abutment side surface 224. Note that the engagement surface 226a may be inclined to the resin abutment side surface 224. The engagement surface 226a faces downward in the z direction (downward in FIG. 42). Accordingly, the engagement surface 226a is parallel to a x-y plane. The engagement surface 226a is in contact with the sealing resin 6.

Figure 43:
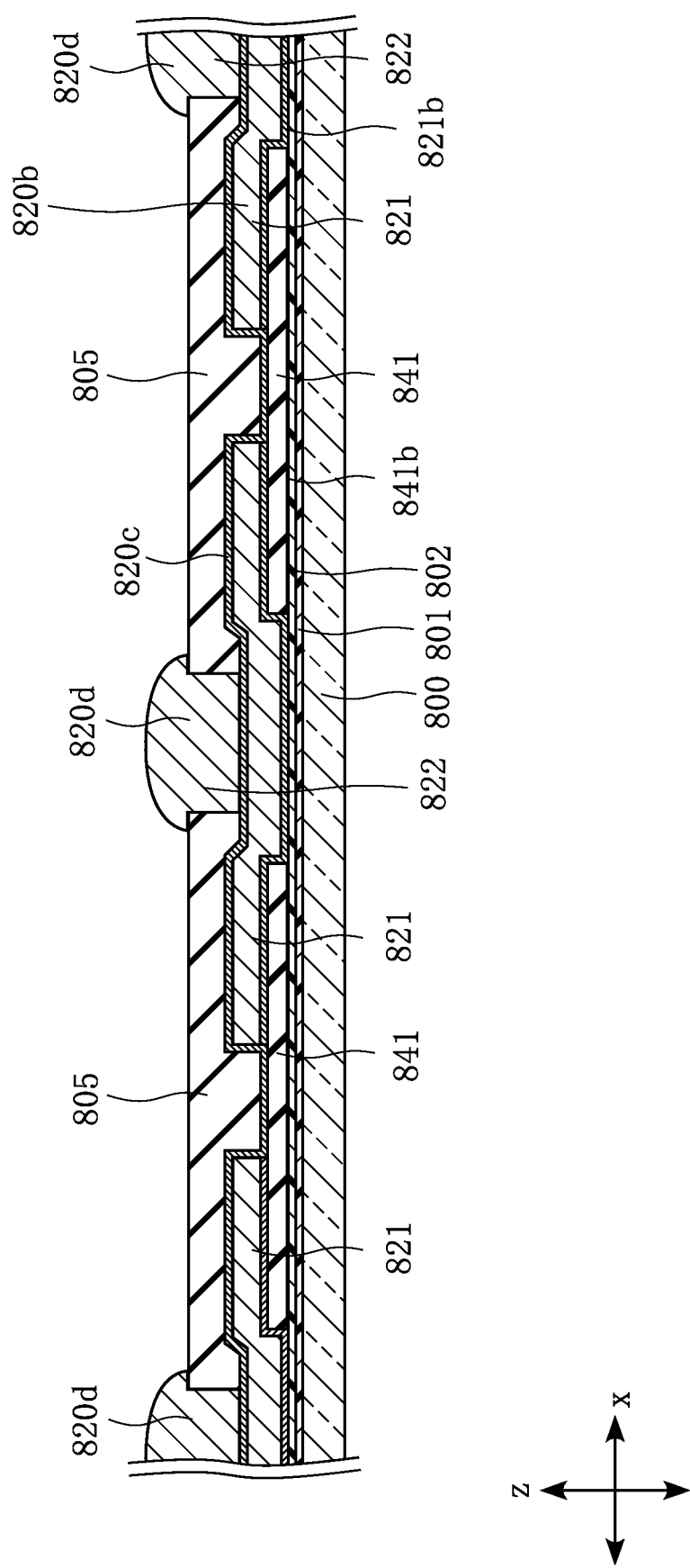
FIG. 43 is a sectional view showing a step of a method for manufacturing the semiconductor device in FIG. 42.

FIG. 43 is a diagram for explaining a method for forming the protrusions 226. FIG. 43 shows a succeeding plating layer formation step of the manufacturing method according to the present embodiment.

In the succeeding plating layer formation step, a resist layer 805 is patterned by photolithography in areas other than the areas on which the plating layers 820d are to be formed, in the same manner as in the first embodiment. Thereafter, the plating layers 820d are laminated by electrolytic plating. In this process, the electrolytic plating is continued until thickness of each of the plating layers exceeds the thickness of the patterned resist layer 805, so that the plating layers 820d grow along the top surface of the resist layer 805. Then, the resist layer 805 is removed to thereby form the protrusions 226 of the columnar portions 22.

The semiconductor device A6 also uses wires formed by plating, and can therefore achieve the same effect as in the first embodiment. That is, the semiconductor device A6 can be made thinner.

According to the present embodiment, the columnar portions 22 include the protrusions 226. The protrusions 226 have the engagement surfaces 226a. Each of the engagement surfaces 226a protrudes from the resin abutment side surface 224 and is in contact with the sealing resin 6. With such a structure, even if a stress is applied to the internal electrode 2 outward in the z direction, the engagement surface 226a is caught by the sealing resin 6. Accordingly, the semiconductor device A6 prevents the internal electrode 2 from slipping out in the z direction.

Figure 44:
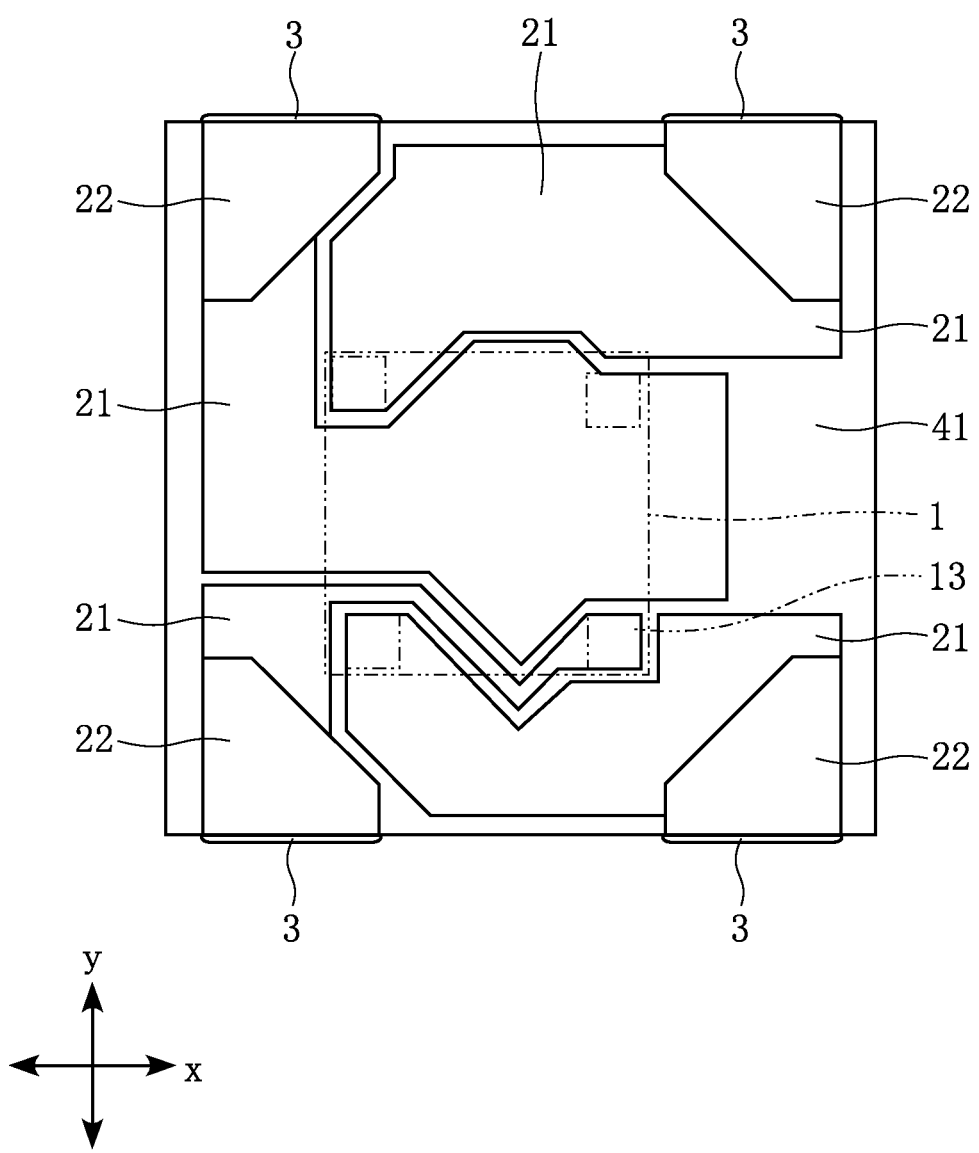
FIG. 44 is a plan view showing a semiconductor device according to a variation.
Figure 45:
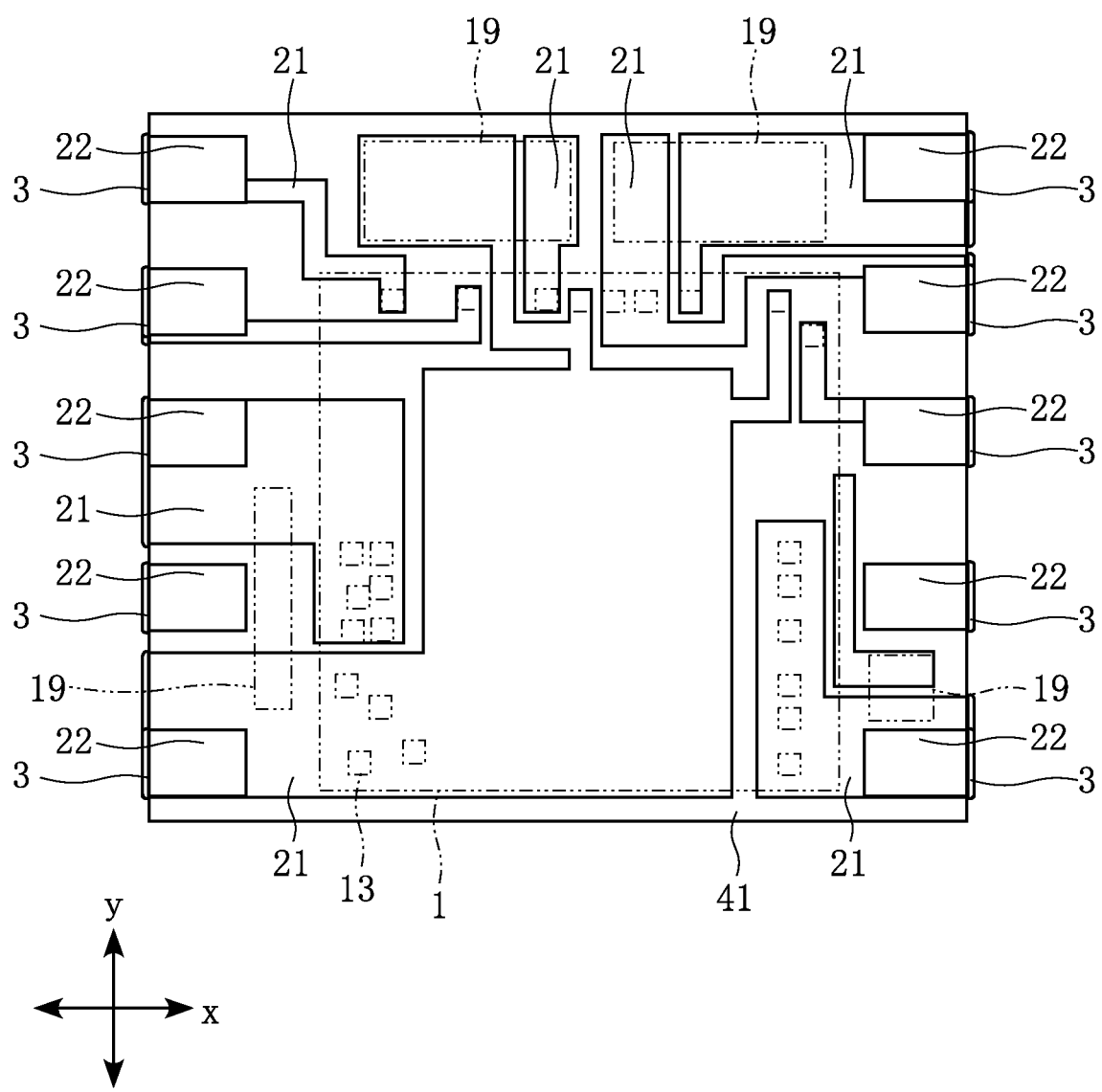
FIG. 45 is a plan view showing a semiconductor device according to a variation.
Figure 46:
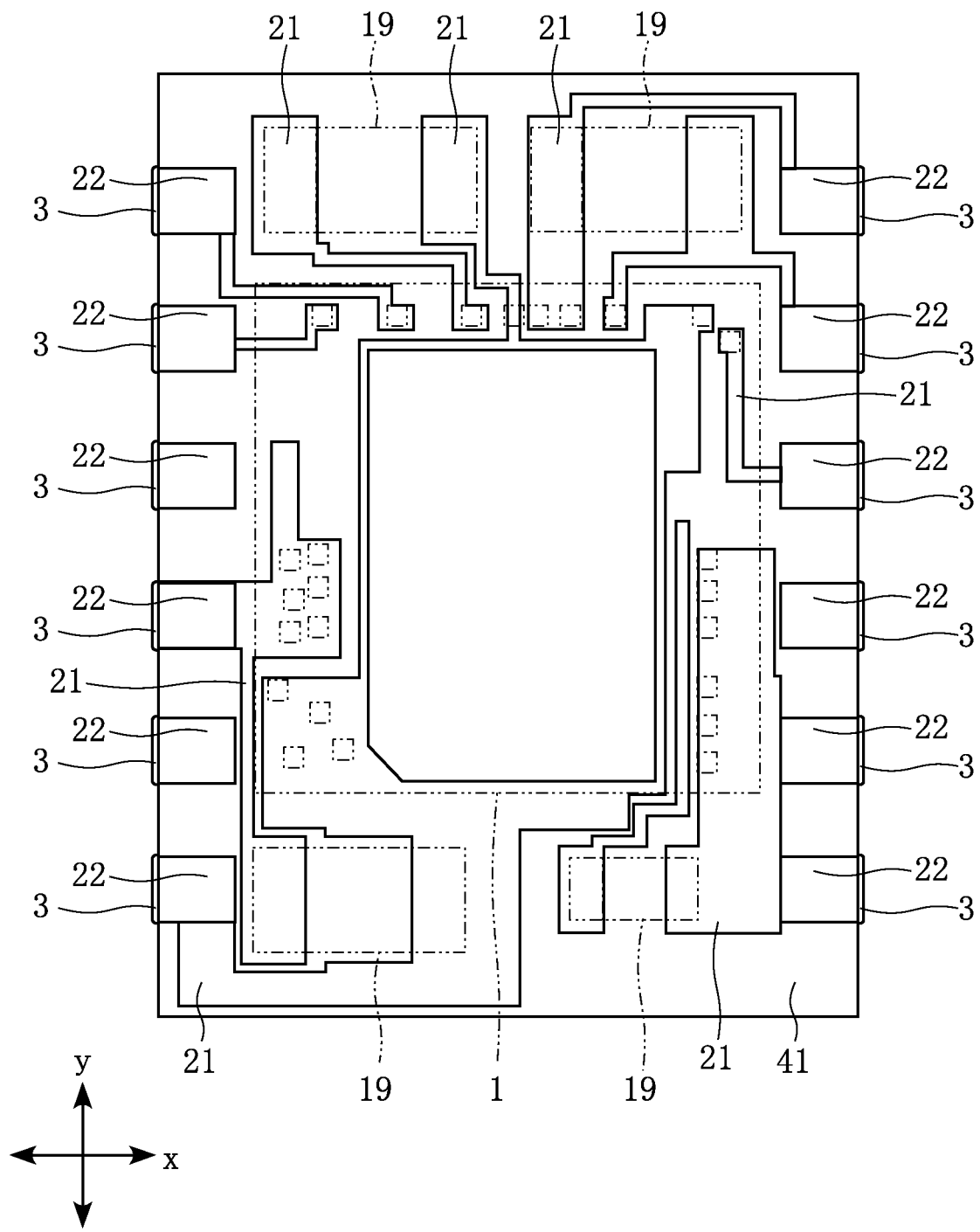
FIG. 46 is a plan view showing a semiconductor device according to a variation.

In the first to sixth embodiments, two external electrodes 3 are exposed from each of the two resin side surfaces 63 facing in the x direction. However, the number of the external electrodes 3 is not limited. Furthermore, the arrangement and shape of the internal electrode 2 are not limited to those described above. For example, the internal electrode 2 may be formed (installed) as shown in FIGS. 44 to 46. FIGS. 44 to 46 are plan views. In FIGS. 44 to 46, the conductive bonding members 5 and the sealing resin 6 are omitted, and the semiconductor element 1 is indicated by an imaginary line (two-dot chain line). Note that in FIGS. 0.45 and 46, regions 19 indicated by imaginary lines (two-dot chain lines) may be provided with elements such as resistors, capacitors, or other semiconductor elements.

Although the first to sixth embodiments have given an example of a SON resin package having terminals on two side surfaces of the semiconductor device (two resin side surfaces 63 facing in the x direction in the above examples), other examples are also possible. For example, it is possible to employ a QFN resin package having terminals on four side surfaces of the semiconductor device.

Figure 47:
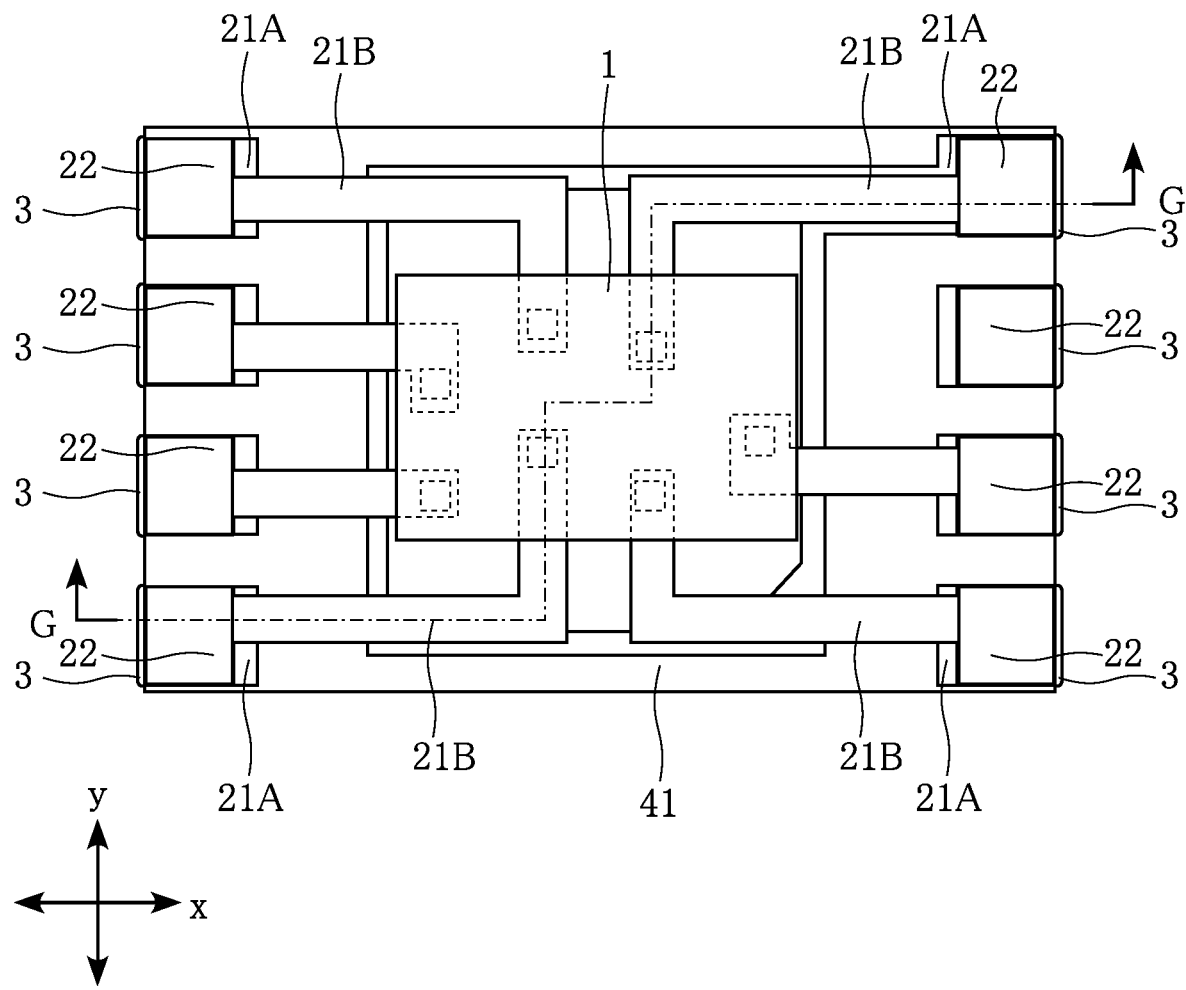
FIG. 47 is a plan view showing a semiconductor device according to a variation.
Figure 48:
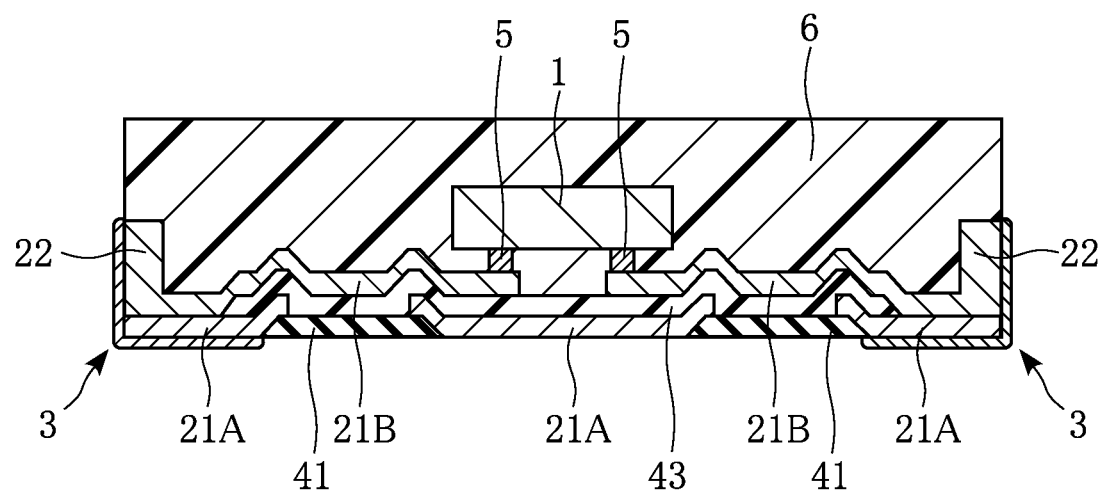
FIG. 48 is a sectional view along line G-G in FIG. 47.

In the first to sixth embodiments, one wiring layer 21 is provided in the z direction. However, a plurality of wiring layers 21 may be provided in the z direction. FIGS. 0.47 and 48 show a semiconductor device having a multi-layer structure with two wiring layers 21 (a first wiring layer 21A and a second wiring layer 21B) in the z direction. FIG. 47 is a plan view showing the semiconductor device. FIG. 47 omits the sealing resin 6. FIG. 48 is a sectional view along line G-G in FIG. 47.

As shown in FIG. 48, the internal electrode 2 includes first wiring layers 21A, second wiring layers 21B, and columnar portions 22. Parts of the first wiring layers 21A and the second wiring layers 21B are in contact with each other, whereas the other parts of these layers 21A and 21B are insulated from each other by an insulating film 43. The insulating film 43 is made of a polyimide resin, for example.

The columnar portions 22 protrude from the second wiring layers 21B in the z direction. In this way, the columnar portions 22 may also be provided for the semiconductor device with a multi-layer structure where the plurality of wiring layers 21 are provided in the z direction.

The semiconductor device according to the present disclosure and the method for manufacturing the semiconductor device are not limited to those described in the above embodiments. Various design changes can be made to the specific structures of the elements of the semiconductor device according to the present disclosure, and to the details of the steps of the method for manufacturing the semiconductor device.

The invention claimed is:

1. A method for manufacturing a semiconductor device, comprising:

preparing a support substrate;

forming an internal electrode including a wiring layer and a columnar portion, the wiring layer having a wiring layer front surface and a wiring layer back surface that face opposite from each other in a thickness direction, the wiring layer back surface facing the support substrate, the columnar portion protruding from the wiring layer front surface;

conductively bonding a semiconductor element to the wiring layer;

forming a sealing resin to cover the semiconductor element and the wiring layer front surface;

removing the support substrate;

forming a first exposed side surface of the columnar portion and a second exposed side surface of the wiring layer, the first exposed side surface and the second exposed side surface each facing in a first direction orthogonal to the thickness direction and being exposed from the sealing resin, the first exposed side surface and the second exposed side surface being flush with each other;

and forming an external electrode to cover the first exposed side surface and the second exposed side surface.

2. The method according to claim 1, wherein the internal electrode is formed by electrolytic plating.

3. The method according to claim 1, wherein the external electrode is formed by electroless plating.

* * * * *